United States Patent [19]

Hoshino et al.

[11] Patent Number: 5,436,117
[45] Date of Patent: Jul. 25, 1995

[54] POSITIVE TYPE SILVER HALIDE COLOR PHOTOGRAPHIC LIGHT-SENSITIVE MATERIAL FOR COLOR PROOFING USE

[75] Inventors: Keiichi Hoshino; Susumu Ohkawauchi; Yasuo Tosaka; Yoshiyuki Nonaka, all of Odawara, Japan

[73] Assignee: Konica Corporation, Japan

[21] Appl. No.: 340,186

[22] Filed: Nov. 14, 1994

Related U.S. Application Data

[62] Division of Ser. No. 119,030, Sep. 9, 1993, abandoned.

[30] Foreign Application Priority Data

Sep. 16, 1992 [JP] Japan .................................. 4-246872

[51] Int. Cl.$^6$ .......................... G03C 1/46; G03C 7/30
[52] U.S. Cl. .................................. 430/358; 430/364; 430/378; 430/522; 430/546; 430/556; 430/557; 430/558; 430/611; 430/614
[58] Field of Search .............. 430/358, 522, 546, 557, 430/558, 611, 364, 378, 556, 614

[56] References Cited

U.S. PATENT DOCUMENTS

| | | | |
|---|---|---|---|
| 4,423,142 | 12/1983 | Janssens | 430/505 |
| 4,816,378 | 3/1989 | Powers et al. | 430/503 |
| 4,994,350 | 2/1991 | Ogawa et al. | 430/358 |
| 5,006,454 | 4/1991 | Sasaki et al. | 430/546 |

FOREIGN PATENT DOCUMENTS

| | | | |
|---|---|---|---|
| 457153 | 11/1991 | European Pat. Off. | G03C 1/83 |
| 459331 | 12/1991 | European Pat. Off. | G03C 7/30 |
| 2172118 | 9/1986 | United Kingdom | G03C 7/00 |

*Primary Examiner*—Janet C. Baxter
*Attorney, Agent, or Firm*—Jordan B. Bierman; Bierman and Muserlian

[57] ABSTRACT

Disclosed is a positive type silver halide color photographic light-sensitive material comprising a support having thereon a mainly yellow image forming layer, a mainly magenta image forming layer and a mainly cyan image forming layer; wherein, when an exposure is conducted with 1/10 to 10 times an exposure amount giving minimum density of +0.2 on a first layer selected from said three layer after developing in the main spectra sensitivity region of the first layer, a second layer selected from said three layers is given lower density with said exposure than a density without said exposure; and after a photographic process comprising a color developing step, the mainly yellow, mainly magenta and mainly cyan image forming layers have the monochromatic yellow, magenta and cyan tones in toe portions thereof each of not less than 1.7. The silver halide color photographic light sensitive material is capable of providing a color proof improved in the approximation degrees of an image quality to a printed matter.

17 Claims, No Drawings

POSITIVE TYPE SILVER HALIDE COLOR PHOTOGRAPHIC LIGHT-SENSITIVE MATERIAL FOR COLOR PROOFING USE

This application is a division of application Ser. No. 08/119,030, filed Sep. 9, 1993, now abandoned.

FIELD OF THE INVENTION

This invention relates to a silver halide color photographic light sensitive material suitable for forming a proof-reading color image (or, a color proof) from a plurality of black-and-white half dot images prepared by a color-separation and a half dot image conversion in a color platemaking.printing process; the invention also relates to a positive type color light sensitive material suitable for preparing a color proof.

BACKGROUND OF THE INVENTION

There have so far been well-known processes for forming a color proof from a plurality of black-and-white half dot images prepared by a color-separation and a half dot image conversion in a color plate-making.printing process, such as an over-lay process in which a color image is formed by making use of a photopolymer or a diazo compound, and a surprint process.

The over-lay process has such an advantage that the operations are very simple and the production cost is inexpensive and, in addition, the process can also be utilized for proofing simply by superposing four color film sheets (in the primary colors of subtractive color mixture and black). However, this process has such a disadvantage that a gloss is produced by superposing the film sheets and, therefore, the resulting texture becomes different from the printed matter it represents.

The surprint process superposes colored images on a support. This type of process includes the well-known processes described in, for example, U.S. Pat. Nos. 3,582,327, 3,607,264 and 3,620,726, in which a colored image is obtained by utilizing the stickiness of photopolymeric materials and carrying out a toner development.

There are also the well-known processes as described in Japanese Patent Examined Publication No. 47-27441/1972 and Japanese Patent Publication Open to Public Inspection (hereinafter abbreviated to JP OPI Publication) No. 56-501217/1981, in which a color proof is prepared in the following manner. An image is formed by transferring it onto a support by making use of a light-sensitive colored sheet, by exposing it to light and then by developing it. After that, another colored sheet is laminated thereon and the same procedures are repeated so as to prepare the color proof.

There is also a well-known process as described in JP OPI Publication No. 59-97140/1084, in which colored images are obtained by making use of a light-sensitive colored sheet, the corresponding color-separation films are each exposed to light and developed, and the resulting colored images are each transferred onto a support so that a color proof can be formed thereon. The toners for forming the above-mentioned images and the colorants for colored sheets have the advantage that the same coloring materials used as printing inks can be employed Therefore, the resulting color proof closely resembles in color tone.

However, these processes have the following disadvantages. In the steps needed to prepare a color proof, images have to be superposed and transferred and it takes a long time to complete the operations and, in addition, the production cost is also expensive.

As for the processes capable of eliminating the above-mentioned disadvantages, there are the processes in which a color proof can be prepared by making use of a silver salt color photographic light sensitive material comprising a white support, such as disclosed in JP OPI Publication Nos. 56-13139/1981, 56-104335/1981, 62-280746/1987, 62-280747/1987, 62-280748/1987, 62-280749/1987, 62-280750/1987 and 62-80849/1987.

In these processes, a proofing image is used in the form of a color image that is formed in the following manner. Plural color-separated black-and-white halftone dot images are prepared by converting a colored original document into plural color-separated halftone dot images. The resulting plural B&W halftone dot images are printed one after another on one sheet of color paper in a contact printing method or the like. The printed images are color developed so that a color image formed of the dyes produced imagewise of the couplers. The resulting color image is to be used as the proofing image.

The above-mentioned technique, however, has the following defects. When a color image is approximated to a printed matter, the density of a black image such as the density of letters is inferior to that of the printed matter and, on the other hand, when the density is enhanced so that black image such as that of letters have the same density as the printed matter, the approximation degrees of the color image of the printed matter are deteriorated, so that neither density is satisfactory.

As for the techniques for improving the above-mentioned defects, there is a well-known technique in which the 4th black printer layer is arranged to have a spectral sensitivity different from those of any other layers, besides the yellow, magenta and cyan color developing layers. Japanese Patent Publication Open to Public Inspection (hereinafter abbreviated to JP OPI Publication) Nos. 2-289846/1990 and 2-183251/1990 each disclosed techniques for improving the above-mentioned problems. When the techniques are used, chromatic image densities may be lowered to some extent by separating each chromatic image density from a black image density, and to make each of the monochromatic hues approximate the same as those of a printed matter. However, the improvements thereof are still not satisfactory. In addition to the above, it was found out therefrom that the gradations of the color images formed from each photographic image also has an influence on the monochromatic tones. Therefore, studies were carried out to further improve the comprehensive color proof qualities such as the gradations, qualities and color hues of halftone dots.

SUMMARY OF THE INVENTION

It is, therefore, an object of the invention to provide a color proof improved in the approximation of image quality to printed matter, when the color proof is prepared by making use of a silver halide color photographic photosensitive material and is based on the information obtained by color separations and halftone dot image conversions.

Another object of the invention is to provide a color proof, wherein the photographic color image hues thereof can approximate those of a printed matter and the resulting black images are excellent.

A further object of the invention is to provide a color proof, wherein the separated color hues can approximate those of printed matter and the resulting black images and halftone dot image qualities are excellent.

DETAILED DESCRIPTION OF THE PREFERRED EMBODIMENT

The above-mentioned objects of the invention can be achieved with a positive type silver halide color photographic photosensitive material which comprises a layer mainly forming a yellow image, another layer mainly forming a magenta image and a further layer mainly forming a cyan image; wherein, when two layers arbitrarily selected from the above-mentioned three layers are named layer 1 and layer 2, and are subjected to exposure in the main spectral sensitivity region of layer 1 and in an exposure quantity within the range of 1/10 to 10 times as the exposure quantity capable of giving a of the minimum density $+0.2$ to the image density of layer 1, the photosensitive material has at least one combination whereby the image density on layer 2 is lower than the density obtained when the exposure is not made, but the development is conducted, in the layers mainly forming yellow, magenta or cyan images, each of the monochromatic gradations in the toe portions (that is the photographic gradation obtained, on a characteristic curve, by connecting a point of a fog density $+0.15$ to another point of $D=0.8$) is not lower than 1.7.

One of the preferable embodiments of the invention is that the above-mentioned silver halide color photographic photosensitive material contains at least one kind of the compounds represented in the aforegiven Formula [1].

The invention will now be detailed more concretely.

In the invention, the term, 'a toe gradation', is herein defined as a photographic gradation obtained, on a characteristic curve, by connecting a point of a fog $+0.15$ to another point of $D=0.80$.

The reason why the term, 'a toe gradation' is particularly defined is as follows. When making a photographic color image density lower, the color hue difference between the photographic image and a printing ink is made smaller particularly when the image density is within a certain range (of about 1.5 to 1.9), the difference therebetween is made larger when the image density becomes higher, and the difference therebetween is made larger by far when the image density becomes lower. Therefore, the image density is set as mentioned above, because the above-mentioned gradations in the low density portions seriously influence the halftone dot quality of a photographic image having continuous gradations so that the color proof quality may be swayed thereby.

In the case of a color developer, the methods for hardening the above-mentioned toe gradation include, for example, a method of increasing a color developing agent, decreasing a preservative such as hydroxylamine or sodium sulfite or substituting it by a weak reducing agent such as xylol or sorbit and increasing a penetrant (such as benzyl alcohol), or another method of increasing the pH, temperature and processing time of a processing agent while adding a fogging development inhibitor and a toe-cutting agent.

In the case of a photosensitive material, it is effective to use, in the photosensitive material, hydroquinone type derivatives each capable of reducing an oxidized developing agent. Among them, the compounds represented by Formula [1] may be given particularly as the compounds capable of effectively hardening the above-mentioned toe gradations without affecting any color hues and others.

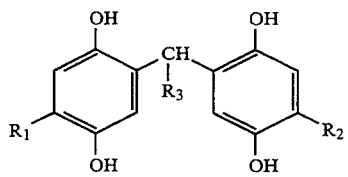

Formula I

In Formula [1], $R_1$ and $R_2$ each represent a hydrogen atom, an alkyl group having not more than 8 carbon atoms (such as those of methyl, ethyl, t-butyl and sec-butyl), an alkoxy group (such as those of methoxy, ethoxy and butoxy), an alkylthio group (such as those of methylthio, butylthio and octylthio) or an alkylamido group (such as those of methane amido, propaneamido and 2-ethylpentanoylamido), and $R_3$ represents a hydrogen atom or an alkyl group having not more than 11 carbon atoms (such as those of methyl, n-propyl, t-butyl and undecyl); provided that the total number of the carbon atoms of $R_1$, $R_2$ and $R_3$ is to be within the range of not less than 8 and not more than 22.

The preferable cases for $R_1$ and $R_2$ include, for example, the case of an alkyl group having not more than 6 carbon atoms. The preferable cases for $R_3$ include, for example, the case of an alkyl group having not more than 7 carbon atoms. The total number of the carbon atoms of $R_1$, $R_2$ and $R_3$ is preferably within the range of not less than 8 and not more than 17.

The typical examples of the compounds represented by Formula [1] will be given below. However, the invention shall not be limited thereto.

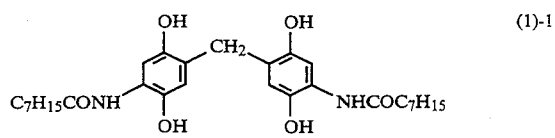
(1)-1

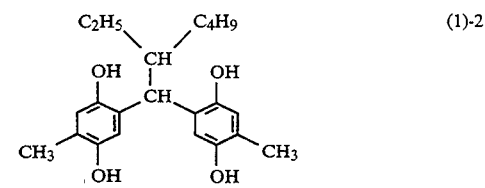
(1)-2

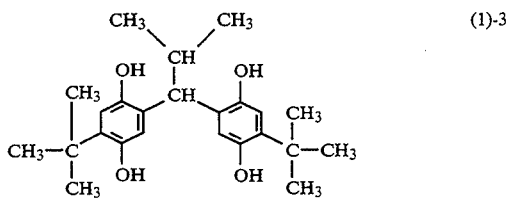
(1)-3

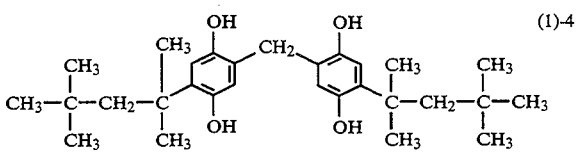
(1)-4

-continued

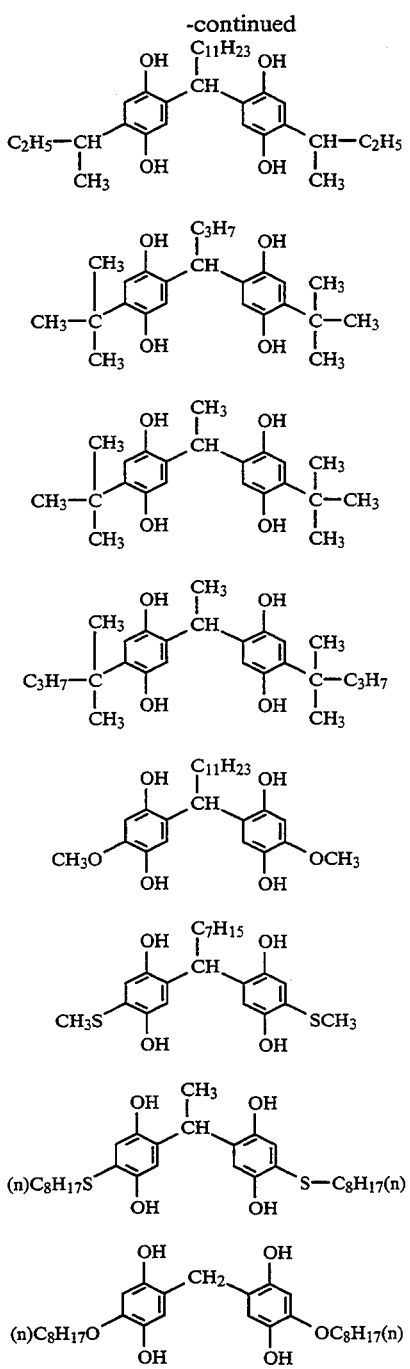

(1)-5
(1)-6
(1)-7
(1)-8
(1)-9
(1)-10
(1)-11
(1)-12

The silver halide emulsions applicable to the invention may also include a silver halide emulsion capable of forming a negative image by making a development with a surface latent image forming type silver halide emulsion capable of forming a latent image on the surface upon making an imagewise exposure to light. It is further preferable to use an emulsion capable of obtaining a direct positive image in the following manner; an internal latent image forming type emulsion not fogged in advance on the grain surfaces thereof is used and, after making an imagewise exposure to light, a fogging treatment (or so-called granulating treatment) is applied and then a surface development is carried out; or, after making an imagewise exposure to light, a surface development is carried out while applying a fogging treatment thereto; so that the direct positive image can be obtained.

The above-mentioned fogging treatment can be performed by an overall non-image exposure, by making use of a foggant use of a high energy developer, by heat treatment, or by like ways. The term, 'an emulsion containing internal latent image forming type silver halide emulsion grains', herein stated means those having photosensitive nuclei mainly inside the silver halide crystal grains thereof and containing silver halide grains capable of forming a latent image inside the grains upon making an exposure to light.

In the field of the above-mentioned internal latent image forming type direct positive techniques, there have been many well-known techniques so far. The well-known techniques thereof include those described in, for example, U.S. Pat. Nos . 2,592,250, 2,466,957, 2,497,875, 2,588,982, 3,761,266, 3,761,276 and 3,796,577; British Patent No. 1,151,363; and so forth.

The mechanism for forming a positive image has not been definitely apparent. However, for example, the following descriptions are found in "Photographic Science and Engineering", Vol 20 p 158 (1976)

Photoelectrons produced in silver halide crystal grains by making an imagewise exposure are captured selectively in the grains, so that an internal latent image can be formed. The resulting internal latent image can work as an effective capture center to the electrons present in a conduction band. Therefore, the electrons injected thereafter in a fogging development process are captured inside the grains exposed to light, so that the latent image can be intensified. In this case, the latent image cannot be developed in any surface development, because the latent image is made present inside the grains. On the other hand, at least one part of the electrons injected is captured on the surfaces of the grains not exposed imagewise to light, so that a latent image can be formed thereon. Therefore, the grains are developed in a surface development.

The internal latent image forming type silver halide grains unfogged in advance, which are applicable to the invention, such grains are formed into an emulsion comprising silver halide grains having most of the photosensitive nuclei inside the grains so that a latent image can mainly be formed inside the silver halide grains. These emulsions contain each any silver halides including, for example, silver bromide, silver chloride, silver chlorobromide, silver chloroiodide, silver iodobromide, silver chloroiodobromide and so forth.

Among the above-mentioned emulsions, a preferable emulsion is as follows. A part of a sample is coated on a transparent support so that the silver coating weight thereof can be within the range of about 1 to 3.5 g/m², and the part of the sample is exposed to light through a light intensity scale for a certain time from about 0.1 seconds to about 1 second. The exposed sample is then developed at 20° C. for 4 minutes with the following surface developer A capable of developing only the images formed on the surfaces of the grains not substantially containing silver halide solvent. In this case, the maximum density of the resulting developed sample is not higher than one fifth of the maximum density obtained when another part of the same emulsion sample is exposed to light in the same manner as above and is then developed at 20° C. for 4 minutes by making use of the following internal developer B capable of developing the image present inside the grains. In a particularly preferable emulsion, the maximum density obtained by making use of surface developer A is not higher than one tenth of the maximum density obtained by making use of internal developer B.

| (Surface developer A) | |
| --- | --- |
| Metol | 2.5 g |
| L-ascorbic acid | 10.0 g |
| Sodium metaborate (tetrahydrate) | 35.0 g |
| Potassium bromide | 1.0 g |
| Add water to make | 1000 cc |
| (Internal developer B) | |
| Metol | 2.0 g |
| Sodium sulfite (anhydrate) | 90.0 g |
| Hydroquinone | 8.0 g |
| Sodium carbonate (monohydrate) | 52.5 g |
| Potassium bromide | 5.0 g |
| Potassium iodide | 0.5 g |
| Add water to make | 1000 cc |

The internal latent image forming type silver halide emulsions preferably applicable to the invention include those prepared in various processes. For example, they include the following emulsions; namely, a conversion type silver halide emulsion such as those described in U.S. Pat. No. 2,592,250; a silver halide emulsion comprising silver halide grains treated in an internal chemical sensitization, such as those described in U.S. Pat. Nos. 3,206,316, 3,317,322 and 3,367,778; an emulsion comprising silver halide grains incorporated polyvalent metal ions thereinto, such as those described in U.S. Pat. Nos. 3,271,157 and 3447,927; a silver halide emulsion chemically sensitized slightly on the surfaces of the silver halide grains containing a doping agent, such as those described in U.S. Pat. No. 3,761,276; a silver halide emulsion comprising the grains having a multilayered structure, such as those described in JP OPI Publication Nos. 50-8524/1975, 50-38525/1975 and 53-2408/1978; and, besides, a silver halide emulsion such as those described in JP OPI Publication Nos. 52-156614/1977 and 55-127549/1980.

The internal latent image forming type silver halide grains preferably applicable to the invention may be comprised of silver halides having any silver halide compositions. Among them, however, the grains containing silver chloride are excellent in developability and suitable for rapid processing treatments.

The silver halide grains applicable to the invention may have any configurations such as a cube, an octahedron, a tetradecahedron comprising the mixtures of (100) faces and (111) faces, a form having (110) faces, a sphere, and a tablature. The grains may preferably be used when they have an average grain size within the range of 0.05 to 3 µm. Concerning the grain size distribution of the grains, they may be either monodisperse type emulsion grains having a uniform crystal habit, or emulsion grains irregular in grain size or in crystal habit. Among these emulsions, the above-mentioned monodisperse type silver halide emulsions uniform in grain size and crystal habit are preferable. In the invention, the term, 'a monodisperse type silver halide emulsion', herein means an emulsion obtained when the contents by weight of the silver halide grains having the grain size within the range of ±20% of the average grain size rm are not less than 60%, preferably 70% and, particularly 80% of the total contents by weight of the silver halide grains. The term, 'an average grain size rm' is herein defined as a grain size ri obtained when maximizing the product, $ni \times ri^3$, of a frequency ni of the grains having a grain size ri and $ri^3$, (provided therein that the significant figures are three columns and the lowest column is rounded) The term, 'a grain size' herein means a grain diameter in the case of spherical silver halide grains, and a diameter obtained when the projective image of a grain is converted into a circular image having the same area as that of the projective image in the case of any grains than the spherical grains. The grain sizes can be obtained in the following manner, for example. A grain is magnified 10,000 to 50,000 times larger through an electron microscope and is then photographed, and the diameter or projected area of the grain is practically measured on the resulting photoprint, (provided therein that the numbers of the grains subject to the measurement are not less than 1,000 at random).

In the particularly preferable highly monodisperse type emulsions, the grain size distributions thereof defined by the following formula are not higher than 20%.

*(Standard grain size deviation/Average grain size)* × 100
= *Grain size distribution (%)* wherein the average grain sizes and the standard grain size deviations are to be obtained from the aforementioned definition of ri.

The above-mentioned monodisperse type emulsions can be prepared by adding a water-soluble silver salt solution and a water-soluble halide solution into a gelatin containing seed grains, under the controls of pAg and pH, in a double-jet precipitation method. For determining the adding rate, the techniques described in JP OPI Publication Nos. 54-48521/1979 and 58-49938/1983 may be referred. As for the processes for preparing a further highly monodisperse type emulsion, it is allowed to apply the process for growing an emulsion in the presence of a tetrazaindene compound, which is disclosed in JP OPI Publication No. 60-122935/1985.

In the silver halide color photographic photosensitive materials of the invention, a mainly yellow image forming silver halide emulsion layer, a mainly magenta image forming silver halide emulsion layer and a mainly cyan image forming silver halide emulsion layer contain the silver halide emulsions each having the different spectrally sensitive wavelength regions, and at least one of the above-mentioned yellow, magenta and cyan image forming silver halide emulsion layers contains a silver halide emulsion having the spectral sensitivity having a portion common to each of the spectral sensitivities of the emulsions having the different spectrally sensitive wavelength regions, which are contained respectively in the above-mentioned yellow, magenta and cyan image forming silver halide emulsion layers.

In the invention, the yellow, magenta and cyan image forming layers each have a different spectral sensitivities. In the main spectrally sensitive wavelength regions of each layer, it is preferable that the wavelengths therein can show a sensitivity preferably at least 4 times and particularly at least 8 times as much as the spectral sensitivities of the other layers.

The descriptions will now be made about the silver halide emulsions each having the spectral sensitivities having the portions common to the spectral sensitivities of the emulsions having the different spectrally sensitive wavelength regions, which are to be contained in the above-mentioned yellow, magenta and cyan image forming silver halide emulsion layers of the invention. In this specifications and for simplifying the descriptions, among the above-mentioned silver halide emulsions each having the different spectral sensitivities, the silver halide emulsions to be contained in the yellow, magenta and cyan image forming layers are abbreviated to emulsions Y, M and C, respectively. Further, when a silver halide emulsion having the spectral sensitivity has a portion common to the spectral sensitivities of every emulsion having the different spectrally sensitive wavelength regions, which are to be contained in the yellow, magenta and cyan image forming silver halide emulsion layers, the silver halide emulsion is abbreviated to an emulsion P. In the invention, emulsion P has the spectral sensitivity having a portion common to the spectrally sensitive regions each of emulsions Y, M and C, respectively.

When making an exposure with any one of the wavelengths in the spectrally sensitive region of emulsion Y, the sensitivity ratio of emulsion Y to emulsion P is preferably within the range of 1/10 to 10. Similarly, when making an exposure with any one of the wavelengths in the spectrally sensitive region of emulsion M, the sensitivity ratio of emulsion M to emulsion P is preferably within the range of 1/10 to 10; and when making an exposure with any one of the wavelengths in the spectrally sensitive region of emulsion C, the sensitivity ratio of emulsion C to emulsion P is preferably within the range of 1/10 to 10.

In one of the preferable embodiments of the invention, the yellow image forming layer contains a blue-sensitive silver halide emulsion, the magenta image forming layer contains a green-sensitive silver halide emulsion and the cyan image forming layer contains a red-sensitive silver halide emulsion. The above-mentioned yellow image forming layer is further mixed with a silver halide emulsion photosensitive to blue, green and red light.

Similar to the above, the above-mentioned magenta and cyan image forming layers are mixed with a silver halide emulsion photosensitive to blue, green and red light.

In another preferable embodiment, the yellow image forming layer contains a green-sensitive silver halide emulsion, the magenta image forming layer contains a red-sensitive silver halide emulsion and the cyan image forming layer contains an infrared-sensitive silver halide emulsion. The above-mentioned yellow image forming layer is mixed with a silver halide emulsion photosensitive to green, red and infrared light. Similarly, the above-mentioned magenta and cyan image forming layers are each also mixed with a silver halide emulsion photosensitive to green, red and infrared light.

In a further preferable embodiment, the yellow image forming layer contains a blue-sensitive silver halide emulsion, the magenta image forming layer contains a green-sensitive silver halide emulsion and the cyan image forming layer contains a red-sensitive silver halide emulsion. The above-mentioned yellow and cyan image forming layers are each mixed with a silver halide emulsion photosensitive to blue, green and red light.

Besides the above-mentioned combinations, the color sensitivities of emulsions Y, M and C may freely be selected and any combinations can be used, provided that the color sensitivities thereof are different from each other. Emulsion P may be contained in at least one of the yellow, magenta and cyan layers.

Silver halide emulsion (that is Emulsion P), which has a spectral sensitivity having a portion common to the spectral sensitivities of the yellow, magenta and cyan image forming silver halide emulsions of the invention, may be realized by selecting spectrally sensitizing dyes. For example, the emulsions photosensitive to blue, green and red light can be prepared by making combination use of a blue-sensitive sensitizing dye, a green-sensitive sensitizing dye and a red-sensitive sensitizing dye.

In the silver halide photographic photosensitive materials relating to the invention, the grain sizes each of the emulsion layers thereof can be determined from the wide ranges thereof, by taking variously required characteristics into consideration, including particularly sensitivities, sensitivity balance, color-separability, image sharpness, graininess and so forth.

In one of the preferable embodiments of the invention, the silver halide grain sizes preferably applicable thereto are within the range of 0.1 $\mu$m to 0.6 $\mu$m for the red-sensitive emulsions, 0.15 $\mu$m to 0.8 $\mu$m for the green-sensitive emulsions and 0.3 $\mu$m to 1.2 $\mu$m for the blue-sensitive emulsions.

There is no special limitation to the grain sizes of the aforementioned Emulsion P relating to the invention. However, the average grain sizes thereof have each a ratio within the range of 0.4 to 3.0 and, preferably, 0.7 to 2.0 to the largest average grain size among those of Emulsions Y, M and C.

In the silver halide photographic photosensitive materials relating to the invention, gelatin is preferably used as the binders thereof. Particularly for removing the colored components of the gelatin, it is preferable to use the gelatin improved in the transmittance ratio by treating a gelatin extracted solution with hydrogen peroxide, by extracting the colored components from the raw material that is a hydrogen peroxide treated ossein, or by making use of an ossein prepared of a colorless raw bone.

The gelatin of the invention may be any one of alkali-treated ossein gelatin, acid-treated gelatin, a gelatin derivative and denatured gelatin. Among them, alkali-treated ossein gelatin is particularly preferable to be used.

As for the gelatin applicable to the silver halide photographic photosensitive materials relating to the invention, they are preferable to have a transmittance of not less than 70% when a 10% gelatin solution is prepared and is then the transmittance thereof is measured at 420nm through a spectrophotometer. The transmittance can be increased in the above-mentioned method. However, it is also preferable to increase the transmittance in a method for applying a hydrogen peroxide treatment in an ossein preparation stage, another method for adding hydrogen peroxide into an ossein liming tank so that the hydrogen peroxide may be reacted with the ossein in the liming process, or a further method for making use of hydrogen peroxide in a gelatin extracted solution. The hydrogen peroxide solution available on the market can be used therein. The condensation of the hydrogen peroxide, the time for adding and reacting it, and the methods for washing it are each suitably determined by optimizing these factors.

In the gelatin of the invention, the jelly hardness thereof (obtained in a Puggy method) is preferably not less than 250 g and particularly not less than 270 g.

There is no special limitation to the ratios of an amount of gelatin of the invention to the total amount of the coated gelatin. However, it is preferable to apply the ratios as high as possible. Concretely, a preferable effect can be obtained when applying a ratio within the range of at least not less than 20% and up to 100%.

In the photosensitive materials relating to the invention, the total amount of gelatin contained into the image forming side thereof is to be preferably less than 11g/m². There is no special limitation to the lower limit of the total amount thereof. However, it is preferable to be in an amount of not less than 3.0 g/m², generally from the viewpoint of the physical properties or photographic characteristics. Such a gelatin amount as mentioned above can be obtained by converting it into the weight of gelatin having a 11.0% moisture content, in a moisture measuring method described in the above-mentioned Puggy method.

The yellow, magenta and cyan image forming layers of the invention are multicoated over a support. They may be arranged in any order from the support side. For example, one of the preferable embodiments is that a cyan image forming layer, a magenta image forming layer and a yellow image forming layer are arranged in this order from the support side. Besides the above, it is allowed to arrange an intermediate layer, a filter layer and a protective layer, if required.

In the cyan image forming silver halide emulsion layers of the silver halide photographic photosensitive materials relating to the invention, the reflection densities of the fresh samples thereof are preferably not lower than 0.7 in the maximum wavelength of the spectral sensitivities. Such a silver halide photographic photosensitive material as mentioned above can be prepared by containing a colorant such as a dye having an absorptivity to the above-mentioned wavelength, or black colloidal silver, in either one of the photographic component layers of the invention. In the color photographic photosensitive materials of the invention, a water-soluble dye can be contained in any one of the silver halide emulsion layers and/or any other hydrophilic colloidal photographic component layers than the silver halide emulsion layers. Further in the color photographic photosensitive materials of the invention, the dyes each having at least one of carboxyl, sulfonamido or sulfamoyl groups may be contained, in the solid and dispersed form, in any one of the silver halide emulsion layers and/or any other hydrophilic colloidal photographic component layers than the silver halide emulsion layers.

The above-mentioned dyes having at least one of carboxyl, sulfonamido or sulfamoyl groups include, typically, the dyes represented by the following Formulas [2] through [10]

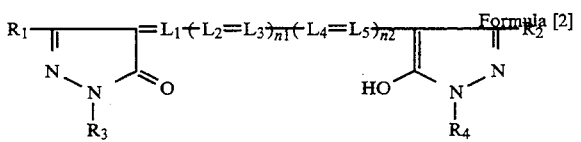

Formula [2]

wherein, $R_1$ and $R_2$ represent each a hydrogen atom or a group of alkyl, alkenyl, aryl, heterocyclic, —$COOR_5$, —$COR_5$, —$SO_2R_5$, $SOR_5$, —$SO_2NR_5R_6$, —$CONR_5R_6$, —$NR_5R_6$, —$NR_5SO_2R_6$, —$NR_5COR_6$, —$NR_5CONR_6R_7$, —$NR_5CSNR_6R_7$, —$OR_5$, —$SR_5$, or cyano; $R_3$ and $R_4$ represent each a hydrogen atom or a group of alkyl, alkenyl, cycloalkyl, aryl or heterocyclic; $R_5$, $R_6$ and $R_7$ represent each a hydrogen atom or a group of alkyl, alkenyl, aryl or heterocyclic; $L_1$ through $L_5$ represent each a methine chain; $n_1$ is an integer of 0 or 1; and $n_2$ is an integer of 0 to 2.

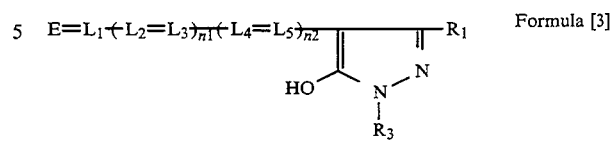

Formula [3]

wherein, $R_1$, $R_3$, $L_1$~$L_5$, $n_1$ and $n_2$ are each synonymous with those denoted in Formula [2].

wherein, E represents an acidic nucleus necessary for producing an oxonol dye.

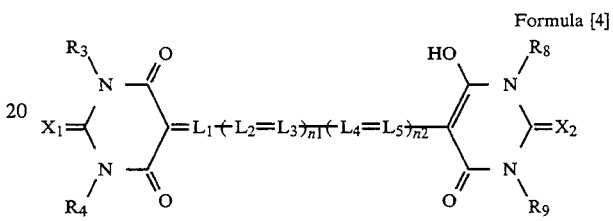

Formula [4]

wherein, $R_3$, $R_4$, $L_1$~$L_5$, $n_1$ and $n_2$ are each synonymous with those denoted in Formula [2]; and $R_8$ and $R_9$ are each synonymous with $R_3$ and $R_4$, respectively.

wherein, $X_1$ and $X_2$ represent each an oxygen atom or a sulfur atom.

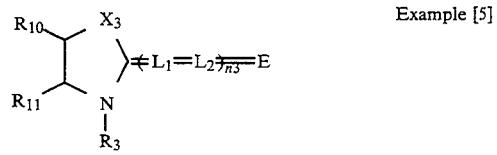

Example [5]

wherein, $R_3$, $L_1$ and $L_2$ are each synonymous with those denoted in Formula [2], respectively; E is synonymous with E denoted in Formula [3]; $R_{10}$ and $R_{11}$ represent each a hydrogen atom, a group of alkyl, alkenyl, aryl, heterocyclic, nitro or cyano, a halogen atom, or a group of —$OR_5$, —$SR_5$, —$NR_5R_6$, —$NR_5SO_2R_6$, —$NR_5COR_6$, —$COR_5$ or —$COOR_5$, provided, $R_{10}$ and $R_{11}$ mat form an endocyclic double bond; $X_3$ represents an oxygen, sulfur or selenium atom, or a group of —$C(R_{12})(R_{13})$— or —$N(R_3)$—; and $R_3$, $R_5$ and $R_6$ are each synonymous with those denoted in Formula [2], respectively.

also wherein $R_{12}$ and $R_{13}$ represent each a hydrogen atom or an alkyl group; and $n_3$ is an integer of 1 to 3.

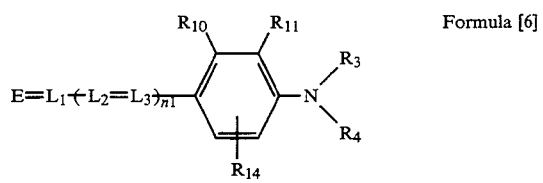

Formula [6]

wherein, $R_3$, $R_4$, $L_1$, $L_2$, $L_3$ and $n_1$ are each synonymous with those denoted in Formula [2], respectively; E is synonymous with E denoted in Formula [3]; $R_{10}$ and $R_{11}$ are synonymous with those denoted in Formula [5]; and $R_{14}$ is synonymous with $R_{10}$.

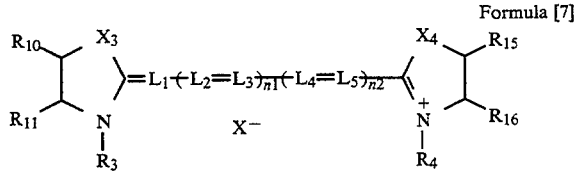

Formula [7]

wherein, $R_3$, $R_4$, $R_{10}$, $R_{11}$, $L_1$ through $L_5$, $X_3$, $n_1$ and $n_2$ are each synonymous with those denoted in Formula [2], respectively; $X_4$ is synonymous with $X_3$; and $R_{15}$ and $R_{16}$ are each synonymous with $R_{10}$.

also wherein $X^-$ represents a group having anion; and, the combination of $R_{10}$ and $R_{11}$, and the combination of $R_{15}$ and $R_{16}$, each may form a endocyclic double bond.

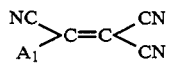

Formula [8]

wherein, $A_1$ represents a nucleus of pyrrole, imidazole, pyrazole, phenol or naphthol, or a condensed heterocyclic ring.

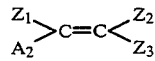

Formula [9]

wherein, $Z_1$, $Z_2$ and $Z_3$ represent each an electron withdrawing group; and $A_2$ represents an aryl or heterocyclic group.

Formula [10]

wherein, $R_{21}$, $R_{22}$, $R_{23}$ and $R_{24}$ represent each a hydrogen atom or a group of hydroxy, $-OR_{29}$ or $-N(R')R''$; in which $R_{29}$ represents an alkyl or aryl group; $R'$ and $R''$ represent each a hydrogen atom or an alkyl or allyl group having at least one kind of sulfonic acid groups or carboxylic acid groups; and $R_{25}$, $R_{26}$, $R_{27}$ and $R_{28}$ represent each a hydrogen atom, a carboxylic acid or sulfonic acid group, or an alkyl or allyl group having at least one kind of carboxylic acid groups or sulfonic acid groups.

The typical examples of the dyes represented by Formulas [2] through [10] include those denoted by No. 1 through No. 85 given in JP OPI Publication No. 64-26850/1989, pp. 7~11; those denoted by No. 1 through No. 103 given in JP OPI Publication No. 2-97940/1990, pp. 5~9; those denoted by No. I-1 through No. VIII-7 given in JP OPI Publication No. 4-18545/1992, pp. 13~35; or those denoted by No. [II-1] through No. [II-19] given in JP OPI Publication No. 62-253146/1987, pp. 12~13. However, the invention shall not be limited thereto.

| Example No. | R₁ | R₂ | R₃ | R₄ |
|---|---|---|---|---|
| 1 | —CN | —CN | 4-($SO_3K$)-phenyl | 4-($SO_3K$)-phenyl |
| 2 | —CN | —CN | 2,5-bis($SO_3K$)-phenyl | 2,5-bis($SO_3K$)-phenyl |
| 3 | —CN | —CN | 2-Cl-5-($SO_3Na$)-phenyl | 2-Cl-5-($SO_3Na$)-phenyl |
| 4 | —$CF_3$ | —$CF_3$ | 4-($SO_3K$)-phenyl | 4-($SO_3K$)-phenyl |
| 5 | —$COOC_4H_9$ | —$COOC_4H_9$ | 4-($SO_3H$)-phenyl | 4-($SO_3H$)-phenyl |

-continued

| Example No. | R₁ | R₂ | Ar₁ | Ar₂ |
|---|---|---|---|---|
| 6 | —COCH₃ | —COCH₃ | 4-SO₃K-phenyl | 4-SO₃K-phenyl |
| 7 | —COCH₃ | —COCH₃ | 2-SO₃K,4-KO₃S-phenyl | 2-SO₃K,4-KO₃S-phenyl |
| 8 | —CONHCF₃ | —CONHCF₃ | 4-SO₃K-phenyl | 4-SO₃K-phenyl |

$$R_1-C=N-N(R_3)-C(=O)-CH=L_2-CH=C(OH)-C(=N-N(R_4))-R_2$$

| Example No. | R₁ | R₂ | L₂ | R₃ | R₄ |
|---|---|---|---|---|---|
| 9 | —CN | —CN | —CH= | 4-SO₃K-phenyl | 4-SO₃K-phenyl |
| 10 | —CN | —CN | —CH= | 2-SO₃K,4-KO₃S-phenyl | 2-SO₃K,4-KO₃S-phenyl |

| | | | | |
|---|---|---|---|---|
| 11 | —CN | —CN | —CH= | 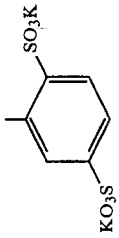 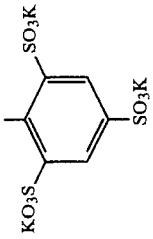 |
| 12 | —CN | —CN | —CH= | 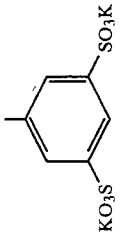 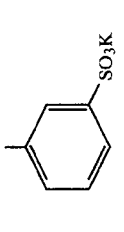 |
| 13 | —CN | —CN | —CH= | 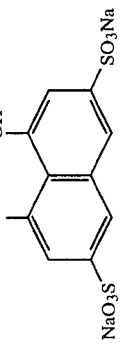 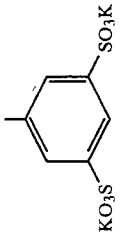 |
| 14 | —CN | —CN | —CH= | 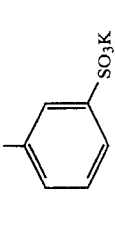 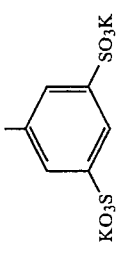 |
| 15 | —CN | —CN | —CH= | 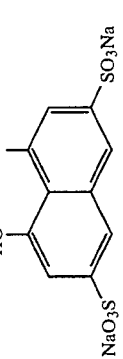 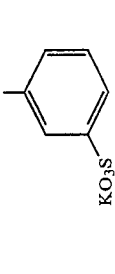 |
| 16 | —CN | —CN | $\underset{\|}{\overset{C_2H_5}{C}}$= | 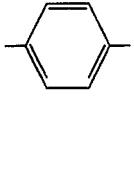 |

-continued
| | | | |
|---|---|---|---|
| 17 | —CN | —CN | —CH= | 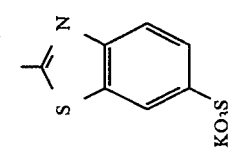 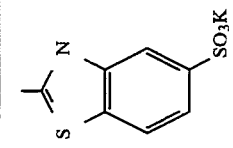 |
| 18 | —CF$_3$ | —CF$_3$ | —CH= | 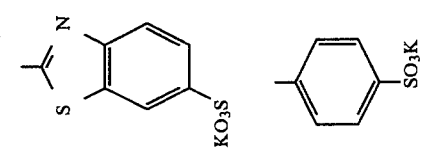 |
| 19 | —CF$_3$ | —CF$_3$ | —CH= | 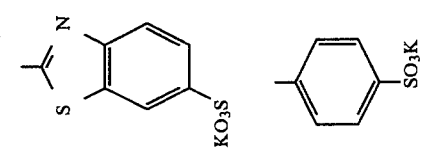 |
| 20 | —CONH$_2$ | —CONH$_2$ | —CH= | 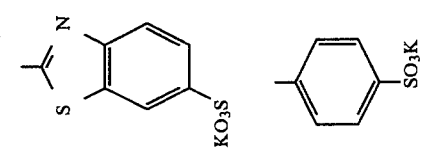 |
| 21 | —CONH$_2$ | —CONH$_2$ | —CH= | 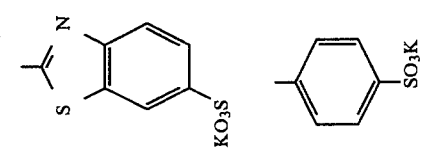 |
| 22 | —CONH$_2$ | —CONH$_2$ | —CH= | 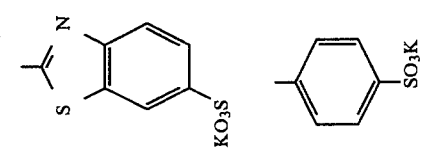 |

-continued

| | | | | |
|---|---|---|---|---|
| 23 | —CONH$_2$ | —CONH$_2$ | —C(CH$_3$)= | ![benzene-3,5-di-SO$_3$K] | ![benzene-3,5-di-SO$_3$K] |
| 24 | —CONH$_2$ | —CONH$_2$ | —CH= | ![benzene-2-SO$_3$K] | ![benzene-2-SO$_3$K] |
| 25 | —CONH$_2$ | —CONH$_2$ | —CH= | ![benzene-2,4-di-SO$_3$K] | ![benzene-2,4-di-SO$_3$K] |
| 26 | —CF$_3$ | —CF$_3$ | —CH= | ![benzene-3,5-di-COOK] | ![benzene-3,5-di-COOK] |
| 27 | —CF$_3$ | —CF$_3$ | —CH= | ![4-OH-3-COOH-5-SO$_3$K benzene] | ![4-OH-3-COOH-5-SO$_3$Na benzene] |
| 28 | —CF$_3$ | —CF$_3$ | —CH= | ![benzene-2,4-di-SO$_3$Na] | ![benzene-2,4-di-SO$_3$Na] |
| 29 | —(CF$_2$)$_3$H | —(CF$_2$)$_3$H | —CH= | ![benzene-4-SO$_3$K] | ![benzene-4-SO$_3$K] |

-continued

| | | | | |
|---|---|---|---|---|
| 30 | —(CF$_2$)$_4$H | —(CF$_2$)$_4$H | —CH= | (4-SO$_3$Na-phenyl) | (4-SO$_3$Na-phenyl) |
| 31 | —CF$_3$H | —CF$_3$H | —CH= | (4-SO$_3$K-phenyl) | (4-SO$_3$K-phenyl) |
| 32 | —COOC$_2$H$_5$ | —COOC$_2$H$_5$ | —CH= | (2-CH$_3$, 4-SO$_3$K-phenyl) | (2-CH$_3$, 4-SO$_3$K-phenyl) |
| 33 | —COOC$_2$H$_5$ | —COOC$_2$H$_5$ | —CH= | (4-SO$_3$K-phenyl) | (4-SO$_3$K-phenyl) |
| 34 | —COCH$_3$ | —COCH$_3$ | —CH= | (4-SO$_3$K-phenyl) | (4-SO$_3$K-phenyl) |
| 35 | —COCH$_3$ | —COCH$_3$ | —CH= | (2,5-bis-SO$_3$K-phenyl) | (2,5-bis-SO$_3$K-phenyl) |

-continued
| | | | | |
|---|---|---|---|---|
| 36 | —COCH₃ —COCH₃ | C₂H₅<br>—C= | 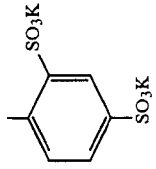 | 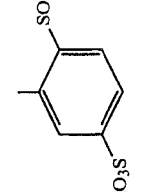 |
| 37 | —COCH₃ —COCH₃ | —CH= | 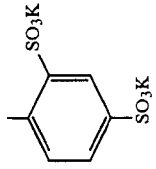 | 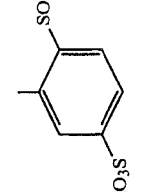 |
| 38 | —COC₂H₃₅ —COC₂H₅ | —CH= | 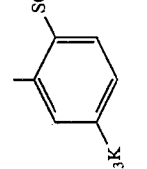 | |
| 39 | 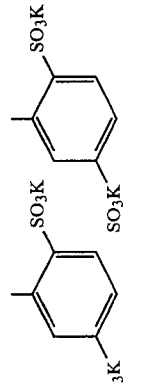 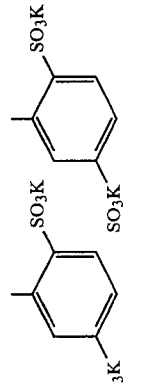 | —CH= | 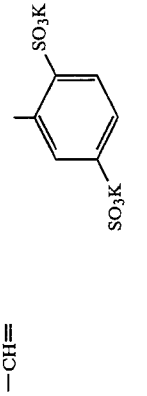 | 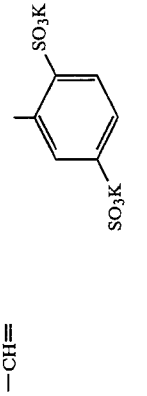 |
| 40 | —(CF₂)₅H —(CF₂)₅H | —CH= | 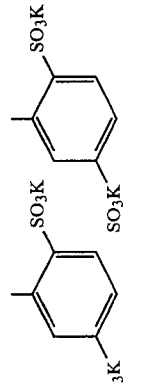 | 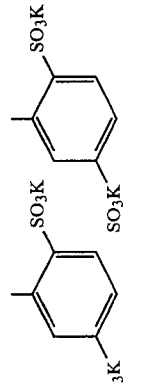 |
| 41 | 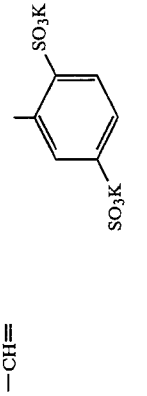 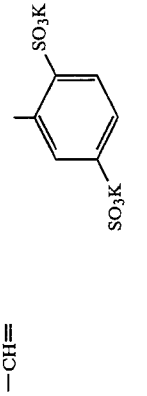 | —CH= | 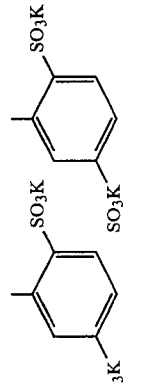 | 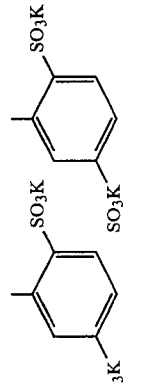 |

-continued

| Example No. | R₁ | R₂ | | | |
|---|---|---|---|---|---|
| 42 | —CONH(CF₂)₄H | —CONH(CF₂)₄H | —CH= | ![4-SO₃K, 2-CH₃ phenyl with SO₃K] | ![4-SO₃K, 2-CH₃ phenyl with SO₃K] |
| 43 | —CONH₃ | —CONH₃ | —CH= | 3-SO₃K phenyl | 3-SO₃K phenyl |
| 44 | —COCH₃ | —COCH₃ | —C(C₂H₅)= | 2,6-(SO₃K)₂ phenyl | 2,6-(SO₃K)₂ phenyl |
| 45 | —COCH₃ | —COCH₃ | —CH= | 3,5-(SO₃K)₂ phenyl | 3,5-(SO₃K)₂ phenyl |
| 46 | —CO-C₆H₅ | —CO-C₆H₅ | —CH= | 2-CH₃-4-SO₃K phenyl | 2-CH₃-4-SO₃K phenyl |

$$R_1-C=C-CH-CH=L_3-CH=CH-C-C-R_2$$
$$\phantom{R_1-C}\|\phantom{C-CH-CH=L_3-CH=CH-C}\|$$
$$\phantom{R_1-}N\phantom{-C-CH-CH=L_3-CH=CH-C-C-}N$$
$$\phantom{R_1-}|\phantom{xxxxxxxxxxxxxxxxxxxxxx}|$$
$$\phantom{R_1-}R_3\phantom{xxxxxxxxxxxxxxxxxxxx}R_4$$
$$\phantom{R_1-C=}C=O\phantom{xxxxxxxxxx}HO-C$$

| Example No. | R₁ | R₂ | R₃ | R₄ |
|---|---|---|---|---|
| 47 | —CN | —CN | 4-SO₃K phenyl | 4-SO₃K phenyl |

-continued

| | | | |
|---|---|---|---|
| 48 | —CN | —CN | (2,5-disulfonate-4-methylphenyl, K salts) / (2,4-disulfonate-5-methylphenyl, K salts) |
| 49 | —CN | —CN | (3,5-disulfonate-methylphenyl, K salts) / (3,5-disulfonate-methylphenyl, K salts) |
| 50 | —CN | —CN | (2,3-disulfonate-methylphenyl, K salts) / (2,3-disulfonate-methylphenyl, K salts) |
| 51 | —CN | =C(C₂H₅)— | (4-sulfonate-methylphenyl, K salt) / (4-sulfonate-methylphenyl, K salt) |
| 52 | —CN | —CN | (2,3,5-trisulfonate-methylphenyl, K salts) / (2,3,5-trisulfonate-methylphenyl, K salts) |
| 53 | —CN | —CN | (methylnaphthalene-disulfonate, Na salts) / (methylnaphthalene-disulfonate, Na salts) |

-continued

| # | | | | | |
|---|---|---|---|---|---|
| 54 | —CN | —CN | ![COOH-phenyl]—C= | ![phenyl-SO3K,SO3K] | ![phenyl-SO3K,SO3K] |
| 55 | —CN | —CN | —CN— | ![phenyl-COOK] | ![phenyl-COOK] |
| 56 | —CN | —CN | —CN— | ![phenyl-COOH,SO3K] | ![phenyl-OH,COOH,SO3K] |
| 57 | CF₃ | CF₃ | =CN— | ![phenyl-COOK] | ![phenyl-COOK] |
| 58 | ![phenyl-SO3K,-COO-] | ![phenyl-SO3K,-COO-] | =CH— | H | H |
| 59 | ![phenyl-COOK,-COO-] | ![phenyl-COOK,-COO-] | =CH—C₃H₇ | C₃H₇ | |
| 60 | —CF₃ | —CF₃ | =CH— | ![phenyl-SO3K] | ![phenyl-SO3K] |

-continued
| | | | |
|---|---|---|---|
| 61 | —CF₃ | CF₃ | =CH— |
| 62 | —CF₃ | —CF₃ | =CH— |
| 63 | —(CF₂)₃F | —(CF₂)₃F | =CH— |
| 64 | —COOC₂H₅ | —COOC₂H₅ | =CH— |
| 65 | —COOC₂H₅ | —COOC₂H₅ | =CH— |
| 66 | —COOC₂H₅ | —COOC₂H₅ | $-\overset{CH_3}{\underset{\phantom{x}}{C}}=$ |
| 67 | —COOCH₃ | —COOCH₃ | =CH— |

-continued
| | | | | |
|---|---|---|---|---|
| 68 | —COO— | —COO— | =CH— | —CH=CH—CH₃ | —CH=CH—CH₃ |
| 69 | —CONH₃ | —CONH₃ | =CH— |  |  |
| 70 | —CONH₃ | —CONH₃ | =CH— |  |  |
| 71 | —CONH₃ | —CONH₃ | =CH— |  |  |
| 72 | —CONHCF₃ | —CONHCF₃ | =CH— |  |  |
| 73 | —COCH₃ | —COCH₃ | =CH— |  |  |
| 74 | —COCH₃ | —COCH₃ | =CH— |  |  |

| | | | |
|---|---|---|---|
| 75 | —COCH$_3$ | —COCH$_3$ | =CH— |
| 76 | —COCH$_3$ | —COCH$_3$ | =CH— |
| 77 | —COCH$_3$ | —COCH$_3$ | =CH— |
| 78 | —COCH$_3$ | —COCH$_3$ | =CH— |
| 79 | —COCH$_3$ | —COCH$_3$ | =CH— |
| 80 | —COC$_2$H$_5$ | —COC$_2$H$_5$ | =CH— |
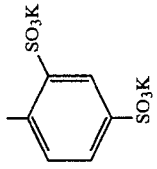

-continued

| | | | | |
|---|---|---|---|---|
| 81 | —COCH₃ | —COCH₃ | =CH— | (2,3-di-SO₃K-methylphenyl) (2,3-di-SO₃K-methylphenyl) |
| 82 | —COCH₃ | —COCH₃ | =CH— | (3,5-di-SO₃K-methylphenyl) (3,5-di-SO₃K-methylphenyl) |
| 83 | —CO-Ph | —CO-Ph | =CH— | (4-SO₃K-phenyl) (4-SO₃K-phenyl) |
| 84 | —CO-Ph | —CO-Ph | =CH— | (2,4-di-SO₃K-methylphenyl) (2,4-di-SO₃K-methylphenyl) |
| 85 | —COCH₃ | —COCH₃ | =C(C₃H₇(i))— | (3-SO₃K-methylphenyl) (3-SO₃K-methylphenyl) |

The typical examples of the dyes represented by Formulas [2] through [10] include those denoted by No. I-1 through No. IX-7 given in JP OPI Publication No. 4-18545/1992, pp. 13~35. However, the invention shall not be limited thereto.

The above-mentioned dye compounds are those having a hydrophilic group that is substantially water-insoluble (to water having a pH of not higher tan 7), but is dissociated when the pH thereof is not lower than 9. These compounds can be contained in any photosensitive emulsion layers and nonphotosensitive hydrophilic colloidal layers each serving as a photographic component layer, in the following manner. The above-mentioned compounds are each formed into a solid and finely granulated dispersoid (that is a microscopically sized collective grain having an average particle size of, preferably, not larger than 10 $\mu$m and, particularly, not larger than 1 $\mu$m) in a method of finely granulating them by a ballmill or a sand-mill, or in another method of dissolving them in an organic solvent and then by dispersing them in a gelatin solution. Keeping them in the above-mentioned state, they may be contained in the above-mentioned layers by making them present in gelatin or a macromolecular binder.

The above-mentioned finely granulated dye dispersoid is water-insoluble and made present stably in a color photographic photosensitive material. When the photosensitive material is exposed to light and then processed with a color developer (having preferably a pH of not lower than 9), the hydrophilic group contained in the dye compound is dissociated to be water-soluble or is discolored, so that most of the dispersoid disappear from the color photographic photosensitive material.

There is no special limitation to the layers in which the above-mentioned dyes and colloidal silver are to be contained. It is, however, preferable to contain them in a nonphotosensitive hydrophilic colloidal layers arranged between a support and the emulsion layer closest to the support.

Out of the photographic component layers of the color photosensitive materials of the invention, the photosensitive emulsion layers and non-photosensitive hydrophilic colloidal layers, which are each arranged on the silver halide emulsion coated side of the support, contain gelatin in a total amount of not more than 13 g and, preferably within the range of not less than 5 g and less than 12 g per sq. meter of the photosensitive material.

In the invention, silver halide may be optically sensitized by any common sensitizing dyes. It is also useful for the silver halide emulsions of the invention to make combination use of various sensitizing dyes applicable to supersensitize any silver halide emulsions of the internal latent image forming type, negative type or the like. Such sensitizing dyes as mentioned above may be referred to Research Disclosure (hereinafter abbreviated to RD), Nos. 15162 and 17643.

In the invention, any conventionally known processes may be applied to black image forming layers, provided that a black image can be formed thereon after completing a development. For example, it is allowed to utilize a process for forming an image by leaving a silver image as it is after completing a development. It is also allowed to utilize another process for forming a black image with the use of a black coupler in a development. It is further allowed to utilize a further process for forming a black image by making use of a mixture of yellow, magenta and cyan couplers.

For the silver halide photographic photosensitive materials of the invention, it is preferable to use the following silver halide photographic photosensitive materials. After completing a photographic process having a color developing step, the yellow, magenta and cyan image forming layers thereof have each a maximum monochromatic density (in yellow, magenta and cyan color, respectively) within the range of 1.50 to 1.90, and each of the densities of the independent color components of the black color (which is obtained by adding a maximum monochromatic density to a maximum density of the black image forming layer) is not lower than 1.90, respectively.

In the invention, a fogging treatment preferably applicable to an internal latent image forming type direct positive image formation can be performed by making an overall flood exposure or by making use of a compound capable of producing fog specks or a foggant.

The above-mentioned overall flood exposure can be performed in the following manner. A photosensitive material exposed imagewise to light is dipped in or wetted with a developer or other aqueous solution and is then uniformly exposed overall to light. Any the light sources may be used for, provided that they can emit the light having the same photosensitive wavelength regions as those of the subject photosensitive material. For example, such a high illuminance light as flash light may be used for a short time, and a weak light may also be used for a long time. The time for the above-mentioned overall flood exposure may be widely varied to meet the subject photosensitive materials, development conditions, kinds of light sources and so forth so that the best positive image can finally be obtained. It is preferable to make an overall flood exposure in an exposure quantity within a certain range to meet the combination with a photosensitive material to be used. When an exposure quantity is excessive, there may usually be a tendency to increase the minimum density, to produce a desensitization or to lower an image quality.

Now, the foggants preferably applicable to the invention will be detailed below.

As for the foggants applicable to the invention, a wide variety of compounds can be used. The foggants may be made present in the course of carrying out a development. For example, the foggants may be contained in the component layers of a photographic photosensitive material other than the support thereof, (among the layers, the silver halide emulsion layers are particularly preferable.) The foggants may also be contained in a developer or a solution to be used in advance of the developing step. The amount of the foggant used therein may be widely changed to meet the requirements. The amount thereof used is within the range of 1 to 1,500 mg and, preferably, 10 to 1,000 mg when adding it into a silver halide emulsion layer, and within the range of 0.01 to 5 g/liter and, preferably, 0.05 to 1 g/liter when adding it into a processing solution such as a developer.

The foggants applicable to the invention include, for example; hydrazines given in U.S. Pat. Nos. 2,563,785, 2,588,982; hydrazide or hydrazine compounds given in U.S. Pat. No. 3,227,552; heterocyclic quaternary nitrogen salt compounds given in U.S. Pat. Nos. 3,615,615, 3,718,479, 3,719,494, 3,734,738 and 3,759,901; and the compounds having an adsorption group to silver halide surfaces, such as acylhydrazinophenylthio ureas given in U.S. Pat. No. 4,030,925. These foggants may also be used in combination. For example, the foregoing RD 15162 describes that a nonadsorption type foggant is used with an adsorption type foggant in combination. This combination technique is also effective in embodying the invention. As for the foggants applicable to the invention, any one of those of the adsorption type and the non-adsorption type can be used and the combination thereof can also be used.

The typical examples of the useful foggants may be given as follows. Namely, hydrazine compounds including hydrazine hydrochloride, 4-methylphenyl hydrazine hydrochloride, 1-acetyl-2-phenyl hydrazine, 1-formyl-2-(4-methylphenyl) hydrazine, 1-methylsulfonyl-2-phenyl hydrazine, 1-methylsulfonyl-2- (3-phenylsulfonamidophenyl) hydrazine, 1-benzoyl-2-phenyl hydrazine, formaldehydephenyl hydrazine; N-substituted quaternary cycloammonium salts including 3-(2-formylethyl) -2-methylbenzothiazolium bromide, 3-(2-acetylethyl) -2-benzyl-5-phenylbenzoxazolium bromide, 3- (2-acetylethyl) -2-benzylbenzoselenazolium bromide, 2-methyl-3- [3-(phenylhydrazino) propyl]benzothiazolium bromide, 1,2-dihydro-3-methyl-4-phenylpyrido [2,1-b ]benzothiazolium bromide, 1,2-dihydro-3-methyl-4-phenylpyrido [2, 1-b]benzoselenazolium bromide, and 4,4'-ethylene bis (1,2-dihydro)-3-methyl-pyrido[2,1-b]benzothiazolium bromide; 5- (3-ethyl-2-benzothiazolinidene) -3- [4- (2-formyl hydrazino) phenyl]rhodanine, 1,3-bis[4- (2-formyl hydrazino)phenyl]-thiourea, 7-(3-ethoxythiocarbonylaminobenzamido)-9-methyl-10 -proparagyl-1,2,3, 4-tetrahydroacridinium trifluoromethane sulfonate, 1-formyl-2-[4-{3-(2-methoxyphenyl)ureido}phenyl]hydrazine, and so forth.

When a photosensitive material comprising the silver halide emulsion layers relating to the invention is exposed imagewise to light and is then exposed overall to flood light or developed in the presence of a foggant, direct positive images can be formed.

As for the developing agents applicable to the developers for developing the photographic photosensitive materials relating to the invention, the typical examples thereof may be given as follows; namely, common silver halide developing agents including polyhydroxybenzenes such as hydroquinone, aminophenols, 3-pyrazolidones, ascorbic acid and the derivatives thereof, reductons, phenylenediamines or the mixtures thereof. The concrete examples thereof may further be given as follows, namely, hydroquinone, aminophenol, N-methyl aminophenol, 1-phenyl-3-pyrazolidone, 1-phenyl-4,4-dimethyl-3-pyrazolidone, 1-phenyl-4-methyl-4-hydroxymethyl-3-pyrazolidone, ascorbic acid, N,N-diethyl-p-phenylenediamine, diethylamino-o-toluidine, 4-amino-3-methyl-N-ethyl-N-($\beta$-methanesulfonamidoethyl) aniline, 4-amino-3-methyl-N-ethyl-N-($\beta$-hydroxyethyl) aniline and 4-amino-N-ethyl-N-($\beta$-hydroxyethyl) aniline. It is also allowed that the abovegiven developing agents may be contained in an emulsion in advance so that the developing agents can work on silver halides when they are dipped in an aqueous high pH solution.

It is preferable that the color photosensitive materials relating to the invention contain a nitrogen-containing heterocyclic compound having a mercapto group represented by the following Formula [11], (hereinafter referred to as a mercapto compound.)

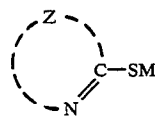

Formula [11]

wherein M represents a hydrogen atom, an alkali metal atom, or the protective group for an ammonium or mercapto group; and Z represents a group consisting of non-metal atoms necessary to form a heterocyclic ring, provided the heterocyclic ring may have a substituent or may be condensed.

The protective groups for the mercapto groups represented by M include, for example, a group capable of forming a mercapto group upon being cleaved by alkali. These groups include, typically, an acyl, alkoxycarbonyl or alkylsulfonyl group.

The nitrogen-containing heterocyclic groups may have, for example, a carbon, nitrogen, oxygen, sulfur or selenium atom to serve as the ring constituting atom thereof. Among these rings, a 5- or 6-membered ring is preferable. The typical examples of the heterocyclic rings include those of imidazole, benzoimidazole, naphthoimidazole, thiazole, thiazoline, benzothiazole, naphthothiazole, oxazole, benzoxazole, naphthoxazole, selenazole, benzoselenazole, naphthoselenazole, triazole, benzotriazole, tetrazole, oxadiazole, thiadiazole, pyridine, pyrimidine, triazine, purine, azaindene and so forth.

The substituents allowed to be substituted to the abovegiven heterocyclic rings include, for example, a halogen atom, or a group of hydroxyl, amino, nitro, mercapto, carboxyl or the salts thereof, sulfo or the salts thereof, alkyl, alkoxy, aryl, aryloxy, alkylthio, arylthio, acylamino, sulfonamido, carbamoyl, sulfamoyl, or the like.

Among the compounds represented by Formula [11], the particularly preferable compounds may further be represented by the following Formulas [12], [13] and [14].

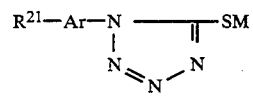

Formula [12]

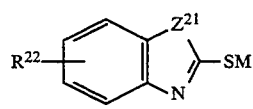

Formula [13]

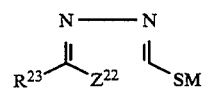

Formula [14]

In Formulas [12] through [14], M is synonymous with M denoted in Formula [11]. The typical examples of the compounds represented by Formula [11] include Compounds (1) through (39) given in JP OPI publication No. 64-73338/1989, pp. 11~15.

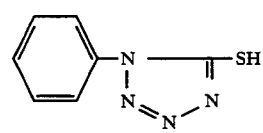

(1)

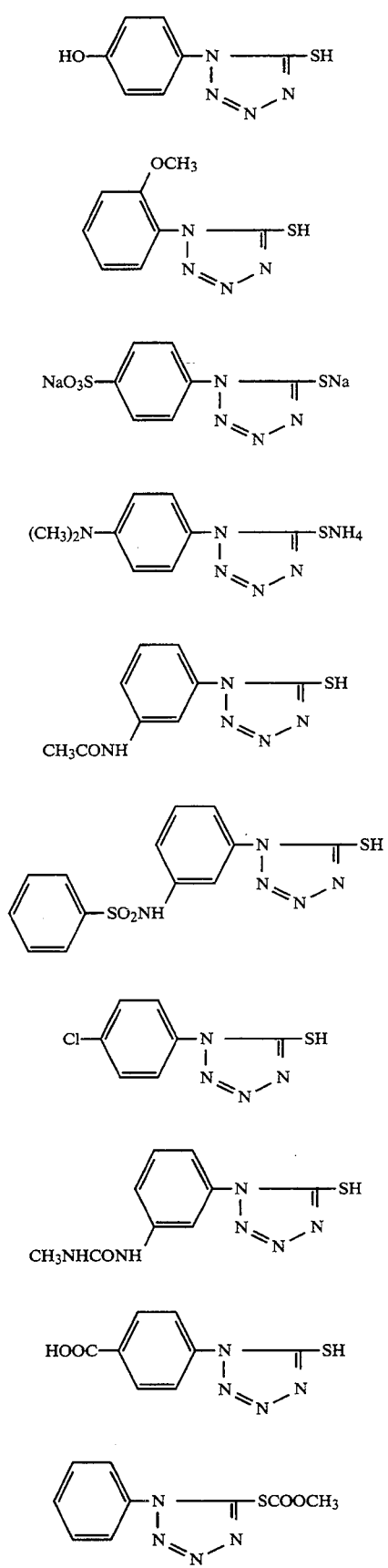
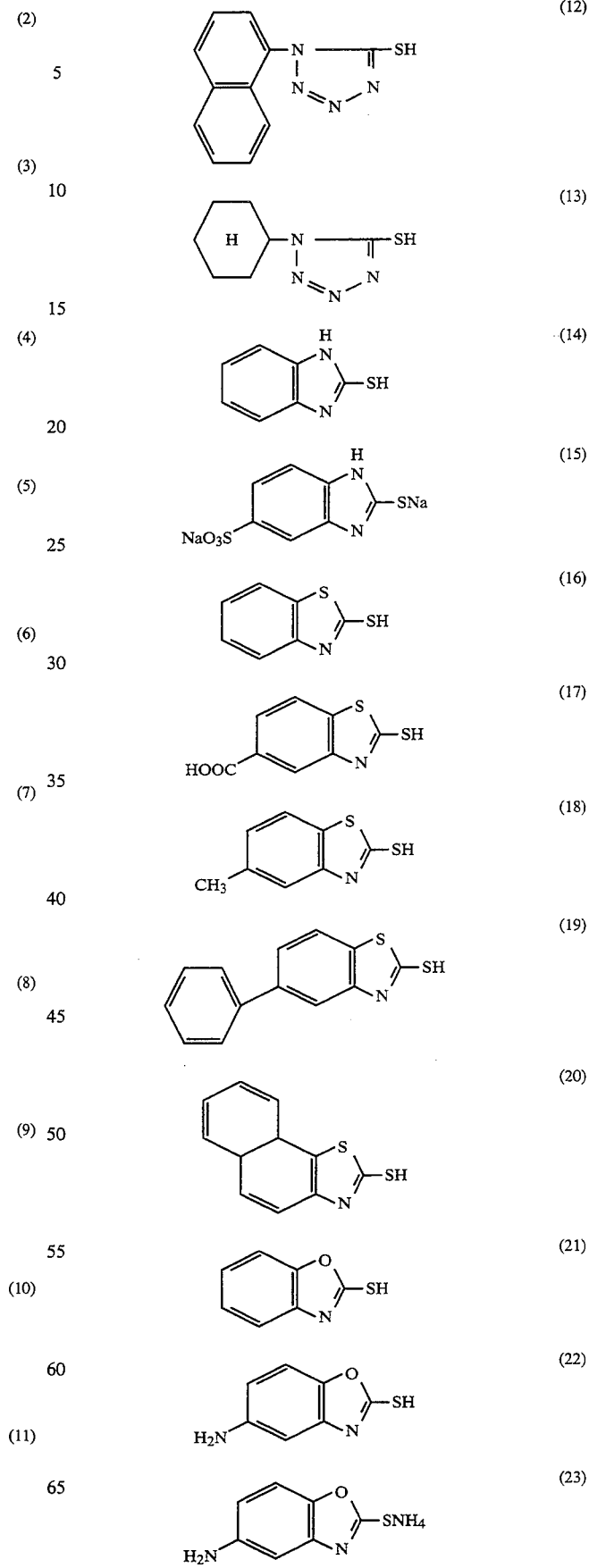

-continued

(24) 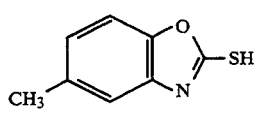

(25) 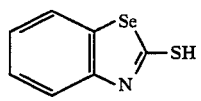

(26) 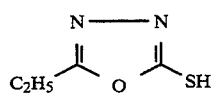

(27) 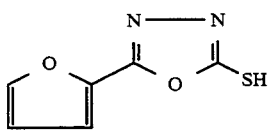

(28) 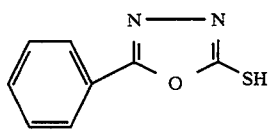

(29) 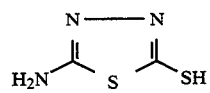

(30) 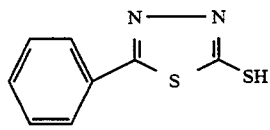

(31) 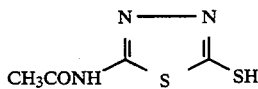

(32) 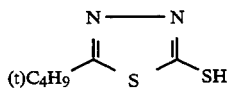

(33) 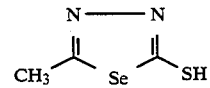

(34) 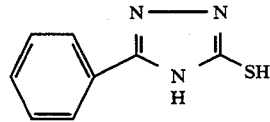

(35) 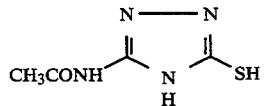

(36) 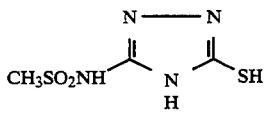

-continued

(37) 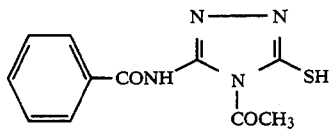

(38) 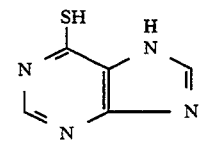

(39) 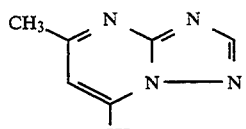

These compounds can readily be synthesized in any well-known processes. For example, they can be prepared in the processes detailed in U.S. Pat. Nos. 2,403,927 and 3,376,310, JP OPI Publication No. 55-59463/1980, or Journal of Chemical Society, 1952, p.4237. Some of the compounds are available on the market.

The mercapto compounds of the invention can be contained in a photosensitive material, upon dissolving them in water, an organic solvent having an affinity to water such as methanol and acetone, weak alkali, or weak acid. The amount thereof to be added may be varied suitably to meet the kinds of the compounds to be used and the layers to be arranged. Generally, when adding them to a silver halide emulsion layer, they are added in an amount within the range of $10^{-8}$ to $10^{-2}$ mols and, preferably, $10^{-6}$ to $10^{-3}$ mols, per mol of silver halide used.

The developers applicable to the invention are allowed to contain a specific antifoggant and a development inhibitor. It is also allowed that these additives for developers may be incorporated into the component layers of a photographic photosensitive material, if required.

The silver halide photographic light sensitive materials of the invention can be applied with any known photographic additives.

The well-known photographic additives include, for example, the following compound given in RD 17643 and RD 18176.

| Additives | RD 17643 Page | RD 17643 Group | RD 18716 Page | RD 18716 Group |
|---|---|---|---|---|
| Chemical sensitizer | 23 | III | 648 | Upper right |
| Sensitizing dye | 23 | IV | 648 | Upper right |
| Development inhibitor | 29 | XXI | 648 | Upper right |
| Antifoggant | 24 | VI | 649 | Lower right |
| Stabilizer | 24 | VI | 649 | Lower right |
| Color stain preventive | 25 | VII | 650 | Left-right |
| UV absorbent | 25~26 | VII | 649 R ~ 650 L | |
| Filter dye | 25~26 | VII | 649 R ~ 650 L | |
| Whitening agent | 24 | V | | |
| Hardener | 26 | X | 651 R | |
| Coating aid | 26~27 | XI | 650 R | |
| Surfactant | 26~27 | XI | 650 R | |
| Plasticizer | 27 | XII | 650 R | |
| Lubricant | 27 | XII | 650 R | |
| Antistatic agent | 27 | XII | 650 R | |
| Matting agent | 28 | XVI | 650 R | |

| Additives | RD 17643 Page | Group | RD 18716 Page | Group |
|---|---|---|---|---|
| Binder | 29 | IX | 651 | R |

The emulsion layers of the light sensitive materials relating to the invention can be applied each with a dye forming coupler capable of producing a dye upon making a coupling reaction with the oxidized products of a color developing agent. The dye forming couplers are usually selected respectively to be able to produce dyes capable of absorbing the rays of light having the photospectral sensitivities of the corresponding emulsion layers. That is to say, a yellow dye forming coupler is applied to a blue-sensitive emulsion layer; a magenta dye forming coupler, to a green-sensitive emulsion layer; and a cyan dye forming coupler, to a red-sensitive emulsion layer; respectively. However, it is also allowed to prepare a silver halide color photographic light sensitive material in any other ways than the above-mentioned combination so as to meet the purposes.

It is preferable that these dye-forming couplers are to contain a so-called ballast group, that is, a non-coupler-diffusing group having not less than 8 carbon atoms in the molecules of the coupler. These dye-forming couplers may be either one of those of the 4-equivalent type in which the silver ions of the four molecules are required to be reduced for forming one molecule of a dye, and those of 2-equivalent type, in which the silver ions of the two molecules are required for forming one molecule of a dye. It is also allowed to use a DIR coupler capable of releasing a development inhibitor while carrying out a development so that the sharpness and graininess of the resulting images can be improved, or a DIR compound capable of producing a colorless compound upon making a coupling reaction with the oxidized products of a developing agent and, at the same time, releasing a development inhibitor.

The DIR couplers and DIR compounds each applicable thereto include those each directly bonding an inhibitor to the coupling position thereof, and those each bonding an inhibitor to the coupling position thereof through a divalent group and the inhibitor can be released with any one of an intramolecular nucleophilic reaction, an intramolecular electron-transfer reaction and so forth produced in the group split off in the coupling reaction, (these couplers and compounds are referred to as timing DIR couplers and timing DIR compounds, respectively.)

A colorless coupler capable of making a coupling reaction with the oxidized products of an aromatic primary amine developing agent, but incapable of producing any dye (that is also so-called a competing coupler) may also be used with a dye forming coupler in combination.

In the magenta image forming layers relating to the invention, the compound represented by the following Formula [M-I] is preferably contained.

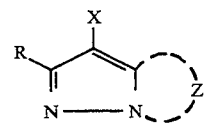

Formula [M-I]

In the above-given formula, Z represents a group consisting of non-metal atoms necessary to form a nitrogen-containing heterocyclic ring, provided that the ring formed of the above-mentioned Z may also have a substituent.

X represents a hydrogen atom or a group capable of splitting off upon making a reaction with the oxidized products of a color developing agent; and R represents a hydrogen atom or a substituent.

In the above-given Formula [M-I], there is no special limitation to the substituents represented by R. However, they include, typically, each of the groups of alkyl, aryl, anilino, acylamino, sulfonamido, alkylthio, arylthio, alkenyl or cycloalkyl and, besides, they also include, a halogen atom, each of the groups of cycloalkenyl, alkinyl, heterocyclic, sulfonyl, sulfinyl, phosphonyl, acyl, carbamoyl, sulfamoyl, cyano, alkoxy, aryloxy, heterocyclic-oxy, siloxy, acyloxy, carbamoyloxy, amino, alkylamino, imido, ureido, sulfamoylamino, alkoxycarbonylamino, alkoxycarbonyl, aryloxycarbonyl or heterocyclic-thio, and a spiro-compound residual group and a cross-linked hydrocarbon compound residual group.

The substituents represented by R, the groups capable of splitting off upon making a reaction with the oxidized products of a color developing agent, the nitrogen containing heterocyclic rings formed by Z and the rings formed by Z, each may have the above-mentioned substituents, as described above. The preferable scope of the substituents and the typical examples thereof, and the preferable scope of the magenta couplers represented by Formula [M-I] are each the same as those given in European Patent Publication No. 0327272, p.5, the 23rd line to p.8, the 52th line.

The typical examples of the magenta couplers represented by Formula [M-I] will be given below.

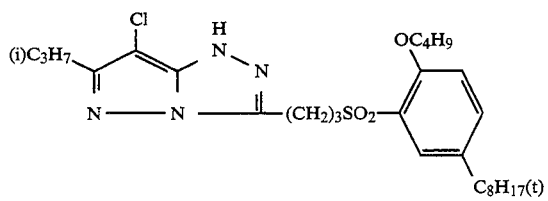

M-1

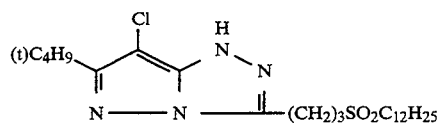

M-2

-continued
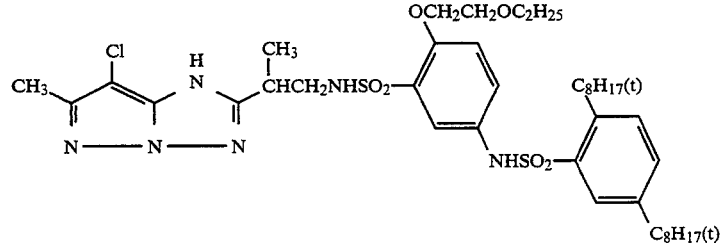
M-3
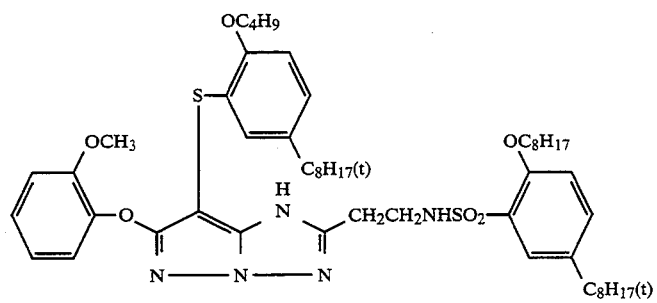
M-4
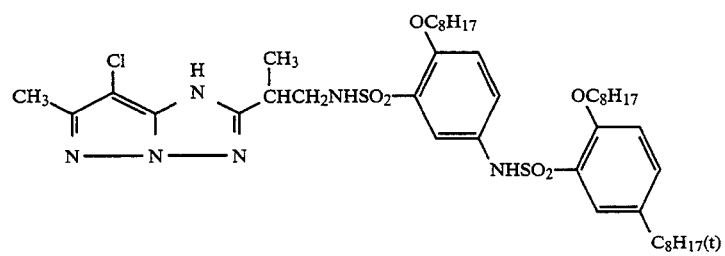
M-5
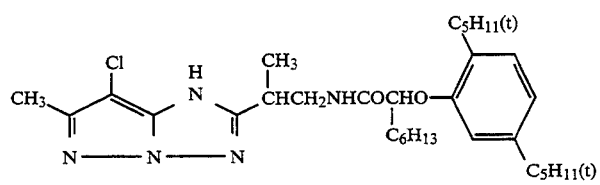
M-6
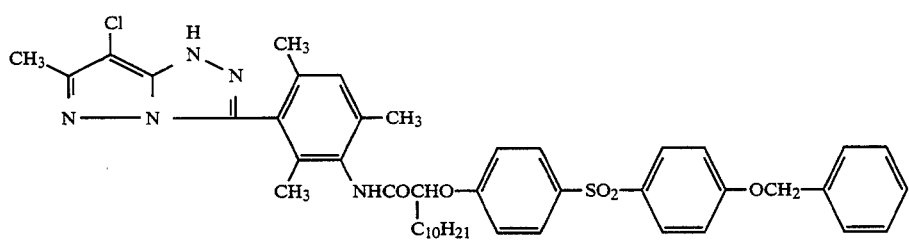
M-7
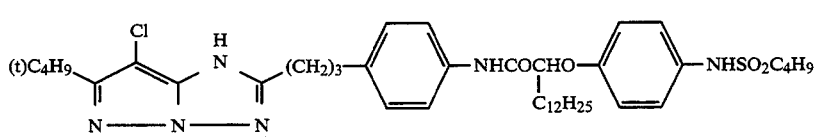
M-8
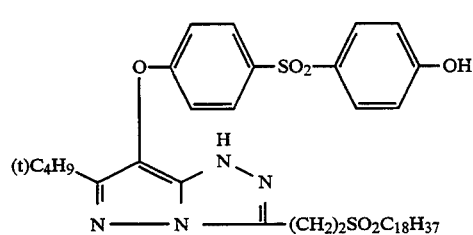
M-9

-continued
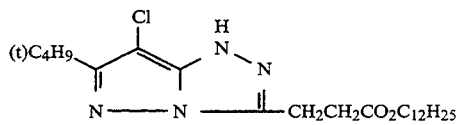
M-10
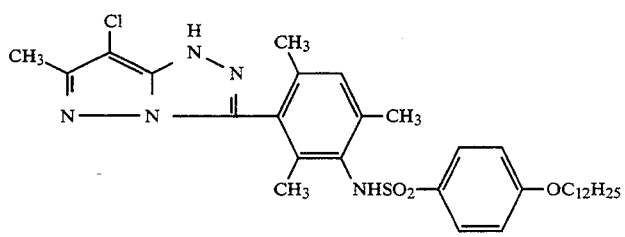
M-11
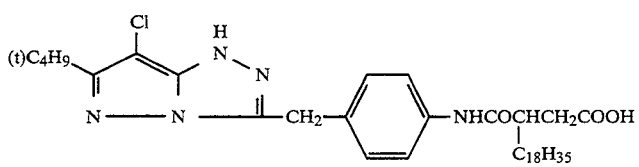
M-12
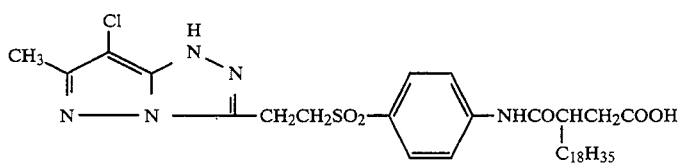
M-13
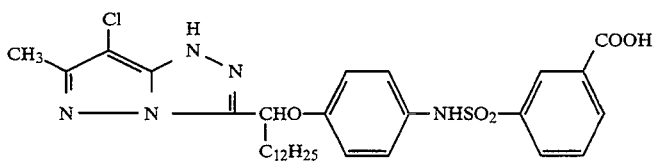
M-14
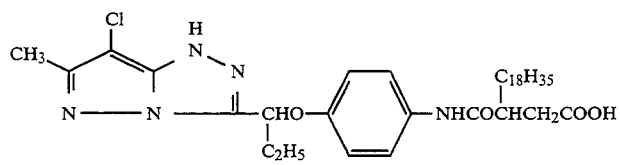
M-15
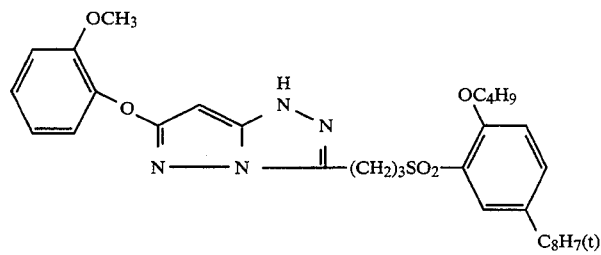
M-16
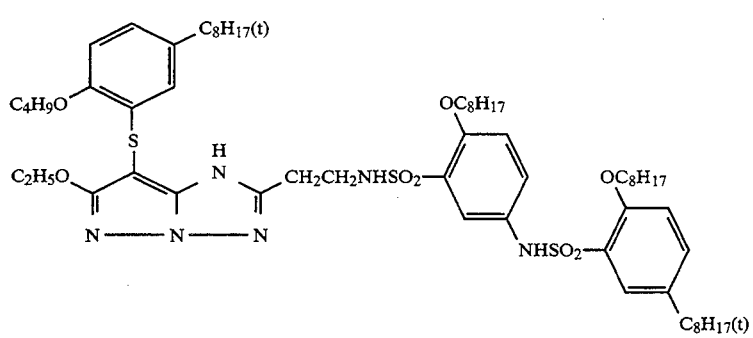
M-17

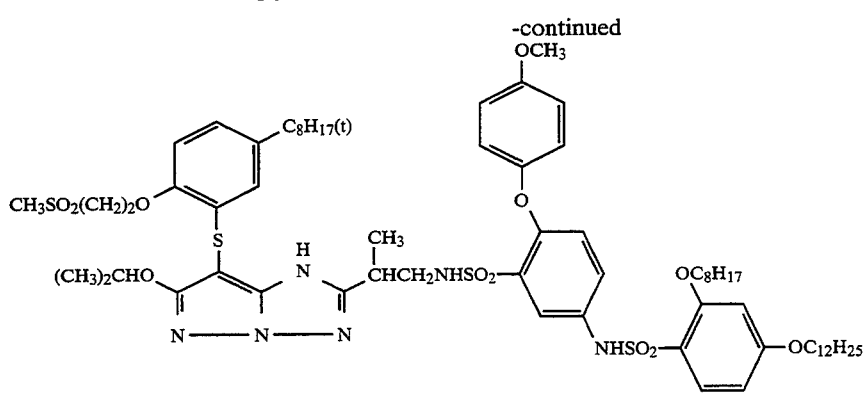

M-18

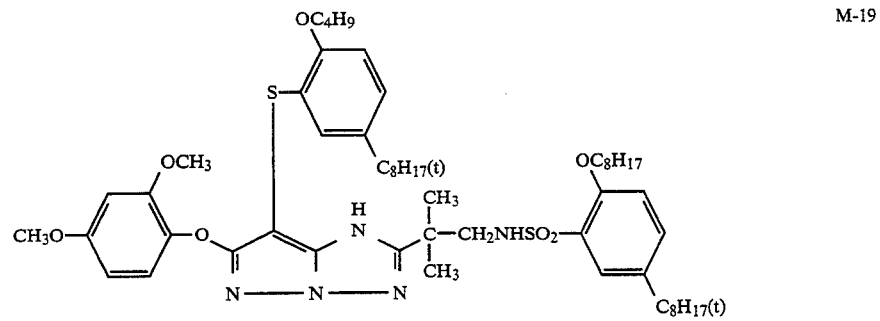

M-19

Further, the other typical examples thereof include those other than the above-given typical examples given in the compounds M-1 through M-16 given in European Patent Publication No. 0273712, pp. 6~21 and the compounds 1 through 223 given in European Patent Publication No. 0235913, pp. 36~92.

The aforementioned couplers can be synthesized with reference to Journal of the Chemical Society, Perkin I, 1977, 2047~2052; U.S. Pat. No. 3,725,067; and JP OPI Publication Nos. 59-99437/1984, 58-42045/1983, 59-162548/1984, 59-171956/1984, 60-33552/1985, 60-43659/1985, 60-172982/1985, 60-190779/1985, 62-209457/1987 and 63-307453/1988.

The above-described couplers may also be used with other kinds of magenta couplers in combination and may be commonly used in an amount within the range of $1 \times 10^{-3}$ mols to 1 mol and, preferably, $1 \times 10^{-2}$ mols to $8 \times 10^{-1}$ mols, each per mol of silver halide used.

In the color photographic light sensitive materials of the invention, $\lambda L0.2$ of the spectral absorption of a magenta image is preferably within the range of 580 to 635 nm.

In the silver halide color photographic light sensitive materials of the invention, when the $\lambda L0.2$ thereof is within the range of 580 to 635 nm, the $\lambda max$ of the spectral absorption of a magenta image is preferably within the range of 530 to 560 nm.

In the silver halide color photographic light sensitive materials of the invention, the $\lambda L0.2$ and $\lambda max$ of the spectral absorption of a magenta image are the values measured in the following procedures.

Procedures for measuring $\lambda L0.2$ and $\lambda max$

In the case of a positive type silver halide color photographic light sensitive material, it is exposed uniformly to red light having a minimum quantity to obtain the minimum density of a cyan image and is then exposed uniformly to blue light having a minimum quantity to obtain the minimum density of a yellow image. Successively, it is exposed to white light through an ND filter and then developed. At that time, the ND filter density is so adjusted as to have the maximum value of a light absorbance of 1.0, when the spectral absorption between 500 and 700 nm is measured upon attaching an integrating sphere to a spectrophotometer, and a zero correction is made by a standard white plate made of magnesium oxide, so that a magenta image can be formed.

In the case of a negative type silver halide color photographic light sensitive material, an ND filter density is so adjusted as to have the maximum light absorbance in the same manner as in the case of the positive type light sensitive materials, when a magenta image is formed by exposing the light sensitive material to green light through the ND filter and is then developed. The term, $\lambda L0.2$, herein means a wavelength longer than the wavelengths showing the maximum light absorbance of 1.0 in the spectral absorbance curve of the magenta image, that is, the wavelength showing a light absorbance of 0.2.

In the silver halide photographic photosensitive materials relating to the invention, the magenta image forming layer thereof contains a yellow coupler as well as a magenta coupler. The difference of the pKa between these couplers is to be preferably within two and particularly within 1.5.

In the magenta image forming layer of the invention, the magenta couplers to be contained therein are those represented by the following Formula [Y-Ia]. Among the yellow couplers represented by Formula [Y-Ia] and when they are contained therein together with a magenta coupler represented by Formula [M-1] in combination, the particularly preferable yellow couplers include, for example, those having a pKa value of not less than 3 as compared with a pKa value of not less than 3 that is not less than the pKa value of the coupler represented by Formula [M-1] that is subject to the combination use.

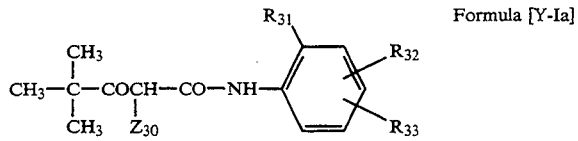

Formula [Y-Ia]

In Formula [Y-Ia], $R_{31}$ represents a halogen atom or an alkoxy group; $R_{32}$ represents a hydrogen atom, a halogen atom or an alkoxy group that may have a substituent; $R_{33}$ represents an acylamino group, an alkoxycarbonyl group, an alkylsulfamoyl group, an arylsulfamoyl group, an arylsulfonamido group, an alkylureido group, an arylureido group, a succinimido group, an alkoxy group or an aryloxy group, each of which may have a substituent.

$Z_{30}$ represents a hydrogen atom, a monovalent organic group capable of splitting off upon coupling with the oxidized products of a color developing agent, or a halogen atom.

The typical examples of the compounds preferably applicable thereto include the compounds (Y-1) through (Y-58) given in JP OPI Publication No. 2-139542/1990, pp. (13)~(17), as well as the following compounds Y-1 and Y-2. However, the invention shall not be limited thereto.

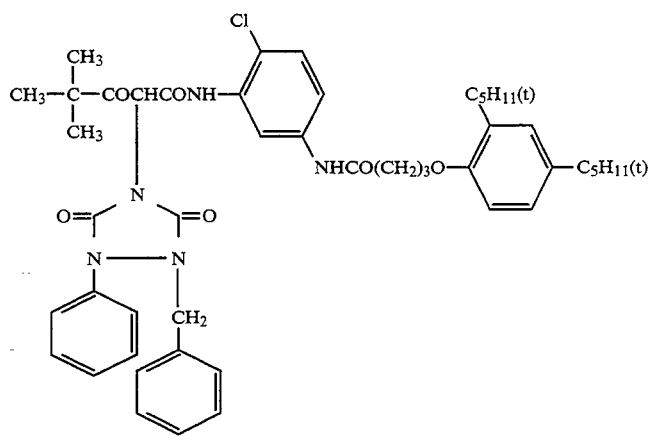

(Y-1)

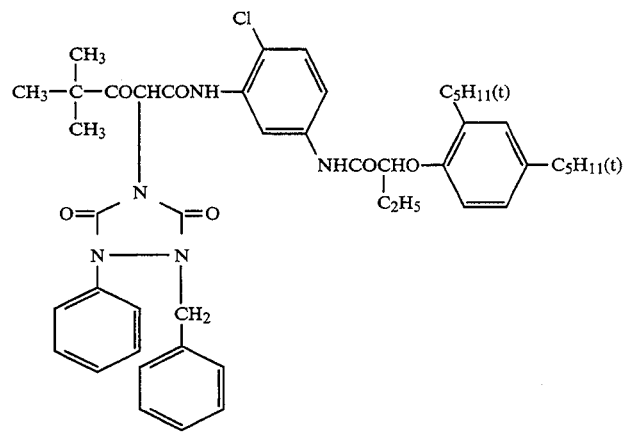

(Y-2)

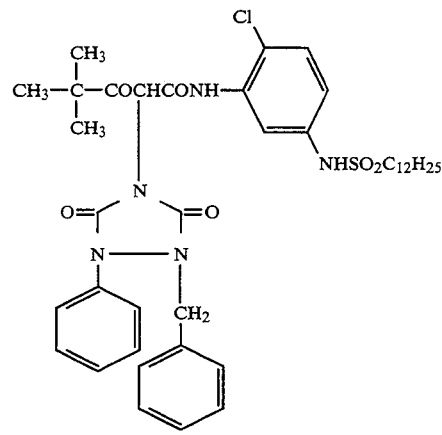

(Y-3)

-continued
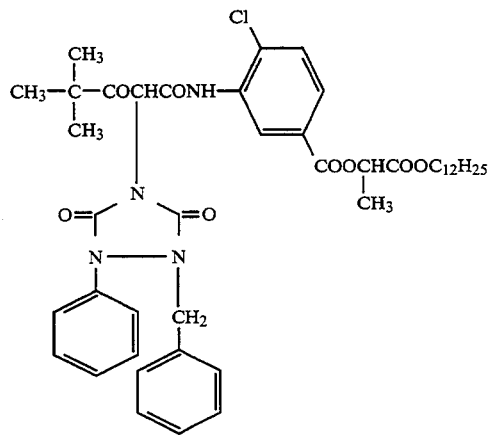
(Y-4)
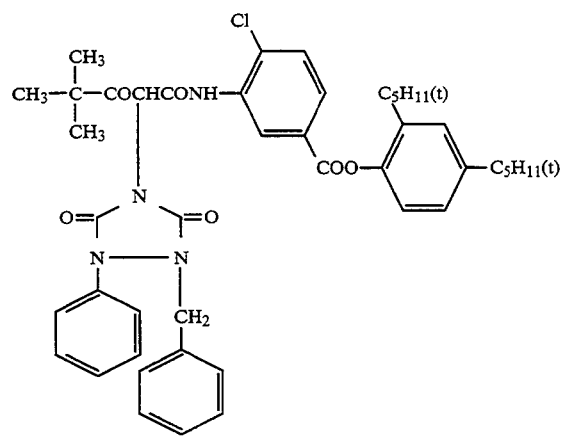
(Y-5)
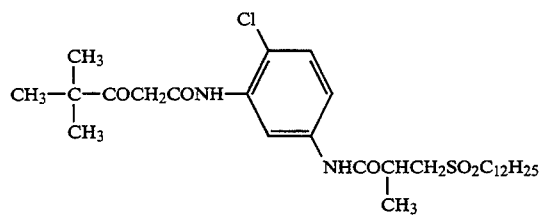
(Y-6)
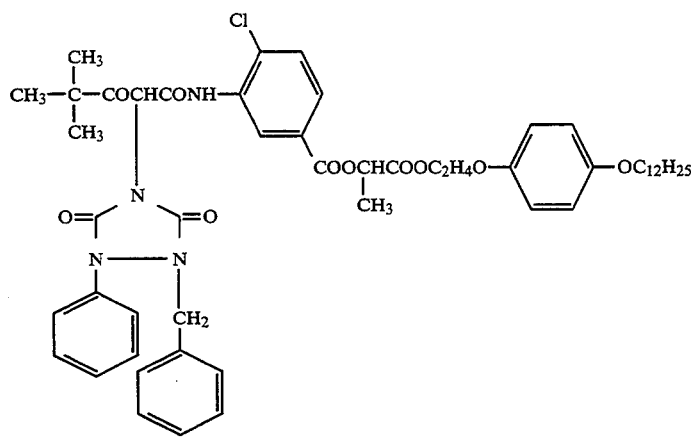
(Y-7)

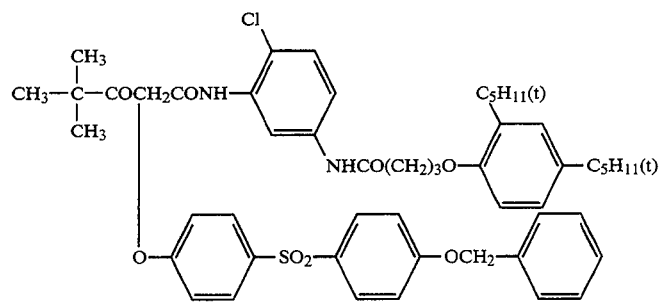
(Y-8)
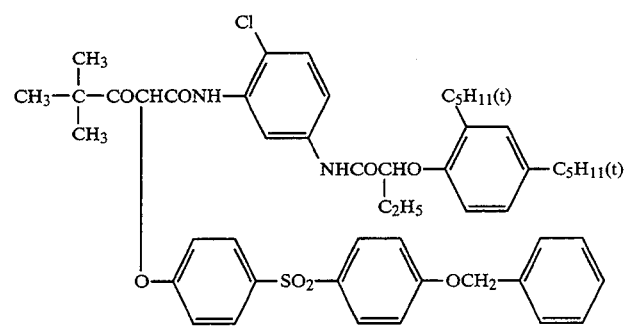
(Y-9)
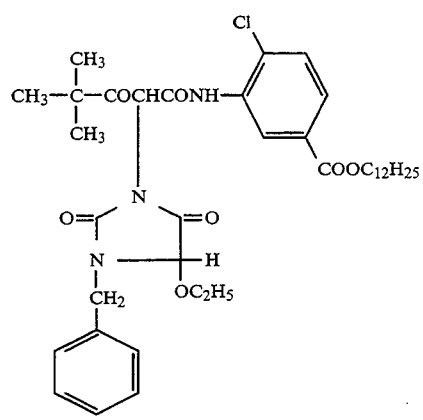
(Y-10)
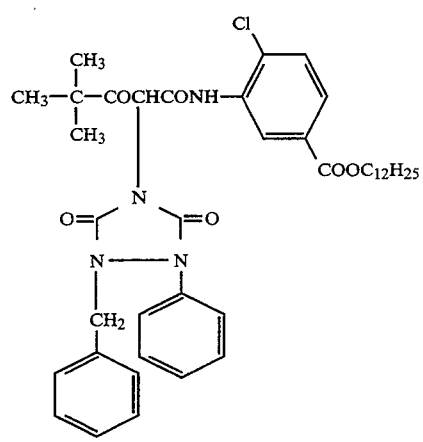
(Y-11)

(Y-12)
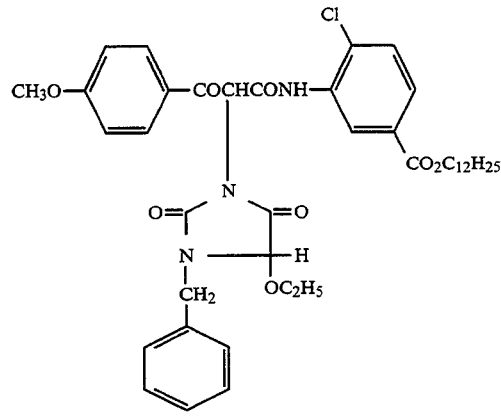
(Y-13)
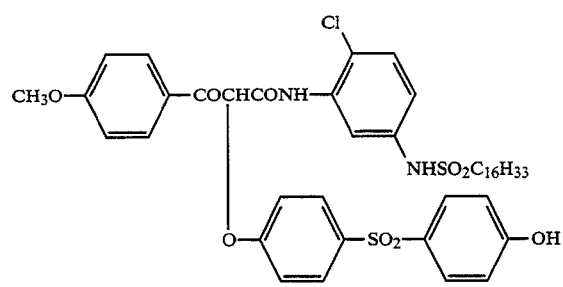
(Y-14)
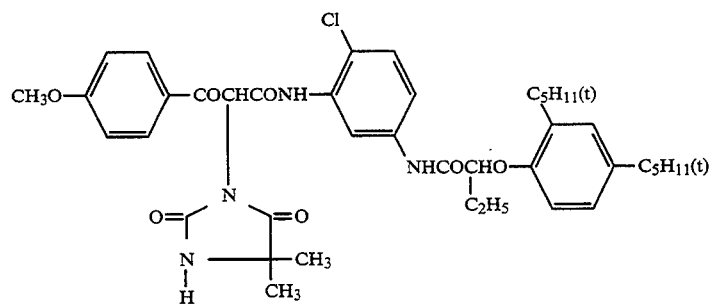
(Y-15)
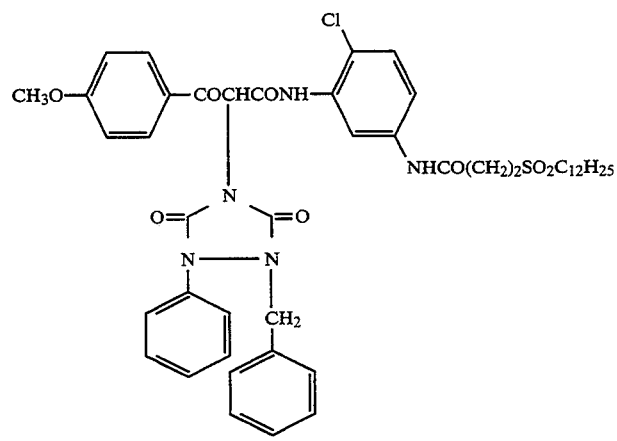

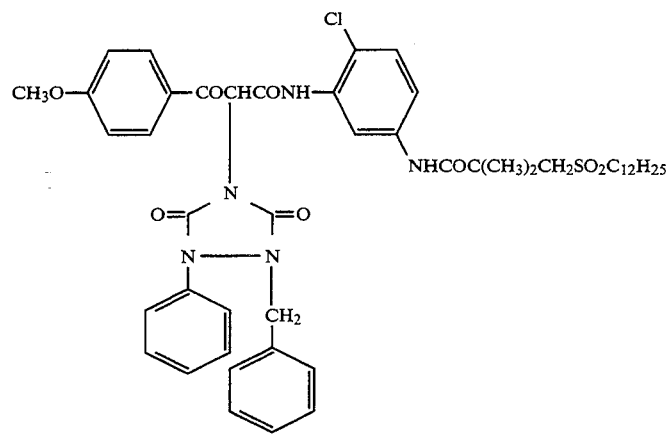
(Y-16)
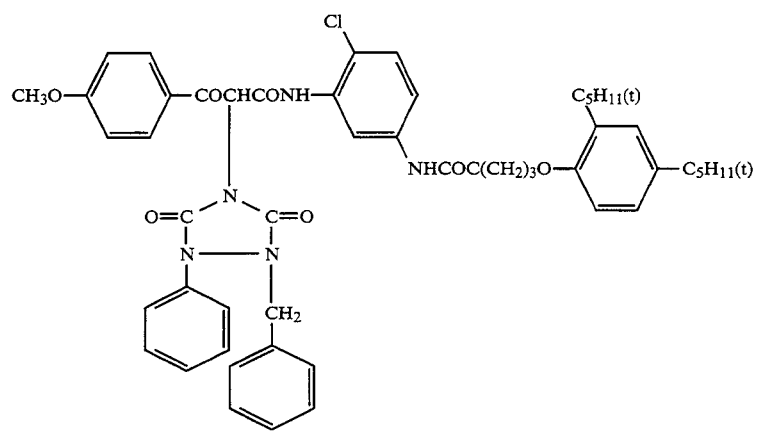
(Y-17)
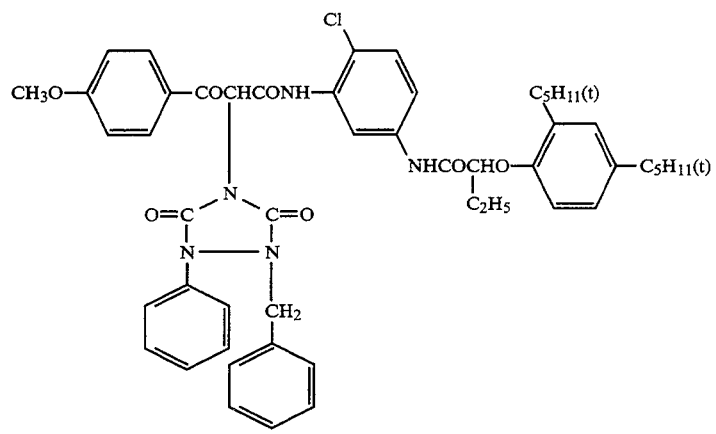
(Y-18)

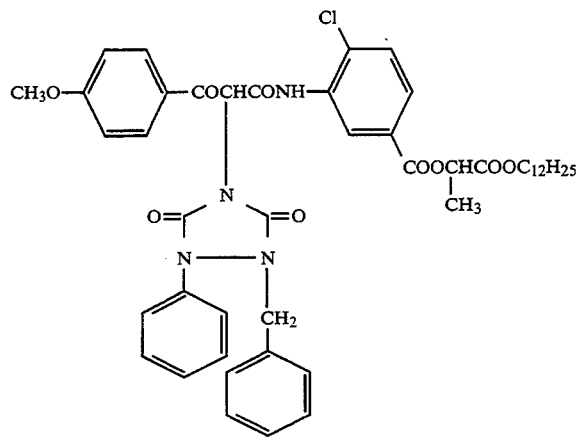
(Y-19)
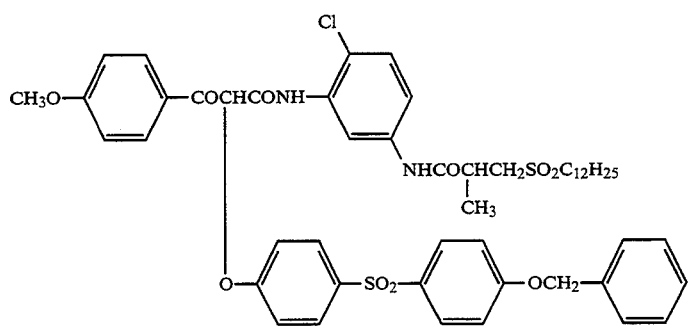
(Y-20)
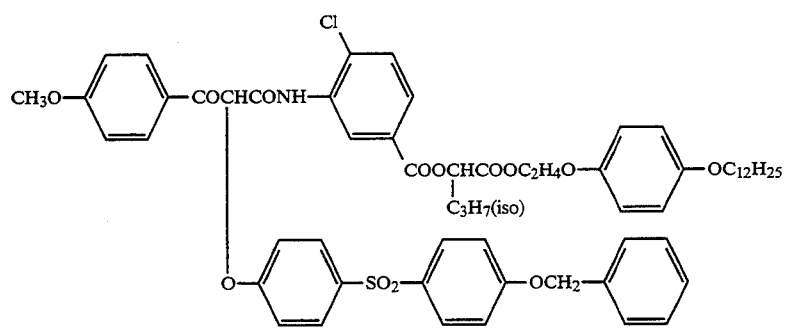
(Y-21)
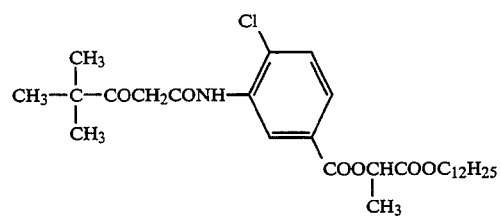
(Y-22)
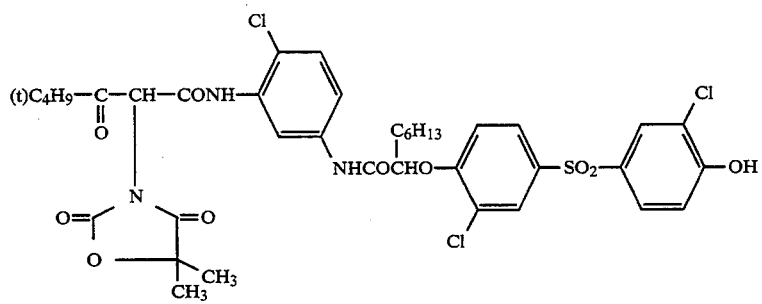
(Y-23)

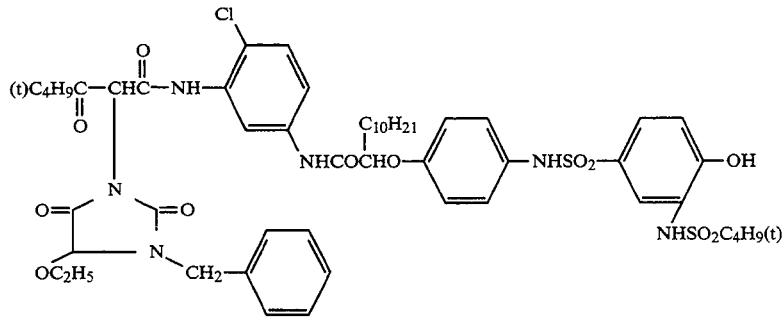
(Y-24)
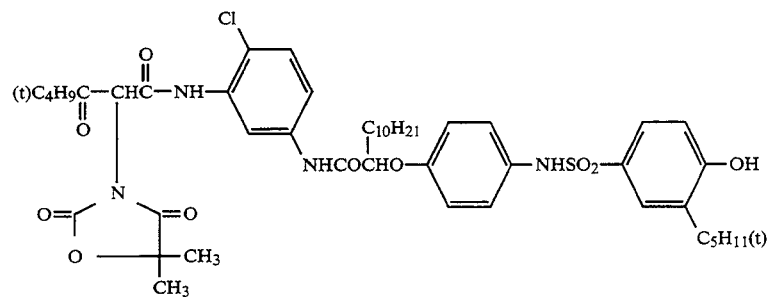
(Y-25)
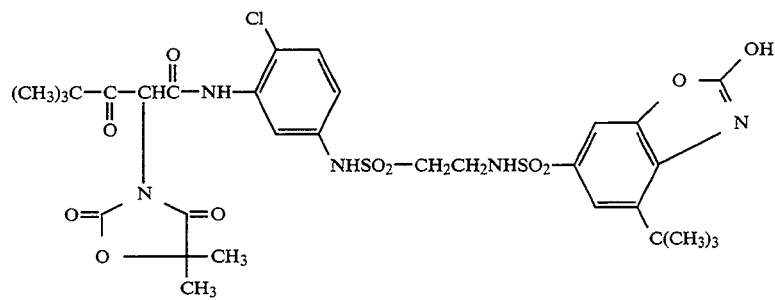
(Y-26)
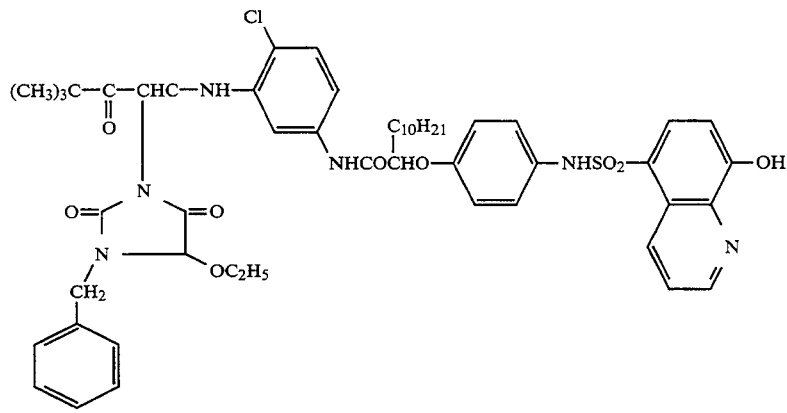
(Y-27)
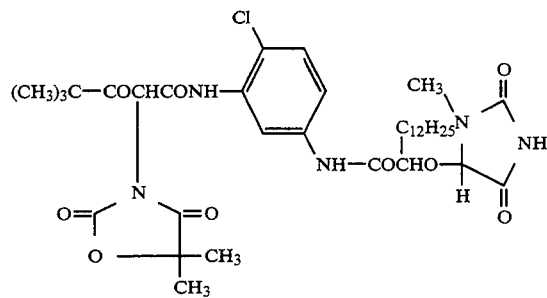
(Y-28)

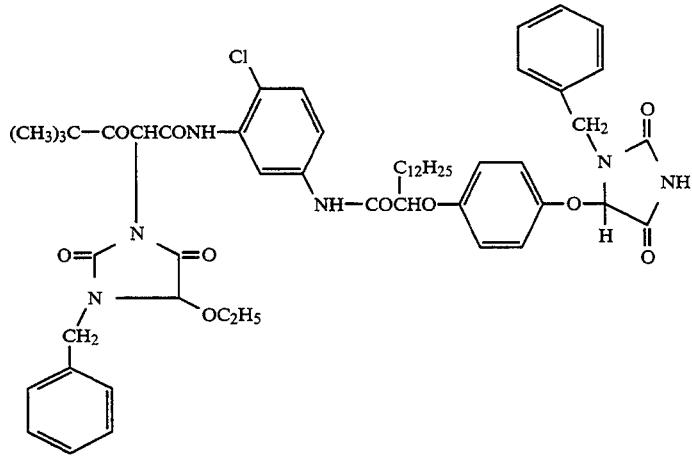
(Y-29)
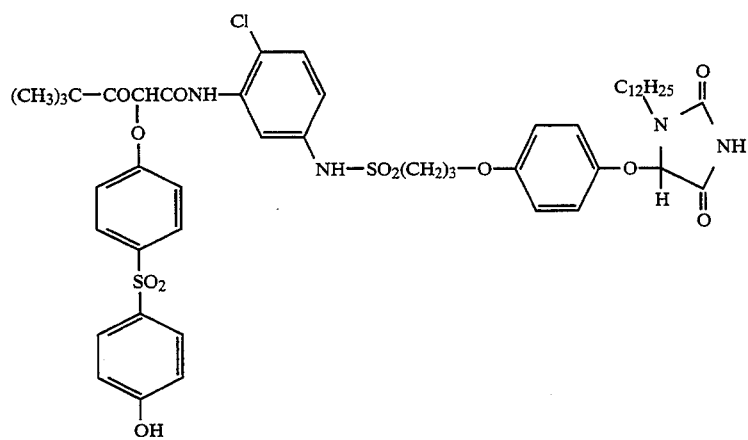
(Y-30)
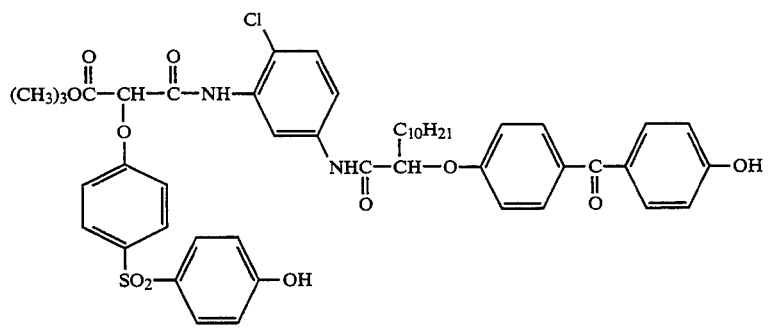
(Y-31)
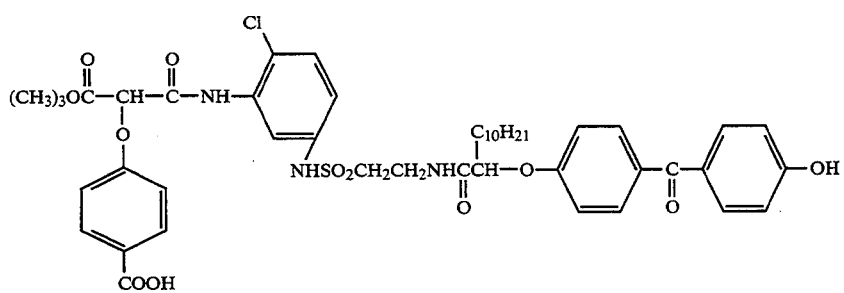
(Y-32)

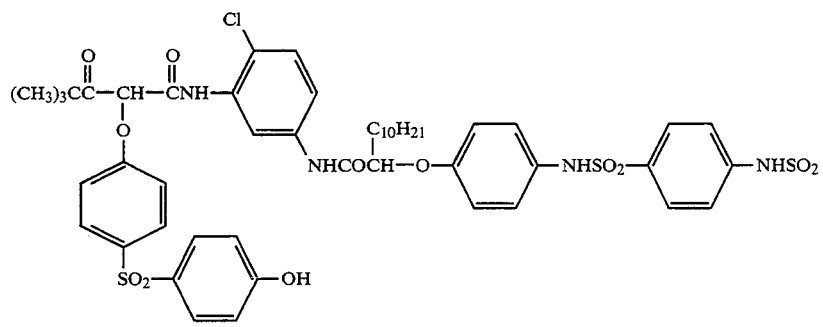
(Y-33)
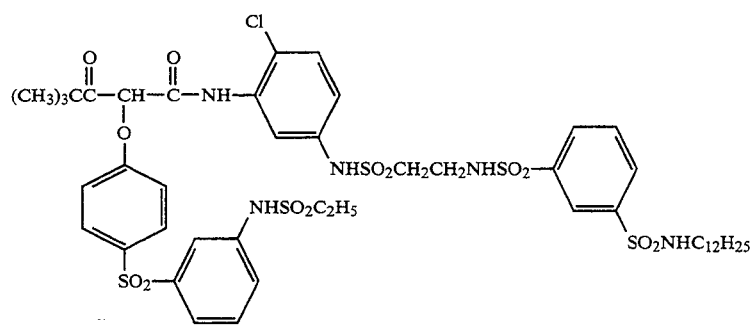
(Y-34)
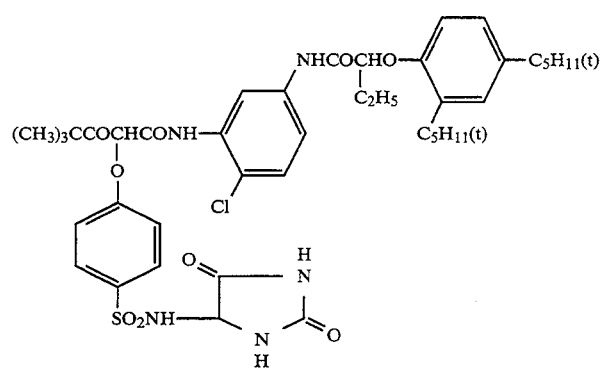
(Y-35)
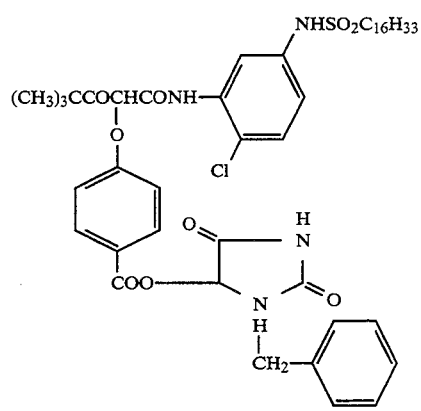
(Y-36)

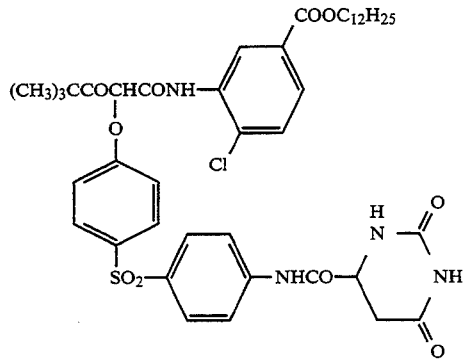
(Y-37)
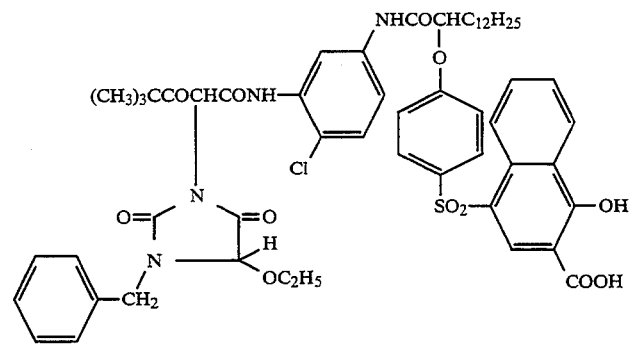
(Y-38)
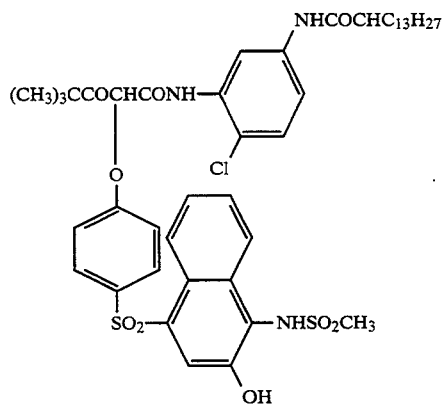
(Y-39)
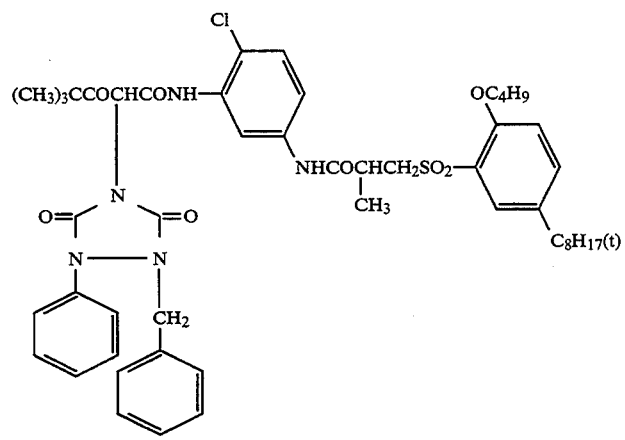
(Y-40)

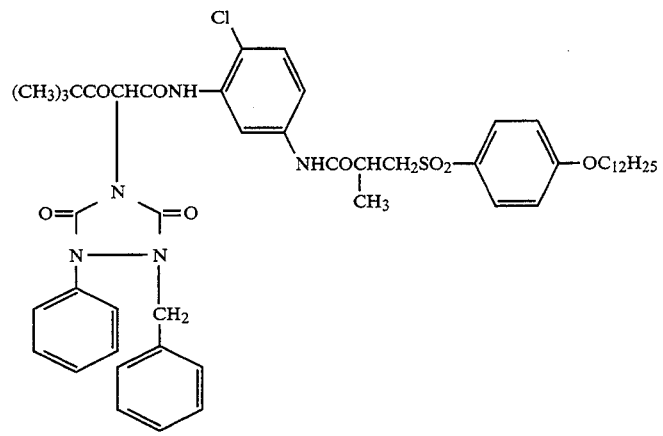
(Y-41)
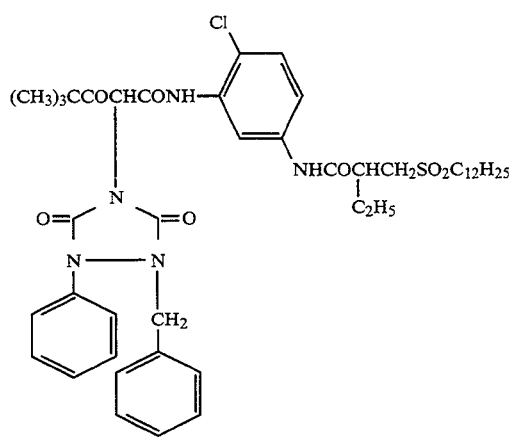
(Y-42)
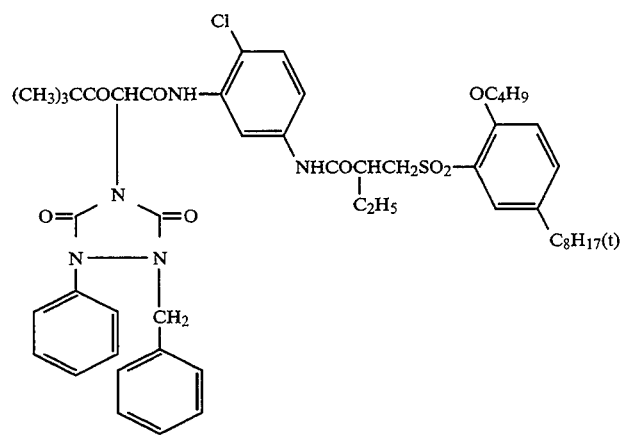
(Y-43)

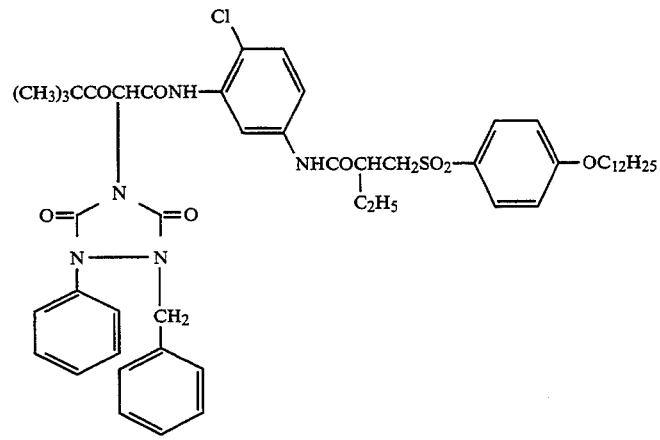
(Y-44)
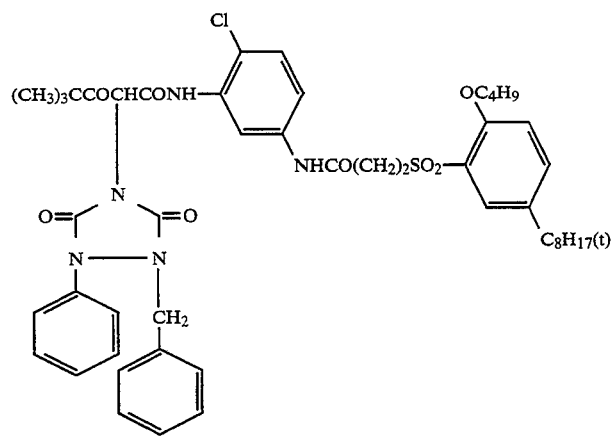
(Y-45)
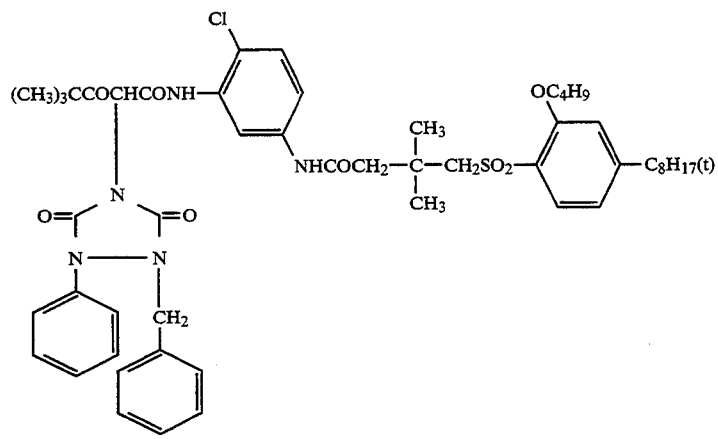
(Y-46)

-continued
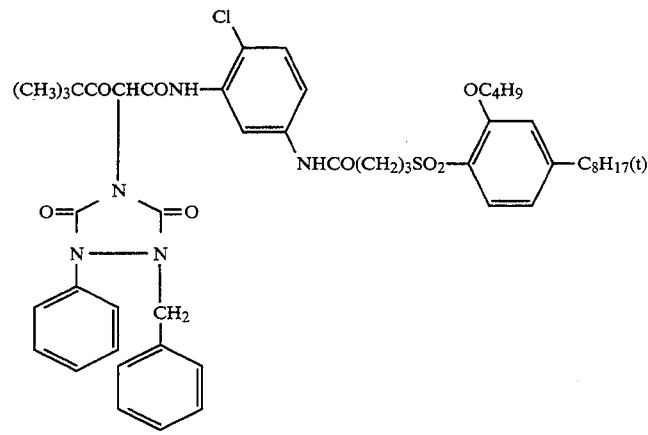
(Y-47)
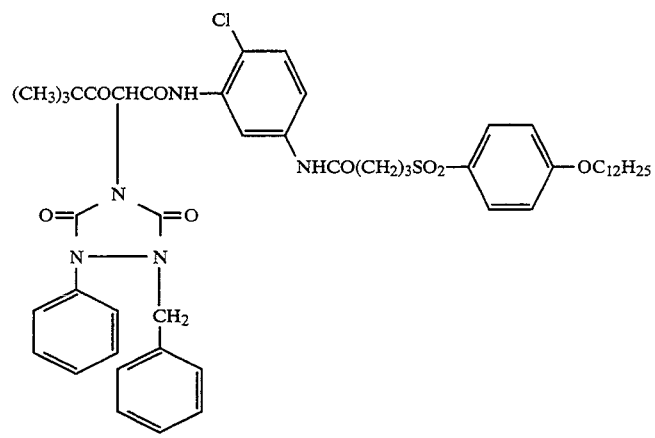
(Y-48)
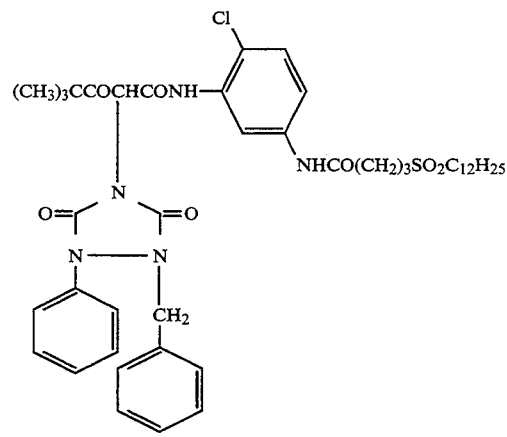
(Y-49)

(Y-50)
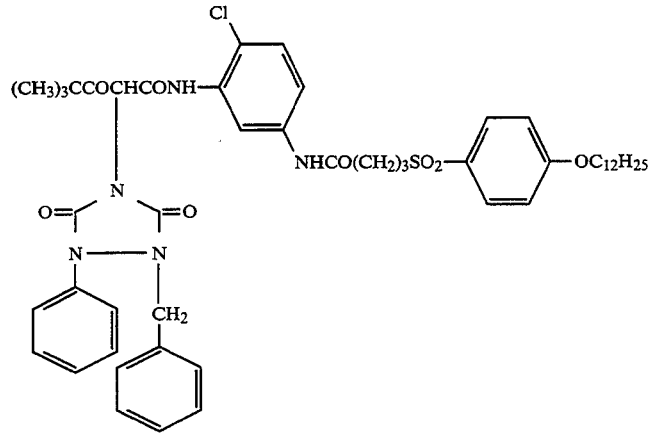
(Y-51)
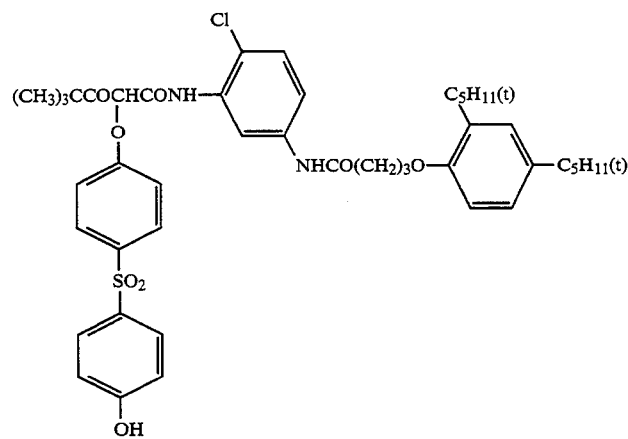
(Y-52)
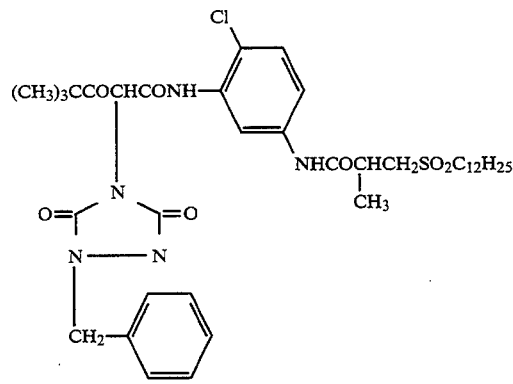
(Y-53)
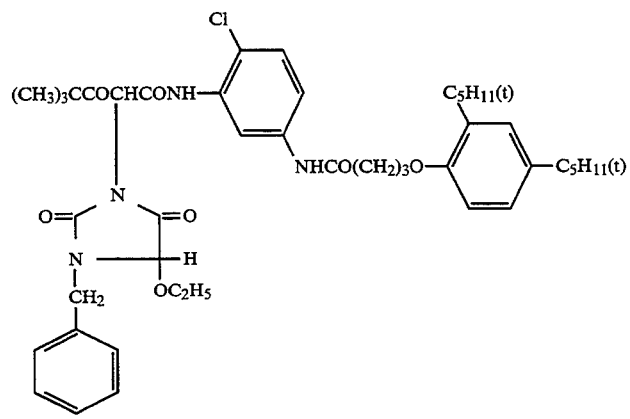

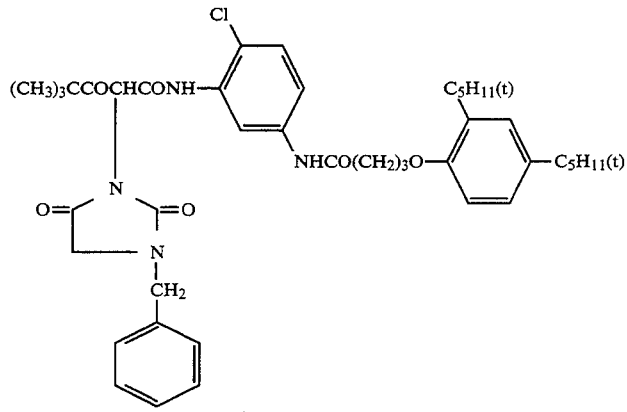
(Y-54)
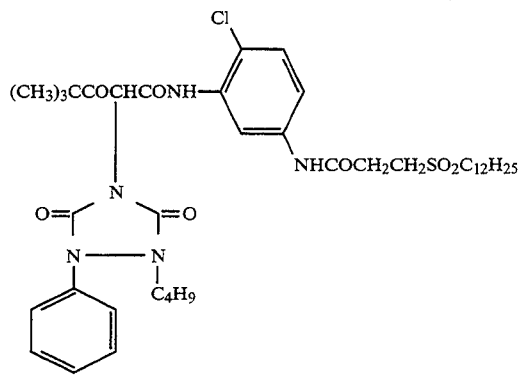
(Y-55)
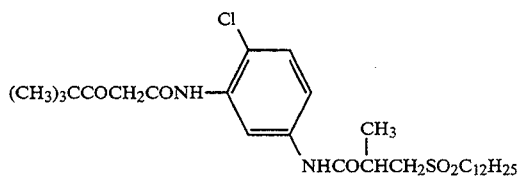
(Y-56)
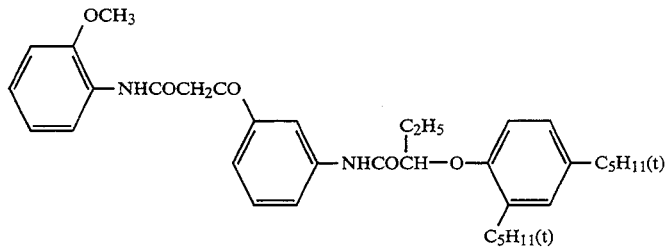
(Y-57)
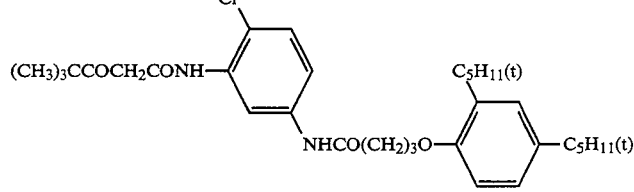
(Y-58)
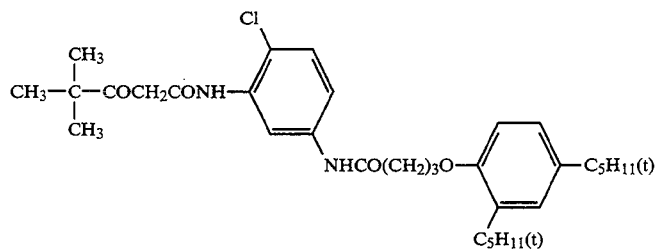
Y-1

-continued

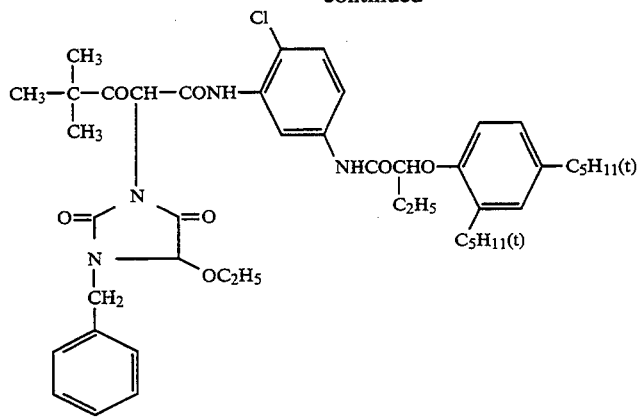
Y-2

In the magenta image forming layer of the silver halide color photographic photosensitive materials of the invention, the proportion of the magenta and yellow coupler contents may be so determined as to make approximate the spectral absorption of a dye image obtained by color developing the magenta image forming layer to the spectral absorption of a printed image obtained by printing it with a magenta printing ink. To be more concrete, the yellow coupler content is suitably to be within the range of 0.02 to 0.5 mols per mol of the magenta couplers used.

In the silver halide color photographic photosensitive materials of the invention, the yellow couplers which are preferably contained in the magenta image forming layer include, for example, those represented by the foregoing Formula [Y-Ia].

In the invention, as for the cyan couplers, which are to be contained in a cyan image forming layer, cyan dye-forming couplers of the phenol or naphthol type may be used.

Among them, the couplers represented by the following Formula [C-I] or [C-II] may preferably be used.

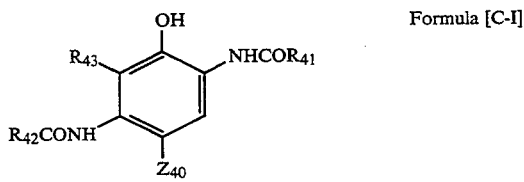
Formula [C-I]

In Formula [C-I], $R_{41}$ represents an aryl, cycloalkyl or heterocyclic group; $R_{42}$ represents an alkyl or phenyl group; and $R_{43}$ represents a hydrogen or halogen atom, or an alkyl or alkoxy group.

$Z_{40}$ represents a hydrogen atom or a group capable of splitting off upon reacting with the oxidized products of an aromatic primary amine type color developing agent.

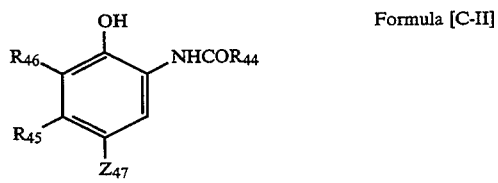
Formula [C-II]

In Formula [C-II], $R_{44}$ represents an alkyl group (such as a group of methyl, ethyl, propyl, butyl or nonyl); $R_{45}$ represents an alkyl group (such as a group of methyl or ethyl); $R_{46}$ represents a hydrogen atom, a halogen atom (such as fluorine, chlorine or bromine) or an alkyl group (such as a group of methyl or ethyl); $Z_{47}$ is synonymous with $Z_{40}$ denoted in Formula [C-I] and represents a hydrogen atom or a group capable of splitting off upon reacting with the oxidized products of an aromatic primary amine type color developing agent.

The above-mentioned cyan couplers are detailed in, for example, U.S. Pat. Nos. 2,306,410, 2,356,475, 2,362,596, 2,367,531, 2,369,929, 2,423,730, 2,474,293, 2,476,008, 2,498,466, 2,545,687, 2,728,660, 2,772,162, 2,895,826, 2,976,146, 3,002,836, 3,419,390, 3,446,622, 3,476,563, 3,737,316, 3,758,308 and 3,839,044; British Patent Nos. 478,991, 945,542, 1,084,480, 1,377,233, 1,388,024 and 1,543,040; and JP OPI Publication Nos. 47-37425/1972, 50-1975, 50-25228/1975, 50-112038/1975, 50-117422/1975, 50-1975, 51-6551/1976, 51-37647/1976, 51-52828/1976, 51-108841/1976, 53-109630/1978, 54-48237/1979, 54-66129/1979, 54-131931/1979, 55-32071/1980, 59-146,050/1984, 59-31,953/1984 and 60-117,249/1985.

In each of silver halide emulsion layers, the couplers applicable to the invention may be used ordinarily in an amount within the range of $1 \times 10^{-3}$ to 1 mol and, preferably, $1 \times 10^{-2}$ to $8 \times 10^{-1}$ mols per mol of silver halide.

The above-mentioned couplers are usually dissolved in a high boiling organic solvent having a boiling point of not less than 150° C. and, if required, a low boiling and/or water-soluble organic solvent in combination, and the resulting solution is emulsified and dispersed, in a hydrophilic binder such as an aqueous gelatin solution, by making use of a surfactant. After that, the resulting dispersed emulsion may be added into an objective hydrophilic colloidal layer. Wherein, it is also allowed to supplement with a step for removing the low boiling organic solvent after completing or at the same time of the dispersion.

In the invention, the proportion of the high boiling organic solvent relating to the invention to the low boiling organic solvent is to be within the range of 1:0.1 to 1:50 and, preferably, 1: 1 to 1: 20.

The high boiling organic solvents relating to the invention may be those of the any types, provided that they are the compound having a permittivity of not higher than 6.0. There is no special limitation to the lower limit, but the permittivity thereof is preferably not less than 1.9. These solvents include, for example, esters such as a phthalate and a phosphate, organic acid amides, ketones and hydrocarbon compounds, each having a permittivity of not higher than 6.0, and, preferably, phthalates or phosphates.

The yellow dye forming couplers preferably applicable thereto include, for example, any well-known acylacetoanilide type couplers. Among them, the benzoyl acetoanilide type and pivaloyl acetoanilide type compounds can advantageously be used.

In the invention, $\lambda_{L0.2}$ of a yellow image is preferable to be 515 nm.

In the invention, '$\lambda L0.2$' is defined as follows. In the following defined spectral absorbance $A(\lambda)$ of a yellow image, an average absorbance value $Am$ from 560 to 650 nm is standardized, $$\left( Am = \frac{\int_{560}^{650} A d\lambda}{650 - 560} \right)$$

and, in the yellow image, when the absorbance $Amax$ thereof is $1.0 \pm 0.05$ higher than $Am$ in wavelength $\lambda max$ corresponding to the maximum absorbance $Amax$ of the above-mentioned spectral absorbance, a wavelength on the longer wavelength side than the above-mentioned $\lambda max$ and corresponding to absorbance $A = 0.8 \times Am + 0.2 \times Amax$ is defined as $\lambda L0.2$. Also, $\lambda L0.2$ means a wavelength showing $A = 0.2 \times Am + 0.8 \times Amax$ in the above-mentioned spectral absorbance.

Amax is a light absorbance in $\lambda max$ of a yellow image and is usually obtained from the range of not less than 400 nm. When the maximum value of a color image is not obtained by other factors such as the presence of a UV absorbent or the like, such an Amax is represented by a light absorbance obtained from a wavelength between 400 to 500 nm in which the absolute value of $dA/d\lambda$ is minimized, that is, a light absorbance obtained in the shoulder portion.

The above-mentioned yellow image is formed by controlling the separation exposure conditions to be maximized so that Amax Am can be minimized when the Amax—Am is $1.0 \pm 0.05$, and then by the development is carried out.

In the invention, the spectral absorption of the above-mentioned yellow image is to be preferably $\lambda L0.8 > 450$ nm and particularly $\lambda L0.8 > 455$ nm. And, $\lambda L0.2$ is to be preferably not more than 510 nm. $\lambda max$ is to be preferably not less than 430 nm.

In this invention, the spectral absorption measurements are carried out through a spectrophotometer Model 320 manufactured by Hitachi, Ltd., to which an integrating sphere is attached.

When a light sensitive material of the invention contains a coupler as the substance for forming a yellow image, any types of couplers can be used therein, provided they can satisfy the above-mentioned requirements. However, the preferable couplers include, for example, the couplers represented by the following Formula [Y-I].

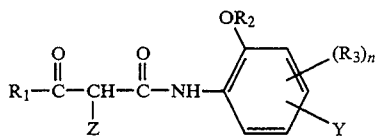

Formula [Y-I]

In the above-given formula, $R_1$ represents an alkyl or cycloalkyl group; $R_2$ represents an alkyl, cycloalkyl, acyl or aryl group; $R_3$ represents a group capable of being substituted to a benzene ring; n is an integer of 0 or 1; Y represents a monovalent ballast group; and Z represents a hydrogen atom or a group capable of splitting off when making a coupling reaction.

The concrete examples of the couplers preferably applicable thereto include, typically, the compounds Y-I-1 through Y-I-55 each given in JP OPI Publication No. 3-241345/1991 and, besides the above, the compounds Y-1 through Y-30 each given in JP OPI Publication No. 3-209466/1991 may also preferably be used.

Structure:

$$R_1COCHCONH\text{—}\text{(phenyl with }OR_2\text{ at 2-position, 3,4,5,6 positions)}$$
$$|$$
$$Z$$

| No. | $R_1$ | $R_2$ | Z | 3-position | 4-position | 5-position | 6-position |
|---|---|---|---|---|---|---|---|
| Y-I-1 | (t)C$_4$H$_9$— | CH$_3$ | (phenyl-CH$_2$-N-imide with C=O groups) | —H | —H | —NHCO(CH$_2$)$_3$O*— (2,4-di-t-C$_5$H$_{11}$-phenyl) | —H |
| Y-I-2 | (t)C$_4$H$_9$— | CH$_3$ | (OC$_2$H$_5$, phenyl-CH$_2$-N-imide) | —H | —H | —CONHCHCOO(CH$_2$)$_2$O—(4-OC$_{12}$H$_{25}$-phenyl), CH$_3$ | —H |
| Y-I-3 | (t)C$_4$H$_9$— | CH$_3$ | (N–C$_4$H$_9$, N-phenyl imide) | —H | —H | —NHCOCHCH$_2$SO$_2$C$_{12}$H$_{25}$, CH$_3$ | —H |
| Y-I-4 | (t)C$_4$H$_9$— | CH$_3$ | (N-CH$_2$-phenyl, N-phenyl imide) | —H | —H | —NHCO(CH$_2$)$_2$COO*— (2,4-di-t-C$_5$H$_{11}$-phenyl) | —H |

-continued
| No. | $R_1$ | $R_2$ | Z | 3-position | 4-position | 5-position | 6-position |
|---|---|---|---|---|---|---|---|
| Y-I-5 | (t)$C_4H_9$— | $CH_3$ | 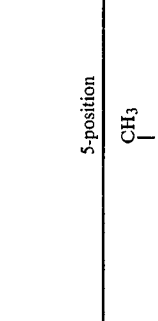 | —H | —H | 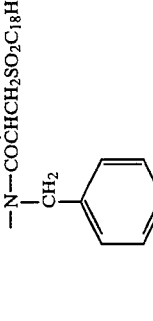 | —H |
| Y-I-6 | (t)$C_4H_9$— | $CH_3$ | 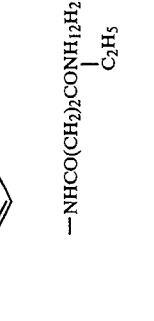 | —H | —H | —NHCO($CH_2$)$_2$CONH$C_{12}H_{25}$<br>$C_2H_5$ | —H |
| Y-I-7 | (t)$C_4H_9$— | —$C_3H_7$(iso) | 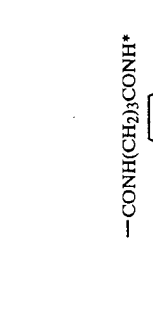 | —H | —H | —CONH(CH$_2$)$_3$CONH* ⟨*⟩—$C_{12}H_{25}$ | —H |
| Y-I-8 | (t)$C_4H_9$— | $CH_3$ | *⟨⟩—OCH$_2$⟨⟩ | —H | —H | —CONH—⟨⟩—NHCOC$_{12}H_{25}$ | —H |

-continued

Structure header:

$$R_1COCHCONH-\text{(benzene ring with positions 3,4,5,6 and OR}_2\text{ at 2-position)}$$
$$|$$
$$Z$$

| No. | R₁ | R₂ | Z | 3-position | 4-position | 5-position | 6-position |
|---|---|---|---|---|---|---|---|
| Y-I-9 | (t)C₄H₉— | —C₁₂H₂₅ | 4-HO-C₆H₄-SO₂-C₆H₄-O— | —H | —H | —CONHCH(CH₃)CH₂SO₂C₂H₅ | —H |
| Y-I-10 | (t)C₄H₉— | —C₁₈H₃₇ | phenyl-CONH-imidazole | —H | —H | —NHCOCH(CH₃)CH₂SO₂C₄H₉ | —H |
| Y-I-11 | (t)C₄H₉— | —CH₃ | hydantoin N-C₆H₁₃, N'-phenyl | —H | —H | —NHCOCH(CH₃)-C₆H₄-*OC₁₂H₂₅ | —H |
| Y-I-12 | (t)C₄H₉— | —C₄H₉ | hydantoin N-CH₂-phenyl | —H | —H | —NHCOCH(C₁₂H₂₅)-C₆H₄-*SO₂NHC₄H₉ | —H |
| Y-I-13 | (t)C₄H₉— | —CH₃ | hydantoin N-CH₂-phenyl, N'-phenyl | —H | —H | —CONH(CH₂)₂NHSO₂C₁₂H₂₅ | —H |

-continued
Structure for all entries:
$R_1COCHCONH$—[phenyl with $OR_2$ at 2-position, 3-position, 4-position, 5-position, 6-position]
with Z on the CH
| No. | R₁ | R₂ | Z | 3-position | 4-position | 5-position | 6-position |
|---|---|---|---|---|---|---|---|
| Y-I-14 | $(t)C_4H_9$— | —$CH_3$ | 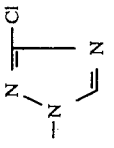 | —H | —H | —CONHCHCH$_2$SO$_2$CH$_2$CHC$_8$H$_{17}$<br>    \|                         \|<br>   CH$_3$            C$_6$H$_{13}$ | —H |
| Y-I-15 | $(t)C_4H_9$— | —$CH_3$ | 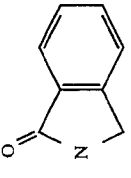 | —H | —H | —SO$_2$NH(CH$_2$)$_3$O* 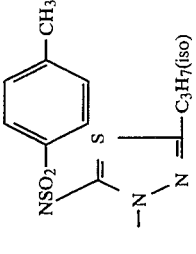 | —H |
| Y-I-16 | $(t)C_4H_9$— | —$CH_3$ | 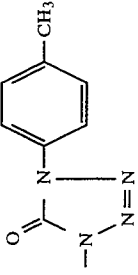 | —H | —H | —NHCOCH(CH$_2$)$_2$NHCO* 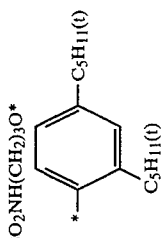 | —H |
| Y-I-17 |  | —$CH_3$ | 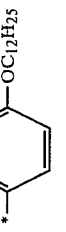 | —H | —H | —NHCO(CH$_2$)$_{10}$COOC$_2$H$_5$ | —H |

-continued

Structure:
$$R_1COCHCONH-\text{[benzene with } OR_2 \text{ at 2-position, Z at amide N]}$$
Positions on benzene: 3-position, 4-position, 5-position, 6-position

| No. | R$_1$ | R$_2$ | Z | 3-position | 4-position | 5-position | 6-position |
|---|---|---|---|---|---|---|---|
| Y-I-18 | (t)C$_4$H$_9$— | —CH$_3$ | 4-(4-methoxyphenylsulfonyl)phenyl (*-C$_6$H$_4$-SO$_2$-C$_6$H$_4$-O—) | —H | —H | —CONH—C$_6$H$_4$—SO$_2$NHC$_{12}$H$_{25}$ | —H |
| Y-I-19 | (t)C$_4$H$_9$— | —CH$_3$ | *—OCH$_2$—C$_6$H$_5$ | —H | —H | 4-OH, 3-C$_4$H$_9$(t), with —NHCOCHO—C$_{12}$H$_{25}$ | —H |
| Y-I-20 | (t)C$_4$H$_9$— | —C$_{12}$H$_{25}$ | 4-(COOC$_2$H$_5$)phenoxy | —H | —H | —NHCH(CH$_2$)$_2$SO$_2$NHCH$_2$CHC$_4$H$_9$ (with C$_2$H$_5$) | —H |
| Y-I-21 | (t)C$_4$H$_9$— | —C$_2$H$_5$ | hydantoin-type (OC$_6$H$_{13}$, N-(4-Cl-phenyl), two C=O, methyl-substituted ring with COOCH$_3$ and NH) | —H | —H | 2-OC$_4$H$_9$, 5-C$_8$H$_{17}$(t) phenyl with —NHCOCH$_2$SO$_2$— and C(CH$_3$)$_2$ | —H |
| Y-I-22 | C$_6$H$_5$—OC(CH$_3$)$_2$— | —C$_4$H$_9$ | 1-(COOC$_6$H$_{13}$)imidazol-2-yl | —H | —H | —NHSO$_2$C$_{16}$H$_{33}$ | —H |

-continued

R₁COCHCONH—[benzene ring with OR₂ at 3-position, and 4-position, 5-position, 6-position labeled]
         |
         Z

| No. | R₁ | R₂ | Z | 3-position | 4-position | 5-position | 6-position |
|---|---|---|---|---|---|---|---|
| Y-I-23 | (t)C₅H₁₁ | —C₂H₅ | H | —H | —H | —NHCOCH(CH₂)NHSO₂—[phenyl]*<br>CH₃<br>*OC₅H₁₀ | —H |
| Y-I-24 | (t)C₄H₉— | —CH₃ | [morpholine-triazole structure] | —H | —H | —NHSO₂(CH₂)₃O*—[phenyl with C₅H₁₁(t) at two positions]* | —H |
| Y-I-25 | (t)C₄H₉— | —C₁₈H₃₇ | [bis(3-chloro-4-hydroxyphenyl)sulfone] | —H | —H | —NHCO(CH₂)₂NHSO₂N—[phenyl]<br>CH₃ | —H |
| Y-I-26 | (t)C₄H₉— | —CH₃ | [dimethyl-hydantoin-like with N—CH₂OH] | —H | —H | —CONH(CH₂)₄NHCO*—[phenyl with OC₁₂H₂₅ and CH₃]* | —H |
| Y-I-27 | (t)C₄H₉— | —CH₃ | [imidazolinone with N—CH₃] | —H | —H | —CONHCHCH₂SO₂NHC₁₂H₂₅<br>     \|<br>     C₆H₁₃ | —H |

-continued

Structure header:
$R_1COCHCONH$—(phenyl with $OR_2$ at 2-position, substituents at 3,4,5,6-positions), with Z attached to the CH group.

| No. | R₁ | R₂ | Z | 3-position | 4-position | 5-position | 6-position |
|---|---|---|---|---|---|---|---|
| Y-I-28 | (t)C₄H₉— | —CH₃ | (N-methyl-N'-(4-methylphenyl)-N''-phenyl hydantoin-like structure) | —H | —H | —COOC₁₂H₂₅ | —H |
| Y-I-29 | CH₃-C(CH₃)(OC₆H₅)— | —C₁₂H₂₅ | (pyrrole with COOC₂H₅ groups) | —H | —H | —NHCO(CH₂)₃*    C₂H₅<br>*NHCONHCH₂CHC₄H₉ | —H |
| Y-I-30 | (t)C₅H₁₁ₐᵦ,₄ | —CH₃ | (pyrrolinone with CH₃, CH₃, NHCOCH₃) | —H | —H | —CONHCHCH₂CONH*<br>    C₆H₁₃<br>*—(4-OC₄H₉-phenyl) | —H |
| Y-I-31 | (t)C₄H₉— | —CH₃ | (benzisothiazolone) | —H | —H | —COOC₁₇H₃₅ | —H |
| Y-I-32 | (t)C₄H₉— | —CH₃ | (triazolinone with N—C₆H₁₃) | —H | —H | —NHCO(CH₂)₃NHCOCH₂CHC₆H₁₃<br>    C₈H₁₇ | —H |

-continued

R₁COCHCONH—[benzene ring with OR₂ at 3-position; 3,4,5,6-positions labeled]—Z

| No. | R₁ | R₂ | Z | 3-position | 4-position | 5-position | 6-position |
|---|---|---|---|---|---|---|---|
| Y-I-33 | (t)C₄H₉— | —CH₃ | benzimidazole (N-linked) | —H | —Cl | —NHCOCH₂NHCON(CH₃)(C₂H₅) / C₁₂H₂₅ | —H |
| Y-I-34 | (t)C₄H₉— | *—C₆H₄—*COOC₂H₅ (para) | 5,6-diphenyl-1,2,4-triazin-3(2H)-one (N-linked) | —H | —H | —CONHCH(C₂H₅)CHSO—C₆H₄—C₁₈H₃₇ | —H |
| Y-I-35 | (t)C₄H₉— | —C₄H₉ | 4-chloro-1H-pyridin-2-one (N-linked) | —H | —NHCOCHSO₂NHC₁₂H₂₅ / C₁₆H₃₃ | —Cl | —H |
| Y-I-36 | (t)C₄H₉— | —CH₃ | 4-hydroxyphenyl-SO₂-phenyl-O— | —H | —Cl | —NHCO(CH₂)₂NHCO—*—C₆H₄—C₁₂H₂₅ | —H |
| Y-I-37 | (t)C₄H₉— | —C₆H₅ | 1-phenyl-4-butoxy-3-methyl-1,2,4-triazoline-3,5-dione | —H | —H | —CONHCH(CH₂—)(CH₂—)—*—C₆H₄—*OC₁₂H₂₅ | —H |

-continued

Structural header:

$R_1COCHCONH$— (phenyl with $OR_2$ at 2-position, and 3-position, 4-position, 5-position, 6-position substituents)
|
Z

| No. | R₁ | R₂ | Z | 3-position | 4-position | 5-position | 6-position |
|---|---|---|---|---|---|---|---|
| Y-I-38 | (t)C₅H₁₁— | —COCH₃ | N(CH(C₂H₅)CH₃)-phenyl imide ring | —H | —OCH₃ | —NHCOCH(CH₂)₂NHSO₂—(2-OC₁₂H₂₅-4-CH₃-phenyl)* | —H |
| Y-I-39 | (t)C₄H₉— | —COC₂H₅ | N(CH₂COOC₂H₅)-phenyl imide ring | —H | —H | —COOCH(CH₃)COOC₁₂H₂₅ | —H |
| Y-I-40 | (t)C₄H₉— | —CH₃ | N(OC₂H₅)-phenyl imide ring with CH₂-phenyl | —H | —H | —CONHC(CH₃)(CH₃)(CH₂)₂COO—(4-CH₃-phenyl)* | —H |
| Y-I-41 | (t)C₄H₉— | —CH₃ | 3-phenyl-isoxazol-5(4H)-one-N-yl | —H | —CONH(CH₂)₄NHSO₂CH(CH₃)C₄H₉ | —OCH₃ | —H |

-continued

| No. | $R_1$ | $R_2$ | Z | 3-position | 4-position | 5-position | 6-position |
|---|---|---|---|---|---|---|---|
| Y-I-42 | (t)$C_4H_9$— | —$CH_3$ | | —H | —H | | —H |
| Y-I-43 | | —$CH_3$ | | —H | —H | | —H |
| Y-I-44 | | —$C_2H_5$ | | —H | —H | | —H |
| Y-I-45 | (t)$C_4H_9$— | | | —H | —H | | —H |

-continued

Structure: R₁COCHCONH— (attached to benzene ring with OR₂ at 2-position; 3-position, 4-position, 5-position, 6-position shown)
           |
           Z

| No. | R₁ | R₂ | Z | 3-position | 4-position | 5-position | 6-position |
|---|---|---|---|---|---|---|---|
| Y-I-46 | phenyl* with *—O—CH₂C(CH₃)₂—CH₃ substituent | —CH₃ | hydantoin ring: N—C₆H₁₃ / N—phenyl (imidazolidine-2,4-dione) | —H | —H | —CONHCHCOOC₁₂H₂₅ with C₂H₅ | —H |
| Y-I-47 | (iso)C₃H₇— | —C₄H₉ | 3-CH₃-4-methoxyphenyl-SO₂—* | —H | —H | —NHCOCHNHCOCH₂* with CH₃; 2,4-di(C₅H₁₁(t))phenyl* | —H |
| Y-I-48 | adamantyl | —CH₃ | 1-substituted-3,4-dimethyl-6-oxo-pyridinyl with OH-phenyl* | —H | —H | —NHCO(CH₂)₁₀COOC₂H₅ | —H |
| Y-I-49 | cyclohexyl | —CH₃ | pyrrole with COOCH₃, COOCH₃ | —H | —H | —CONH(CH₂)₄NHSO₂*; 2-OC₄H₉(t)-4-C₈H₁₇(t)phenyl* | —H |

-continued

General structure: $R_1COCHCONH$-(phenyl with $OR_2$ at 2-position, substituents at 3,4,5,6-positions), with Z attached to the CH.

| No. | $R_1$ | $R_2$ | Z | 3-position | 4-position | 5-position | 6-position |
|---|---|---|---|---|---|---|---|
| Y-I-50 | $(t)C_4H_9-$ | $-CH_3$ | 3-methoxypyridin-? yl | $-H$ | $-H$ | $-NHCO(CH_2)_2NHCONHCH_2O^*$ (where * = 2,4-di-$C_5H_{11}(t)$-phenyl) | $-H$ |
| Y-I-51 | $(t)C_4H_9-$ | $-C_{16}H_{33}$ | 1-(phenylcarbamoyl)pyrazol-? yl | $-H$ | $-H$ | $-SO_2NHCOC_2H_5$ | $-H$ |
| Y-I-52 | $(t)C_4H_9-$ | $-CCH_3$ | 3-($N$-$C_4H_9$)-hydantoinyl | $-H$ | $-H$ | $-NHCOCHCH_2SO_2C_{12}H_{25}$ with $-CH_3$ | $-H$ |
| Y-I-53 | $(t)C_4H_9-$ | $-OCH_3$ | 5-methyl-3-($N$-$C_4H_9$)-hydantoinyl | $-H$ | $-H$ | $-NHCOCHCH_2SO_2C_{12}H_{25}$ with $-CH_3$ | $-H$ |

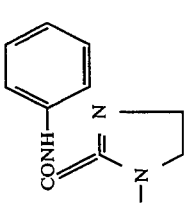

$$R_1-CO-CH(X)-CONH-\text{C}_6H_3(R_2)(R_3)_l$$

| No. | R$_1$ | R$_2$ | (R$_3$)$_l$ | X |
|---|---|---|---|---|
| Y-1 | t-C$_4$H$_9$— | —OCH$_3$ | (32) [5] | (4) |
| Y-2 | t-C$_4$H$_9$— | —OCH$_3$ | (32) [5] | (5) |
| Y-3 | t-C$_4$H$_9$— | —CH$_3$ | (31) [5] | (2) |
| Y-4 | t-C$_4$H$_9$— | —O—C$_6$H$_4$—OCH$_3$ | (32) [5] | (5) |
| Y-5 | t-C$_4$H$_9$— | —N(CH$_3$)$_2$ | (32) [5] | (4) |
| Y-6 | t-C$_4$H$_9$— | —OCH$_3$ | (33) [5] | (8) |
| Y-7 | t-C$_4$H$_9$— | —OC$_2$H$_5$ | (33) [5] | (7) |
| Y-8 | t-C$_4$H$_9$— | —OCH$_3$ | (38) [5] | (23) |
| Y-9 | t-C$_4$H$_9$— | —O—C$_6$H$_5$ | (40) [5] | (19) |
| Y-10 | t-C$_4$H$_9$— | —OC$_8$H$_{17}$-n | (45) [4] | (5) |
| Y-11 | t-C$_4$H$_9$— | —OC$_8$H$_{17}$-n | (45) [5] | (5) |
| Y-12 | t-C$_4$H$_9$— | —OCH$_3$ | (42) [5] | (4) |
| Y-13 | t-C$_4$H$_9$— | —O—C$_6$H$_4$—OCH$_3$ | (30) [5] | (10) |
| Y-14 | t-C$_4$H$_9$— | —OC$_{16}$H$_{33}$-n | — | (15) |
| Y-15 | t-C$_4$H$_9$— | —OCH$_2$CH$_2$OCH$_3$ | (34) [5] | (8) |
| Y-16 | t-C$_4$H$_9$— | —CH$_3$ | (43) [5] | (9) |
| Y-17 | t-C$_4$H$_9$— | —C$_2$H$_5$ | (47) [5] | (8) |
| Y-18 | t-C$_4$H$_9$— | —OCH$_3$ | (46) [5] | (2) |
| Y-19 | t-C$_4$H$_9$— | —OC$_8$H$_{17}$-n | (45) [4] | (5) |
| Y-20 | t-C$_4$H$_9$— | —OCH$_3$ | (33) [5] | (19) |
| Y-21 | t-C$_4$H$_9$— | —N(CH$_3$)$_2$ | (36) [4] | (18) |
| Y-22 | t-C$_4$H$_9$— | —O—C$_6$H$_4$—OCH$_3$ | (41) [5] | (11) |
| Y-23 | t-C$_4$H$_9$— | —O—C$_6$H$_4$—CH$_3$ | (37) [5] | (3) |
| Y-24 | t-C$_4$H$_9$— | —OC$_2$H$_5$ | (37) [5] | (1) |
| Y-25 | t-C$_4$H$_9$— | —CH$_3$ | (38) [5] | (2) |
| Y-26 | t-C$_4$H$_9$— | —C$_2$H$_5$ | (38) [5] | (2) |
| Y-27 | t-C$_4$H$_9$— | —CH$_3$ | (33) [5] | (2) |
| Y-28 | CH$_3$O—C$_6$H$_4$— | —OCH$_3$ | (42) [5] | (4) |
| Y-29 | CH$_3$O—C$_6$H$_4$— | —N(CH$_3$)$_2$ | (40) [5] | (4) |
| Y-30 | (2-OCH$_3$)C$_6$H$_4$— | —CH$_3$ | (43) [5] | (2) |

In silver halide emulsion layers, the above-mentioned yellow coupler is usually contained in an amount within the range of $1 \times 10^{-3}$ to 1 mol and preferably $1 \times 10^{-2}$ to $8 \times 10^{-1}$ mols per silver halide used.

The cyan dye-forming couplers applicable thereto include, for example, those well-known as the phenol type, naphthol type of the imidazole type and, to be more concrete, they include, typically, a phenol type coupler substituted with an alkyl, acylamino or ureido group, a naphthol type coupler produced of a 5-aminonaphthol skeleton, and a 2-equivalent naphthol type coupler introduced thereinto with an oxygen atom as a split-off group.

In the photosensitive materials of the invention, any high boiling organic solvents can be used with couplers in combination. However, the preferably applicable organic solvents include, for example, those represented by the following Formula [HBS-I] or [HBS-II].

$$\begin{array}{c} R_{54}-O \\ R_{55}-O-P=O \\ R_{56}-O \end{array} \quad \text{Formula [HBS-I]}$$

In Formula [HBS-I], R$_{54}$, R$_{55}$ and R$_{56}$ represent each an alkyl or aryl group, provided that at least two of R$_{54}$, R$_{55}$ and R$_{56}$ represent each an alkyl group having not more than 16 carbon atoms.

$$R_{57}-(O)_p-\underset{\underset{(O)_r-R_{59}}{|}}{\overset{\overset{O}{\|}}{P}}-(O)_q-R_{58} \quad \text{Formula [HBS-II]}$$

In Formula [HBS-II], R$_{57}$, R$_{58}$ and R$_{59}$ represent each an aliphatic or aromatic group; and p, q and r represent each an integer of 0 or 1, provided that p, q and r shall not represent each an integer of 1 at the same time.

The typical examples of the compounds represented by Formula [HBS-I] or [HBS-II] include the compounds I-1 through II-95 given in JP OPI Publication No. 2-124568/1990. However, it is the matter of course that the invention shall not be limited thereto.

| | |
|---|---|
| I-1 | dibutyl-(2-ethylhexyl) phosphate |
| I-2 | tri(2-ethylhexyl)phosphate |
| I-3 | trihexyl phosphate |
| I-4 | tributyl phosphate |
| I-5 | trioctyl phosphate |
| I-6 | di(2-ethylhexyl)-butyl phosphate |

-continued

I-7 tridodecyl phosphate
I-8 tridecyl phosphate
I-9 tri(2-ethylhexyl) phosphate
I-10 diethyl-hexadecyl phosphate
I-11 triamyl phosphate
I-12 dihexyl o-cresyl phosphate
I-14 diethyl-(2,4-di-t-butylphenyl) phosphate
I-15 triethoxylbutyl phosphate
I-16 tributoxyethyl phosphate
I-17 dihexyl-phenyl phosphate
I-18 dihexyl-(4-t-butyl phenyl) phosphate
I-19 dihexyl-(4-nonylphenyl) phosphate

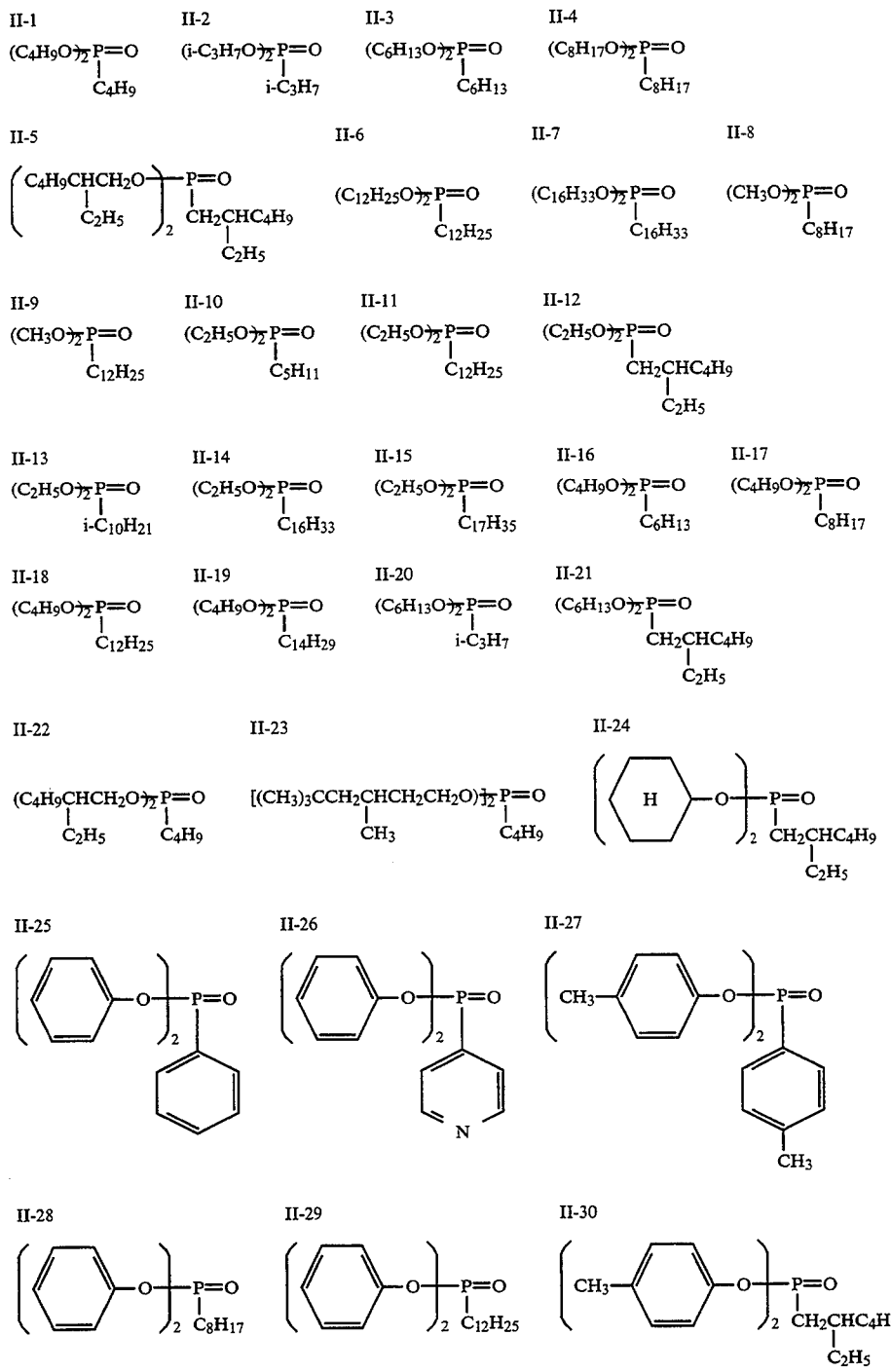

II-31    II-32    II-33    II-34

-continued

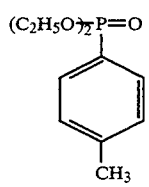 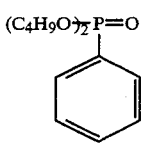 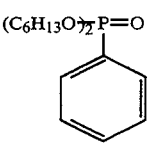 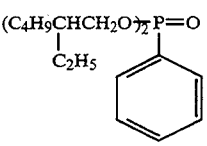

II-35     II-36     II-37

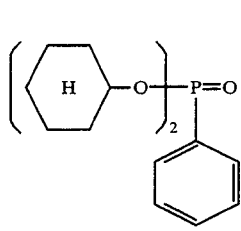

(C₂H₅O)₂P=O .
       |
    CH₂CH₂CH₂OC₁₂H₂₅

II-38     II-39

(C₄H₉O)₂P=O
     |
   CH₂CH₂COCH₂CH₂CH₃

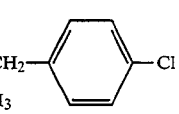

II-40     II-41     II-42

(C₄H₉O)(C₂H₅O)P=O
        |
      C₁₂H₂₅

(C₄H₉O)₂P=O
    |
  (CH₂)₁₀COOC₂H₅

(C₂H₅O)₂P=O
    |
  CH₂CH₂COOC₁₄H₂₉

II-43     II-44     II-45

(C₆H₁₃O)₂P=O
    |
  CH₂CH₂OCOC₈H₁₇

(C₄H₉O)₂P=O
    |
  (CH₂)₁₀COOCH₂CHC₄H₉
               |
              C₂H₅

(C₄H₉O)₂P=O
    |
  CH(CH₂)₁₁CH₃
   |
 COOCH₂CHC₄H₉
        |
       C₂H₅

II-46     II-47

(C₂H₅O)₂P=O        C₂H₅
    |            /
  (CH₂)₁₀CON
             \
               C₂H₅

(C₄H₉O)₂P=O
    |
  CH₂CH₂CON(CH₂CHC₄H₉)₂
                    |
                  C₂H₅

II-48                II-49

(CH₃—⟨C₆H₄⟩—O)₂P=O
             |
           CH₂CH₂CH₂COOC₁₀H₂₁

(C₄H₉CHCH₂O)₂P=O        C₂H₅
     |              |       /
   C₂H₅         (CH₂)₁₀CON
                            \
                             C₂H₅

II-50     II-51

(i-C₄H₉O)₂P=O
    |
  (CH₂)₈COO—⟨Ph⟩

(C₄H₉O)₂P=O        C₄H₉
    |              /
  CH₂CH₂SO₂N
             \
               C₄H₉

II-52

(⟨Ph⟩—O)₂P=O
      |
   (CH₂)₁₀COO—⟨C₆H₄⟩—NHCOCH₃

II-53     II-54     II-55

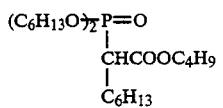 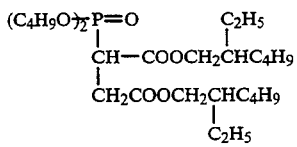 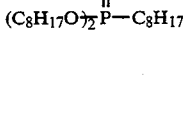

II-56  II-57  II-58

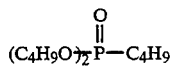 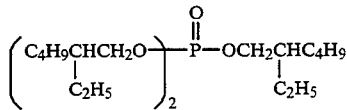 (C$_4$H$_9$O)$_2$P—C$_{12}$H$_{25}$ (with =O)

II-59  II-60  II-61

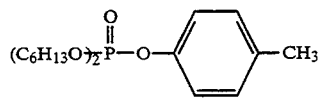

II-62

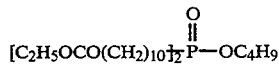

II-63

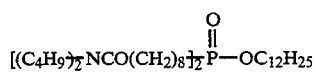 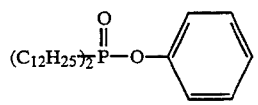

II-64  II-65

[C$_2$H$_5$OCO(CH$_2$)$_{10}$]$_2$P—OC$_4$H$_9$ (with =O)

II-66

[(C$_4$H$_9$)$_2$NCO(CH$_2$)$_8$]$_2$P—OC$_{12}$H$_{25}$ (with =O)   (C$_{12}$H$_{25}$)$_2$P—O—C$_6$H$_5$ (with =O)

II-67

| II-68 | II-69 | II-70 | II-71 |
|---|---|---|---|
| (C$_2$H$_5$)$_3$P=O | (C$_4$H$_9$)$_3$P=O | (i-C$_4$H$_9$)$_3$P=O | (C$_5$H$_{11}$)$_3$P=O |

| II-72 | II-73 | II-74 | II-75 |
|---|---|---|---|
| (C$_6$H$_{13}$)$_3$P=O | (C$_8$H$_{17}$)$_3$P=O | (C$_4$H$_9$CHCH$_2$)$_3$P=O with C$_2$H$_5$ branch | [(CH$_3$)$_3$CCH$_2$CHCH$_2$CH$_2$]$_3$P=O with CH$_3$ branch |

| II-76 | II-77 | II-78 | II-79 |
|---|---|---|---|
| (C$_{10}$H$_{21}$)$_3$P=O | (i-C$_{10}$H$_{21}$)$_3$P=O | (C$_{12}$H$_{25}$)$_3$P=O | (C$_{14}$H$_{29}$)$_3$P=O |

| II-80 | II-81 | II-82 | |
|---|---|---|---|
| (C$_{17}$H$_{33}$)$_3$P=O | 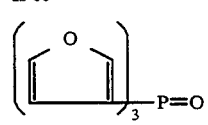 | 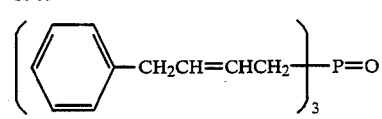 | 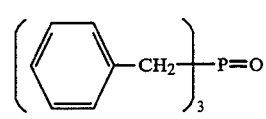 |

II-83  II-84

[C$_4$H$_9$OCO(CH$_2$)$_{10}$]$_3$P=O   [(C$_2$H$_5$)$_2$NCO(CH$_2$)$_{10}$]$_3$P=O

II-85

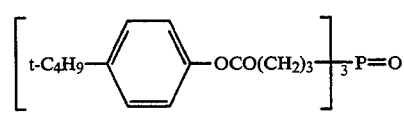

II-86  II-87

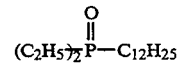 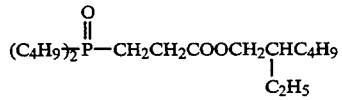

II-88  II-89

-continued

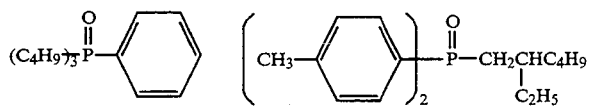

II-90                II-91

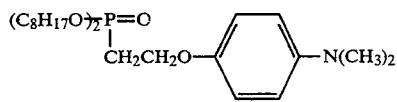

II-92                II-93

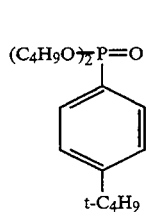

II-94                II-95

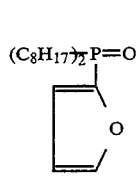

In the magenta image forming layer of the color photographic photosensitive materials of the invention, it is preferable to use a yellow coupler and a magenta coupler in combination so as to make the color tone approximate to that of the corresponding printing ink.

The so-called oil-soluble dye preferably applicable to the invention means herein an organic dye that has a water-solubility [g/100 g of water] at 20° C. (that is the weight of a material soluble to 100 g of water) of not higher than $1 \times 10^{-2}$. The typical compounds thereof include, for example, anthraquinone type compounds and azo type compounds.

In the oil-soluble dyes relating to the invention and when the maximum absorption wavelength thereof is not shorter than 400 nm, the molar absorptivity coefficient is, preferably, not less than 5000 and, particularly, not less than 20000 (in the case of making use of a chloroform solvent).

The oil-soluble dye preferably applicable to the photosensitive materials of the invention is used in an amount within the range of, preferably, 0.01 to 10 mg/m² and, particularly, 0.05 to 5 mg/m².

The oil-soluble dyes applicable to the invention may be used in any photographic emulsion layers. However, the dyes are preferable to be added in a non-photosensitive layer other than coupler-containing layers.

The particularly preferable method for making use of the oil-soluble dyes of the invention is to contain an oil-soluble dye in an amount within the range of 0.05 to 5 mg/m² into a non-photosensitive layer other than coupler-containing layers, provided that the molecular absorptivity coefficient of the dye is not less than 20000 when the maximum absorption wavelength thereof is not shorter than 400 nm.

The oil-soluble dyes preferably applicable to the invention include, for example, Compounds 1 through 27 given in JP OPI Publication No. 2-842, pp.(8)~(9), and Compounds 1 through 27 given in JP Application No. 4-226014/1992, paragraphs 0116~0119. However, the invention shall not be limited thereto.

It is preferable to contain a fluorescent whitening agent in the photosensitive materials of the invention and/or the processing solutions for processing the photosensitive materials thereof.

The fluorescent whitening agents preferably applicable thereto include, for example, those of the stilbene type, triazine type, imidazolone type, pyrazoline type, triazole type, coumarin type, acetylene type, oxazole type or oxadiazole type. These fluorescent whitening agents are described in, for example, U.S. Pat. Nos. 2,571,706, 2,581,057, 2,618,636, 2,702,296, 2,702,296, 2,713,054, 2,715,630, 2,723,197, 3,269,840, 3,513,102, 3,615,544, 3,615,547, 3,684,729, 3,788,854 and 3,789,012; British Patent Nos. 669,590, 672,803 and 712,764; Dutch Patent No. 74,109; German Patent no. 911,368; German (OLS) Patent No. 2,525,680; and JP Examined Publication No. 34-7127/1959. These compounds may be of the water-soluble, and they may also be used in the form of a dispersed matter.

A series of development processes can be performed continuously with a developer, a bleach-fixer and a stabilizer each for processing the silver halide photographic photosensitive materials of the invention, while replenishing a developer replenisher, a bleacher replenisher, a fixer replenisher, a bleach-fixer replenisher, a stabilizer replenisher and so forth thereto. In the invention, the effects of the invention can be more effectively displayed when the amount of the developer replenisher used therein is not more than 700 cc and preferably not more than 500 cc, per sq. meter of a photosensitive material to be processed. It is also similar to the case of the developer when making use of the other processing solutions than the developer. that is, the effects of the invention can be more effectively displayed when the amounts of the replenishers used therein are each not more than 700 cc and preferably not more than 500 cc, per sq. meter of a photosensitive material to be processed.

In the invention, there uses a liquid type UV absorbent that is in the form of a liquid at an ordinary temperature. The expression, "those in the form of a liquid at an ordinary temperature", stated herein means, as defined in 'An Encyclopaedia of Chemistry' (1963), Kyoritsu Publishing Co., those having an amorphous form, a fluidity and an almost fixed volume. There is, accordingly, no special limitation to the melting points thereof, provided that the above-mentioned characteristics can be satisfied. However, it is preferable when the subject compound has a melting point of not higher than 30° C. and, particularly, not higher than 15° C.

The liquid type UV absorbents of the invention may take any structures, provided, the above-mentioned requirements can be satisfied. However, from the viewpoint of the light fastness of a UV absorbent in itself, 2-(2-hydroxyphenyl) benzotriazole type compounds are preferably used. The UV absorbents preferably applicable to the invention include, for example, Compounds UV-1L through UV-27L given in JP Application No. 4-107780, Paragraphs 0027~0028. There is, however, no special limitation thereto.

The above-mentioned UV absorbents relating to the invention may be added in any amount. However, they may be added in an amount by weight within the range of 0.1 to 300%, preferably 1 to 200% and, particularly 5 to 100% to the binder of a photographic component layer subject to contain the absorbent. It is also preferable to coat the absorbent in an amount within the range of, preferably 0.01 to 100 mg/100cm$^2$, further 0.1 to 50 mg/100cm$^2$ and, particularly 0.5 to 30 mg/100cm$^2$.

The layers for containing the liquid type UV absorbents of the invention may be any one of the photographic component layers of the invention. However, it is preferable that; the photographic component layer arranged to a position farther than the photosensitive silver halide emulsion layer farthest from the support of a photosensitive material; such photographic component layer arranged thereto is to contain at least 60% by weight and preferably at least 80% by weight of the whole UV absorbent contained in the photosensitive material.

In the invention, at least one of non-photosensitive layers contains a compound represented by the following Formula [H-I].

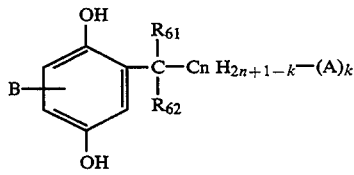

Formula [H-I]

In Formula [H-I], $R_{61}$ and $R_{62}$ represent each an alkyl group having 1 to 5 carbon atoms, such as a group of methyl, ethyl, propyl, i-propyl, butyl, sec-butyl, pentyl and neo-pentyl; n is an integer of 1 to 20 and preferably 2 to 15; k is an integer of 1 or 2; A represents —CO—XR$_{63}$ (wherein X represents —O— or —N(R$_{64}$)—; R$_{63}$ represents a hydrogen atom or a group of alkyl, alkenyl, cycloalkyl or aryl; and R$_{64}$ represents a hydrogen atom or a group of alkyl or aryl), —OY (wherein Y represents R$_{63}$ or —CO—R$_{63}$ in which R$_{63}$ is synonymous with the above-denoted R$_{63}$), —N(R$_{64}$)R$_{65}$ (wherein R$_{64}$ is synonymous with the above-denoted R$_{64}$, R$_{65}$ represents a hydrogen atom of a group of alkyl, aryl or —CO—R$_{63}$ in which R$_{63}$ is synonymous with the above-denoted R$_{63}$), —PO—(OR$_{63}$)—{(O)$_l$R$_{66}$} (wherein l is an integer of 0 or 1, R$_{63}$ is synonymous with the above-denoted R$_{63}$, and R$_{66}$ represents a hydrogen atom or a group of alkyl, cycloalkyl, alkenyl or aryl), or a cyano group; and B represents a group of alkyl, alkenyl, cycloalkyl, aryl, heterocyclic or the following group,

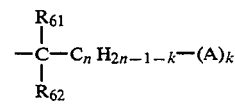

(wherein $R_{61}$, $R_{62}$, n, k and A are each synonymous with the same denoted above.); provided that the alkyl, alkenyl, cycloalkyl and aryl groups each represented by R$_{63}$, the alkyl and aryl groups each represented by R$_{64}$, the alkyl and aryl groups each represented by R$_{65}$, the alkyl, cycloalkyl, alkenyl and aryl groups each represented by R$_{66}$, the alkyl, alkenyl, cycloalkyl, aryl and heterocyclic groups each represented by B; such groups include those having substituents, respectively. The substituents to the above-given alkyl groups include, for example, a halogen atom and a group of cycloalkyl, alkenyl, aryl, alkoxy, aryloxy, acyl, heterocyclic or cyano. The substituents to the above-given alkenyl, cycloalkyl, aryl and heterocyclic groups include, for example, a halogen atom and a group of alkyl, cycloalkyl, alkenyl, aryl, alkoxy, aryloxy, acyl, heterocyclic or cyano.

The alkyl groups represented by R$_{63}$, R$_{64}$, R$_{65}$, R$_{66}$ and B include, for example, a group of methyl, ethyl, propyl, butyl, sec-butyl, hexyl, 2-ethyl-hexyl, dodecyl, hexadecyl and benzyl. The alkenyl groups represented by R$_{63}$, R$_{66}$ and B include, for example, an aryl group. The cycloalkyl groups represented by R$_{63}$, R$_{66}$ and B include, for example, a cycloalkyl group. The aryl groups represented by R$_{63}$, R$_{64}$, R$_{65}$, R$_{66}$ and B include, for example, a group of phenyl or naphthyl.

The compounds represented by the foregoing Formula [H-I]include, preferably, the compounds represented by the following Formula [H-I-1] or the precursors thereof.

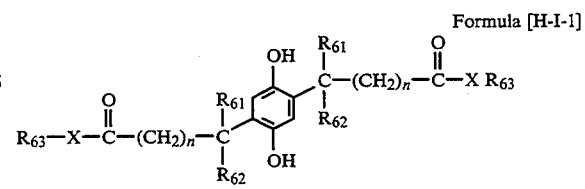

Formula [H-I-1]

wherein $R_{61}$, $R_{62}$, $R_{63}$, X and n are synonymous with $R_{61}$, $R_{62}$, $R_{63}$, X and n each denoted in the foregoing Formula [H-I], respectively.

Now, the typical examples of the compounds represented by Formula [H-I], which are applicable to the invention, will be given below. It is, however, to be understood that the invention shall not be limited thereto.

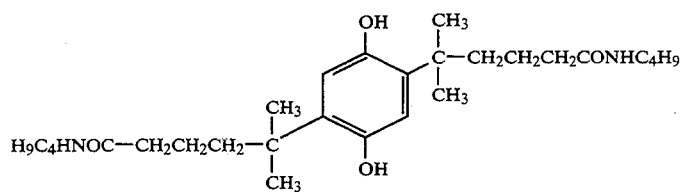 H(1)
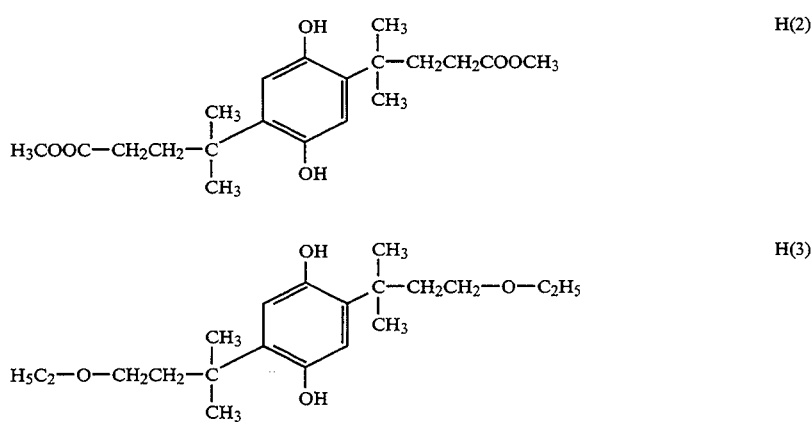 H(2)
H(3)
H(4)
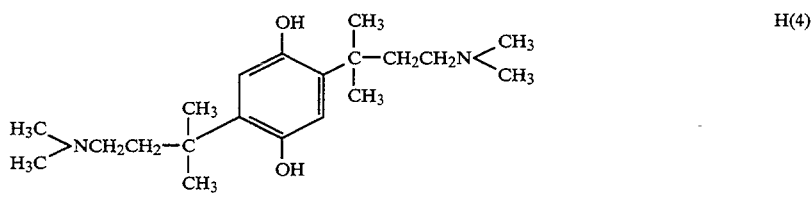 H(5)
H(6)
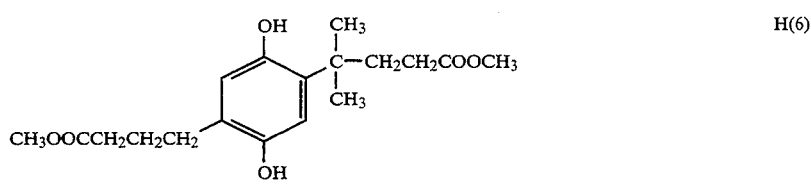 H(7)
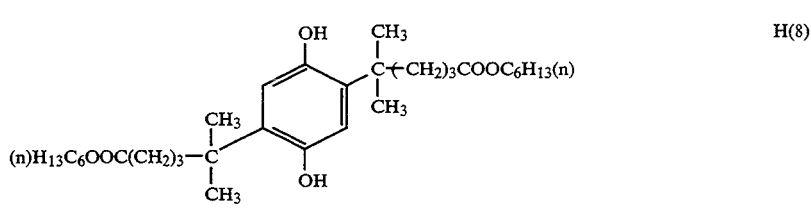 H(8)

-continued
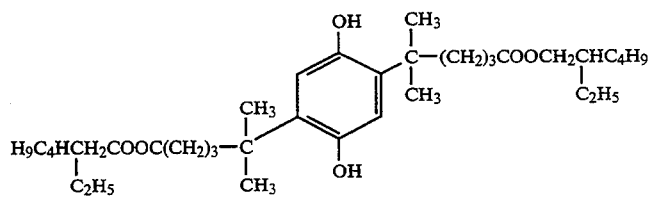 H(9)
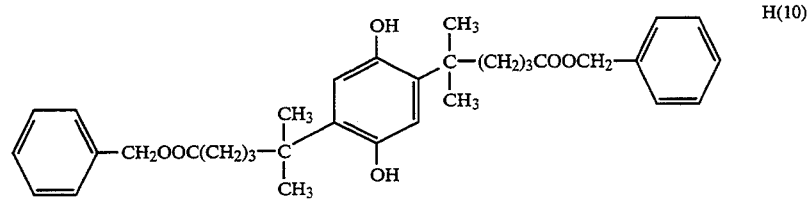 H(10)
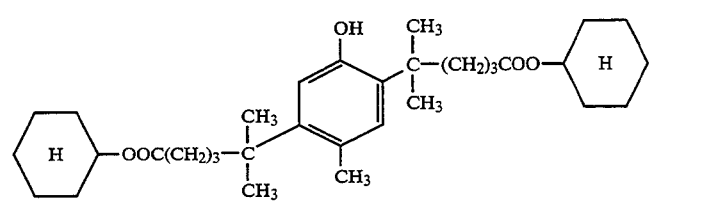 H(11)
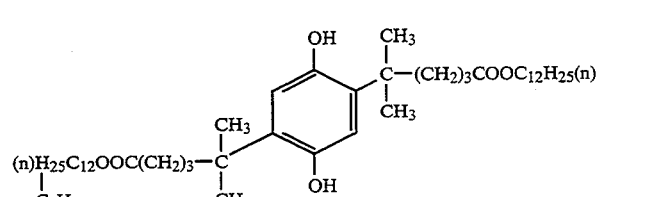 H(12)
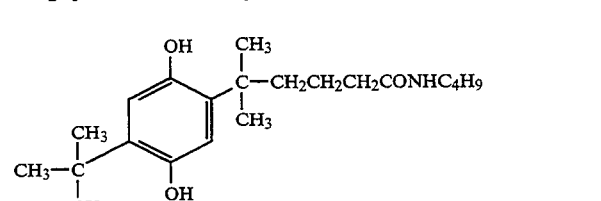 H(13)
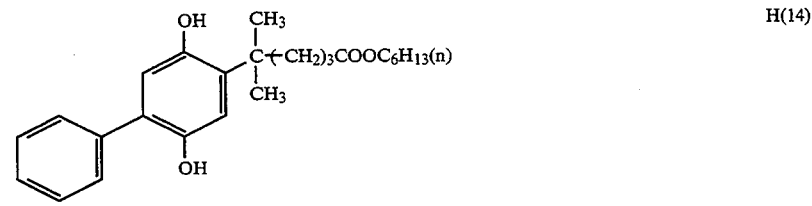 H(14)
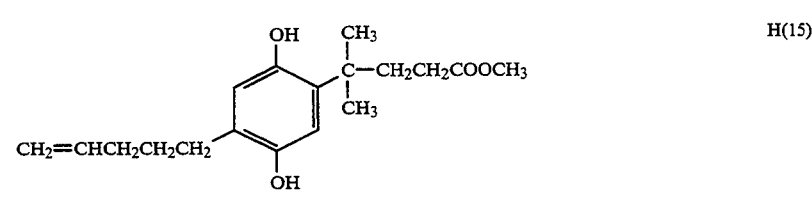 H(15)
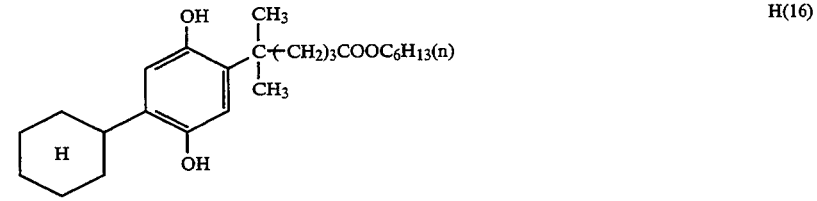 H(16)

-continued

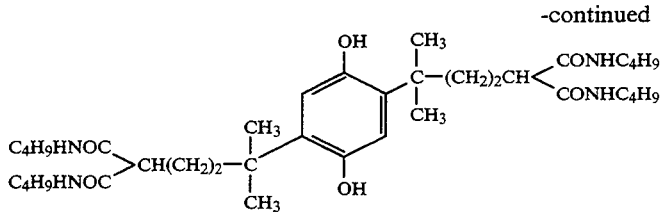

H(17)

The compounds represented by the above-given Formula [H-I] (hereinafter referred to as the compounds represented by Formula [H-I] relating to the invention) basically include the compounds given in JP OPI Publication No. 58-24141/1983, and the process for synthesizing them can be referred to the same JP OPI Publication.

The compounds represented by Formula [H-I] relating to the invention can be contained in at least one layer selected from the group consisting of non-photosensitive layers (such as an intermediate layer, a protective layer, a sublayer and a filter layer) of a silver halide photographic photosensitive material. There is no special limitation to the amounts of the compounds to be added in such a layer as mentioned above. However, they may be added in an amount preferably within the range of $1 \times 10^{-6}$ to $1 \times 10^{-2}$ mols/m$^2$.

The compounds represented by Formula [H-I] relating to the invention can be used independently or in combination.

The supports applicable to the light sensitive materials of the invention include, for example, those given in the foregoing RD17643, p.28 and RD18716, p.647. The suitable supports are made of a polymer film, a sheet of paper, or the like. They may also be treated to enhance the adhesive property, antistatic property and so forth.

EXAMPLES

The invention will be detailed with reference to the following examples. However, the invention shall not be limited thereto.

Example 1

Preparation of Emulsion EM-1

A cubic silver chlorobromide core emulsion having a grain size of 30 μm was prepared, in a controlled double-jet precipitation method, by adding at the same time an aqueous solution containing ammonia and silver nitrate and an aqueous solution containing potassium bromide and sodium chloride (in a mol ratio of KBr:NaCl=95:5), while controlling an aqueous ossein gelatin containing solution to be kept at 40° C. At that time, the pH and pAg thereof were so controlled as to form the cubes as the grain configuration thereof. To the resulting core emulsion, another aqueous solution containing ammonia and silver nitrate, and another aqueous solution containing potassium bromide and sodium chloride (in a mol ratio of KBr:NaCl=40:60) were further added at the same time, in a controlled double-jet precipitation method, so that the shells were grown up to have an average grain size of 0.42 μm. At that time, the pH and pAg thereof were so controlled as to form the cubes as the grain configuration thereof.

After completing a washing treatment to remove the resulting water-soluble salts, gelatin was then added, so that Emulsion EM-1 could be prepared. The resulting emulsion EM-1 was proved to have a distribution range of 8%.

Preparation of Emulsion EM-2

A cubic silver chlorobromide core emulsion having a grain size of 0.18 μm was prepared, in a controlled double-jet precipitation method, by adding at the same time an aqueous solution containing ammonia and silver nitrate, and an aqueous solution containing potassium bromide and sodium chloride (in a mol ratio of KBr:NaCl=95:5), while controlling an aqueous ossein gelatin containing solution to be kept at 40° C.. At that time, the pH and pAg thereof were so controlled as to form the cubes as the grain configuration thereof. To the resulting core emulsion, another aqueous solution containing ammonia and silver nitrate, and another aqueous solution containing potassium bromide and sodium chloride (in a mol ratio of KBr:NaCl=40:60) were further added at the same time, in a controlled double-jet precipitation method, so that the shells were grown up to have an average grain size of 0.25 μm. At that time, the pH and pAg thereof were so controlled as to form the cubes as the grain configuration thereof.

After completing a washing treatment to remove the resulting water-soluble salts, gelatin was then added, so that Emulsion EM-2 could be prepared. The resulting emulsion EM-2 was proved to have a distribution range of 8%.

Preparation of Blue-sensitive Emulsion EM-B

Sensitizing dye D-1 was added to EM-1 to make a color sensitization, and T-1 was then added in an amount of 600 mg per mol of silver, so that blue-sensitive emulsion EM-B could be prepared.

Preparation of Green-sensitive Emulsion EM-G

A green-sensitive emulsion EM-G was prepared in the same procedures as in the blue-sensitive emulsion, except that sensitizing dye D-2 was added to EM-1.

Preparation of R-sensitive Emulsion EM-R

A red-sensitive emulsion EM-R was prepared in the same procedures as in the blue-sensitive emulsion, except that sensitizing dyes D-3 and D-4 were each added to EM-2.

Preparation of Panchromatically sensitive Emulsion EM-P

A panchromatically sensitive emulsion EM-P was prepared in the same procedures as in the blue-sensitive emulsion, except that sensitizing dyes D-1, D-2, D-3 and D-4 were each added to EM-1.

Preparation of Infrared sensitive Emulsion EM-I

An infrared sensitive emulsion EM-I was prepared in the same procedures as in the blue-sensitive emulsion, except that sensitizing dyes D-5 was added to EM-1.

T-1: 4-hydroxy-6-methyl-1,3,3a,7-tetrazaindene

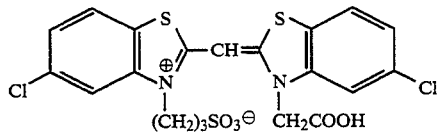

D-1

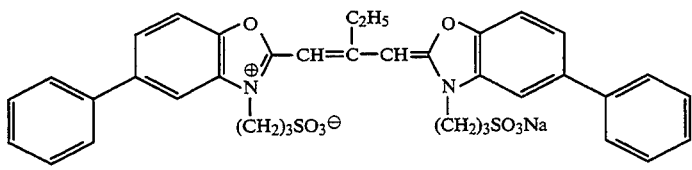

D-2

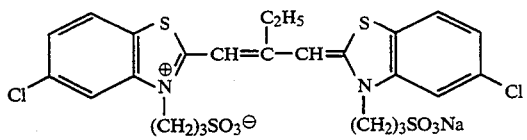

D-3

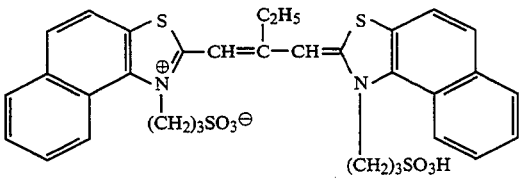

D-4

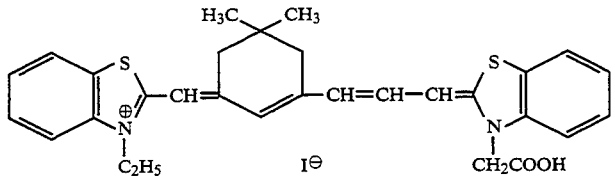

D-5

A color photographic photosensitive material having the following composition was prepared by making use of the above-mentioned EM-B, EM-G, EM-R and EM-P.

The following Sample 1 was prepared in the following manner; Over the front surface of a support laminated with polyethylene on both sides thereof, Layer 1 through Layer 10 were coated and, over the back surface thereof, Layer 11 was coated. The compositions of the layers were as follows. In addition, coating aids, SA-1 and SA-2, and layer hardeners H-1 and H-2, were each used therein.

In preparing the coating solutions, the panchromatic emulsion EM-P contained in Layers 3, 5 and 9 were mixed into the coating solution separately prepared by eliminating the panchromatic emulsions. Immediately after mixing them, the resulting coating solution was coated. The gelatin applied thereto was that having a transmittance improved by adding aqueous hydrogen peroxide thereto in the late stage of an ossein-liming treatment so as to make the coloration of the ossein lower, and then to extract the gelatin.

| SA-1: | Sodium sulfosuccinic di(2-ethylhexyl) ester |
| SA-2: | Sodium sulfocuccinic di(2,2,3,3,4,4,5,5,5-octafluoropentyl) ester |
| H-1: | Sodium 2,4-dichloro-6-hydroxy-s-triazine |
| H-2: | Tetrakis(vinyl sulfonylmethyl) methane |

| Layer | Composition | Coating weight (g/m²) |
|---|---|---|
| Layer 10 | (a UV absorbing layer) | |
| | Gelatin | 0.78 |
| | UV absorbent (UV-1) | 0.065 |
| | UV absorbent (UV-2) | 0.120 |
| | UV absorbent (UV-3) | 0.160 |
| | Oil-soluble dye 1 | 0.5 × 10⁻³ |
| | Oil-soluble dye 2 | 0.5 × 10⁻³ |
| | Solvent (SO-2) | 0.1 |

-continued

| Layer | Composition | Coating weight (g/m²) |
|---|---|---|
| | Silica matting agent | 0.03 |
| Layer 9 | (a blue-sensitive layer) | |
| | Gelatin | 1.43 |
| | Blue-sensitive emulsion EM-B (in Ag coating weight) | 0.4 |
| | Panchromatic emulsion EM-P (in Ag coating weight) | 0.01 |
| | Yellow coupler (YC-1) | 0.82 |
| | Antistaining (AS-2) | 0.025 |
| | Solvent (SO-1) | 0.82 |
| | Inhibitors (ST-1, ST-2, T-1) | 0.005 |
| Layer 8 | (an intermediate layer) | |
| | Gelatin | 0.54 |
| | Color mixture preventive, (AS-1, As-3, AS-4) | 0.055 |
| | Solvent (SO-2) | 0.072 |
| | Anti-irradiation dye (AI-3) | 0.03 |
| Layer 7 | (a yellow colloidal layer) | |
| | Gelatin | 0.42 |
| | Yellow colloidal silver | 0.03 |
| | Color mixture preventive, (AS-1, AS-3, AS-4 in equivalency) | 0.04 |
| | Solvent (SO-2) | 0.049 |
| | Polyvinyl pyrrolidone (PVP) | 0.047 |
| Layer 6 | (an intermediate layer) | |
| | Gelatin | 0.54 |
| | Color mixture preventive, (AS-1, AS-3, AS-4 in equivalency) | 0.055 |
| | Solvent (SO-2) | 0.072 |
| Layer 5 | (a green-sensitive layer) | |
| | Gelatin | 1.43 |
| | Green-sensitive emulsion EM-G (in silver coating weight) | 0.40 |
| | Panchromatic emulsion EM-P (in silver coating weight) | 0.10 |
| | Magenta coupler (MC-1) | 0.25 |
| | Yellow coupler (YC-2) | 0.06 |
| | Antistaining agent (AS-2) | 0.019 |
| | Solvent (SO-1) | 0.31 |
| | Inhibitors (ST-1, ST-2, T-1) | 0.005 |
| Layer 4: | (an intermediate layer) | |
| | Gelatin | 0.75 |
| | Color mixture preventives (AS-1, AS-3 and AS-4 each | 0.055 |

|  |  |  |
|---|---|---|
|  | in an equivalent amount) |  |
|  | Solvent (SO-2) | 0.072 |
|  | Anti-irradiation dye (AI-1) | 0.03 |
|  | Anti-irradiation dye (AI-2) | 0.03 |
| Layer 3: | (A red-sensitive layer) |  |
|  | Gelatin | 1.38 |
|  | Red-sensitive emulsion EM-R (Silver coating amount) | 0.24 |
|  | Panchromatic emulsion EM-P (Silver coating amount) | 0.06 |
|  | Cyan coupler (CC-2) | 0.44 |
|  | Solvent (SO-1) | 0.31 |
|  | Antistaining agent (AS-2) | 0.015 |
|  | Inhibitors (ST-1, ST-2 and T-1) | 0.003 |
| Layer 2: | (An intermediate layer) |  |
|  | Gelatin | 0.54 |
|  | Color mixture preventives (AS-1, AS-3 and AS-4 each in an equivalent amount) | 0.055 |
|  | Solvent (SO-2) | 0.072 |
| Layer 1: | (An HC layer) |  |

|  |  |  |
|---|---|---|
|  | Gelatin | 0.54 |
|  | Black colloidal silver | 0.08 |
|  | Polyvinyl pyrrolidone (PVP) | 0.03 |
| Layer 11: | (A black layer) |  |
|  | Gelatin | 6.00 |

The silver coating amounts are indicated by converting them into the silver contents.

Besides the above, Samples 1A, 1B and 1C were each prepared by additionally coating the compound (1)-6 on Layer 3 (the red-sensitive layer), Layer 5 (the green-sensitive layer) and Layer 9 (the blue-sensitive layer) each in the coating amounts shown in Table 1, respectively.

Nest, Sample 2 was so prepared as to have the following compositions in the same manner as in Sample 1, except that the above-mentioned EM-B, EM-G, EM-R and EM-I were each used therein.

| Layer | Composition | Coating weight (g/m$^2$) |
|---|---|---|
| Layer 12: | (A UV absorbing layer) |  |
|  | Gelatin | 0.78 |
|  | UV absorbent (UV-1) | 0.065 |
|  | UV absorbent (UV-2) | 0.120 |
|  | UV absorbent (UV-3) | 0.160 |
|  | Solvent (SO-2) | 0.1 |
|  | Silica matting agent | 0.03 |
| Layer 11: | (a blue-sensitive layer) |  |
|  | Gelatin | 1.14 |
|  | Blue-sensitive emulsion EM-B (in silver coated amount) | 0.4 |
|  | Yellow coupler (YC-1) | 0.656 |
|  | Antistaining agent (AS-2) | 0.02 |
|  | Solvent (SO-1) | 0.656 |
|  | Inhibitors (ST-1, ST-2, T-1) | 0.005 |
| Layer 10: | (An intermediate layer) |  |
|  | Gelatin | 0.54 |
|  | Color mixture preventives (AS-1, AS-3, AS-4 each in an equivalent amount) | 0.055 |
|  | Solvent (SO-2) | 0.072 |
|  | Anti-irradiation dye (AI-3) | 0.03 |
| Layer 9: | (A yellow colloidal silver layer) |  |
|  | Gelatin | 0.42 |
|  | Yellow colloidal silver | 0.1 |
|  | Color mixture preventives (AS-1, AS-3, AS-4 each in an equivalent amount) | 0.05 |
|  | Solvent (SO-2) | 0.049 |
|  | Polyvinylpyrrolidone (PVP) | 0.047 |
| Layer 8: | (An intermediate layer) |  |
|  | Gelatin | 0.54 |
|  | Color mixture preventives (AS-1, AS-3, AS-4 each in an equivalent amount) | 0.055 |
|  | Solvent (SO-2) | 0.072 |
| Layer 7: | (A green-sensitive layer) |  |
|  | Gelatin | 1.14 |
|  | Green-sensitive emulsion EM-G (in silver coated amount) | 0.40 |
|  | Magenta coupler (MC-1) | 0.20 |
|  | Yellow coupler (YC-2) | 0.05 |
|  | Antistaining agent (AS-2) | 0.0152 |
|  | Solvent (SO-1) | 0.248 |
|  | Inhibitors (ST-1, ST-2, T-1) | 0.005 |
| Layer 6: | (An intermediate layer) |  |
|  | Gelatin | 0.75 |
|  | Color mixture preventives (AS-1, AS-3, AS-4 each in an equivalent amount) | 0.055 |
|  | Solvent (SO-2) | 0.072 |
|  | Anti-irradiation dye (AI-1) | 0.03 |
|  | Anti-irradiation dye (AI-2) | 0.03 |
| Layer 5: | (A red-sensitive layer) |  |
|  | Gelatin | 1.10 |
|  | Red-sensitive emulsion EM-R (in silver coated amount) | 0.24 |

-continued

| Layer | Composition | Coating weight (g/m²) |
|---|---|---|
| | Cyan coupler (CC-2) | 0.352 |
| | Solvent (SO-1) | 0.248 |
| | Antistaining agent (AS-2) | 0.012 |
| | Inhibitors (ST-1, ST-2, T-1) | 0.003 |
| Layer 4: | (An intermediate layer) | |
| | Gelatin | 0.75 |
| | Color mixture preventives (AS-1, AS-3, AS-4 each in an equivalent amount) | 0.055 |
| | Solvent (SO-2) | 0.072 |
| Layer 3: | (An infrared-sensitive layer) | |
| | Infrared-sensitive emulsion EM-I (in silver coated amount) | 0.30 |
| | Yellow coupler (YC-1) | 0.21 |
| | Magenta coupler (MC-1) | 0.063 |
| | Cyan coupler (CC-1) | 0.110 |
| | Antistaining agent (AS-2) | 0.019 |
| | Solvent (SO-1) | 0.615 |
| Layer 2: | (An intermediate layer) | |
| | Gelatin | 0.54 |
| | Color mixture preventives (AS-1, AS-3, AS-4 each in an equivalent amount) | 0.055 |
| | Solvent (SO-2) | 0.072 |
| Layer 1: | (An HC layer) | |
| | Gelatin | 0.54 |
| | Black colloidal silver | 0.08 |
| | Polyvinyl pyrrolidone (PVP) | 0.03 |
| Layer 13: | (A back surface layer) | |
| | Gelatin | 6.00 |
| | Silica matting agent | 0.65 |

SO-1: Trioctyl phosphate
SO-2: Dioctyl phthalate
AS-1: 2,4-di-t-octyl hydroquinone
AS-2: 2,4-di-t-butyl hydroquinone

AS-3:

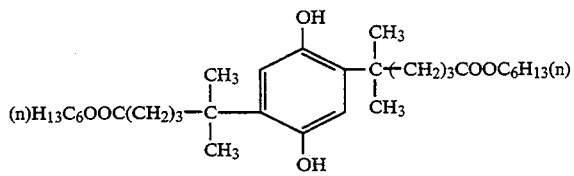

AS-4: A Mixture of

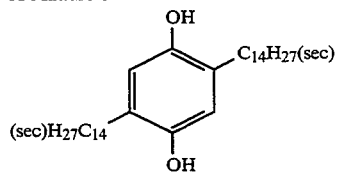

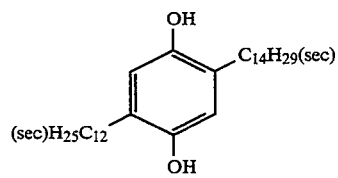

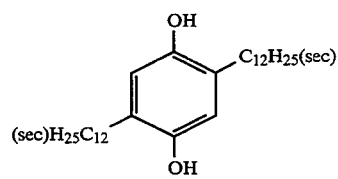

AI-1:

-continued
| Layer | Composition | Coating weight (g/m²) |
|---|---|---|
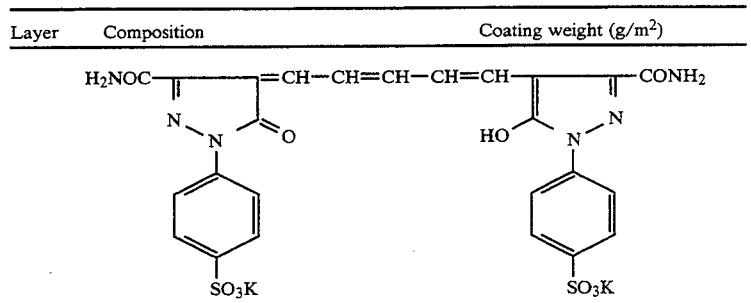
AI-2:
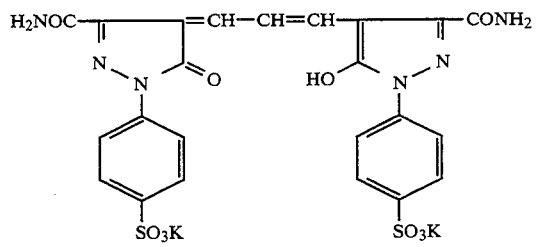
AI-3:
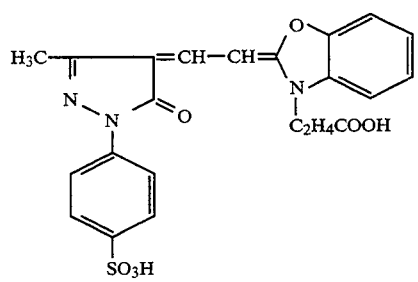
ST-1: 1-(3-acetamidophenyl)-5-mercaptotetrazole
ST-2: N-benzyl adenine
UV-1
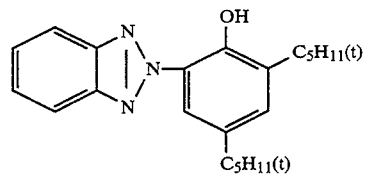
UV-2
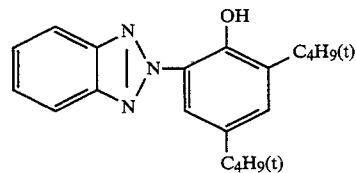
UV-3
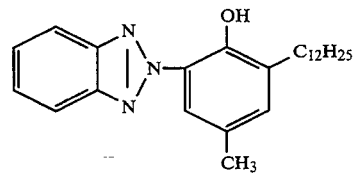
YC-1

-continued

| Layer | Composition | Coating weight (g/m²) |
|---|---|---|

[Structure: compound with OCH₃, (CH₃)₃CCOCHCONH-, NHCOCHCH₂SO₂C₁₂H₂₅ with CH₃, and COOCH₃ groups]

YC-2

[Structure: (CH₃)₃CCOCH₂CONH- attached to chlorophenyl with NHCO(CH₂)₃O- linked to di-C₅H₁₁(t) phenyl]

MC-1

[Structure: pyrazole derivative with (CH₃)₃C, Cl, N-N, NH-N, and (CH₂)₃SO₂C₁₂H₂₅ groups]

CC-1

[Structure: phenol with OH, Cl, CH₃, Cl, NHCOCHO- with C₂H₅, linked to di-C₅H₁₁(t) phenyl]

CC-2

[Structure: compound with C₅H₁₁(t), (t)C₅H₁₁, OCHCONH- with C₄H₉, linked to phenol with OH, NHCOC₃F₇, and Cl]

In the same manner as in the case of Sample 1, Samples A, 2B and 2C were each prepared by additionally coating the compound (1)-6 on Layer 3 (the infrared-sensitive layer), Layer 5 (the red-sensitive layer), Layer 7 (the green-sensitive layer) and Layer 11 (the blue-sensitive layer) so that the coating amounts thereof could be as shown in Table 1, respectively.

The above-mentioned resulting Samples 1A through 1C were each brought into close contact with the black and cyan printers out of a halftone dot original document, and they were exposed to light under the following exposure conditions-1. Next, the samples were each brought into closed contact with the black and magenta printers, and they were exposed to light under the following exposure conditions-2. Further, the samples were each brought into closed contact with the black and yellow printers, and they were exposed to light under the following exposure conditions-3.

In the same manner as in Samples 1A through 1C, Samples 2A through 2C were each exposed to light under the exposure conditions-1 through -3 in order, and they were brought into close contact with only the black printer out of an original document. Then, they were exposed to light under the following exposure conditions-4.

The resulting exposed photosensitive materials were each processed in the following developing steps, and the resulting dye image densities were measured and then compared to the densities of the proof prints obtained from the four plates of the above-mentioned halftone dot original.

The results of the density measurements will be given in the following Table 1. For the density measurements, a densitometer, Model 914 manufactured by Macbeth, and a filter SPI were each used.

Exposure conditions-1

Each of the photosensitive materials was exposed to white light through a red filter (Wratten No. 26) and an ND filter. At that time, the ND filter density was adjusted to provide the minimum exposure quantity obtained when the red light density was minimized after processing the photosensitive materials, and the exposures were each made for 0.5 seconds in the above-mentioned minimum exposure quantity.

Exposure conditions-2

Each of the photosensitive materials was exposed to white light through a green filter (Wratten No. 58) and an ND filter. At that time, the ND filter density was adjusted to provide the minimum exposure quantity obtained when the green light density was minimized after processing the photosensitive materials, and the exposures were each made for 0.5 seconds in the above-mentioned minimum exposure quantity.

Exposure conditions-3

Each of the photosensitive materials was exposed to white light through a blue filter (Wratten No. 47B) and an ND filter. At that time, the ND filter density was adjusted to provide the minimum exposure quantity obtained when the green light density was minimized after processing the photosensitive materials, and the exposures were each made for 0.5 seconds in the above-mentioned minimum exposure quantity.

Exposure conditions-4

Each of the photosensitive materials was exposed to light under the above-mentioned exposure conditions-1 through -3 in order, and the resulting exposed samples were then exposed to tungsten light through an infrared filter and an ND filter. At that time, the ND filter density was adjusted to provide the minimum exposure quantity obtained when the visible light density was minimized after processing the samples, and the exposures were made each for 0.5 seconds in the above-mentioned minimum exposure quantity. Only the exposure to be made to tungsten light through the infrared filter was regarded as Exposure conditions-4. In this case, a daylight fluorescent lamp was used as the light source for each of the Exposure conditions-1 through -3.

The following development steps were carried out, wherein, however, the fogging exposure was made uniformly on overall surfaces of the photosensitive materials through the mm-thick developer layer while dipping them in a developer.

| Processing step 1 | Temperature | Time |
|---|---|---|
| Dipping (in a developer) | 37° C. | 12 sec. |
| Fogging exposure | — | 12 sec. (at 1 lux) |
| Developing | 37° C. | 95 sec. |
| Bleach-fixing | 35° C. | 45 sec. |
| Stabilizing | 25~30° C. | 90 sec. |
| Drying | 60~85° C. | 40 sec. |

Compositions of the processing solutions
(Color developer)

| | |
|---|---|
| Benzyl alcohol | 15 cc |
| Cerious sulfate | 0.015 g |
| Ethylene glycol | 8.0 cc |
| Potassium sulfite | 2.5 g |
| Potassium bromide | 0.6 g |
| Sodium chloride | 0.2 g |
| Potassium carbonate | 25.0 g |
| T-1 | 0.1 g |
| Hydroxylamine sulfate | 5.0 g |
| Sodium diethylenetriamine pentaacetate | 2.0 g |
| 4-amino-N-ethyl-N-(β-hydroxyethyl) aniline sulfate | 4.5 g |
| Fluorescent whitening agent, (a 4,4'-diaminostilbene disulfonic acid derivative) | 1.0 g |
| Ptassium hydroxide | 2.0 g |
| Diethylene glycol | 15.0 cc |
| Add water to make in total of | 1 liter |
| Adjust pH to be | pH 10.15 |

(Bleach-fixer)

| | |
|---|---|
| Ferric ammonium diethylenetriamine pentaacetate | 90.0 g |
| Diethylenetriamine pentaacetic acid | 3.0 g |
| Ammonium thiosulfate, (in an aqueous 70% solution) | 180 cc |
| Ammonium sulfite, (in an aqueous 40% solution) | 27.5 cc |
| 3-mercapto-1,2,4-triazol | 0.15 g |
| Adjust pH with potassium carbonate or glacial acetic acid to be | pH 7.1 |
| Add water to make in total of | 1 liter |

(Stabilizer)

| | |
|---|---|
| o-phenylphenol | 0.3 g |
| Potassium sulfite, (in an aqueous 50% solution) | 12 cc |
| Ethylene glycol | 10 g |
| 1-hydroxyethylidene-1,1-diphosphonic acid | 2.5 g |
| Bismuth chloride | 0.2 g |
| Zinc sulfate, heptahydrate | 0.7 g |
| Ammonium hydroxide, (in an aqueous 28% solution) | 2.0 g |
| Polyvinyl pyrrolidone (K-17) | 0.2 g |
| Fluorescent whitening agent, (a 4,4'-diaminostilbene diphosphonic acid derivative) | 2.0 g |
| Add water to make in total of | 1 liter |
| Adjust pH with ammonium hydroxide or sulfuric acid to be | pH 7.5 |

The stabilizing treatment was carried out in a double-tank type counter-current system.

TABLE 1

| Sample No. | Compound (1)-6 Added (g/m$^2$) | Toe gradation Yellow | Toe gradation Magenta | Toe gradation Cyan | Chromatic approximation (in magenta) *1 | Halftone dot quality (in magenta) | Chromatic approximation (in black) *2 | Halftone dot quality |
|---|---|---|---|---|---|---|---|---|
| 1A (Comparison) | Not added | 1.60 | 1.65 | 1.68 | ○ | X | ○ | X |
| 1B (Invention) | 0.01 | 1.85 | 1.98 | 1.94 | ○ | ○ | ○ | ○ |
| 1C (Invention) | 0.03 | 2.20 | 2.35 | 2.45 | ○ | ○ | ○ | ○ |
| 2A (Comparison) | Not added | 1.55 | 1.62 | 1.67 | Δ | X | Δ | X |
| 2B (Comparison) | 0.01 | 1.75 | 1.83 | 1.86 | Δ | Δ | Δ | Δ |
| 2C (Comparison) | 0.03 | 2.12 | 2.26 | 2.33 | Δ | ○ | Δ | ○ |

*1: Shows the approximation between a printed matter and the hue of a halftone dot image in the color of the subject coupler.
*2: Shows the approximation between a printed matter and the hue of a halftone dot image in black.

As is obvious from the results shown in Table 1, the invention can greatly improve the inevitable factors for the comprehensive qualities of color proof, such as halftone dot qualities and color approximation, so that the objects of the invention can be achieved.

What is claimed is:

1. An image forming method comprising;

imagewise exposing a direct positive silver halide color photographic light-sensitive material, said material comprising a support having provided thereon;

a plurality of emulsion layers, including a first silver halide emulsion layer comprising an Emulsion Y having a main spectral sensitivity in a blue-sensitive region, a second silver halide emulsion layer comprising an Emulsion M having a main spectral sensitivity in a green-sensitive region, and a third silver halide emulsion layer comprising an Emulsion C having a main spectral sensitivity in a red-sensitive region;

at least one of said first silver halide emulsion layer, said second silver halide emulsion layer, and said third silver halide emulsion layer further comprising an additional silver halide Emulsion P having a spectral sensitivity, a portion of which is common to a portion of the spectral sensitivity region of each of said Emulsion Y, Emulsion M, and Emulsion C;

each of said Emulsion Y, Emulsion M, and Emulsion C having a sensitivity of 1/10 to 10 times a sensitivity of said Emulsion P upon exposure to light having a main wavelength component within the main spectral sensitivity region of Emulsion Y, Emulsion M, and Emulsion C, respectively; and color developing the imagewise exposed material to provide a toe portion gradation of a characteristic curve of each of said plurality of emulsion layers, of not less than 1.7.

2. The method of claim 1 wherein said first silver halide emulsion layer comprises a yellow dye-forming coupler, said second silver halide emulsion layer comprises a magenta dye-forming coupler, and said third silver halide emulsion layer comprises a cyan dye-forming coupler.

3. The method of claim 2 wherein said second silver halide emulsion layer further comprises a yellow dye-forming coupler.

4. The method of claim 1 wherein said light-sensitive material contains at least one compound of. Formula I;

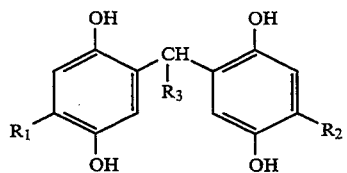

Formula I wherein $R_1$ and $R_2$ each represent hydrogen or alkyl having not more than 8 carbon atoms, alkoxy, alkylthio or alkylamido; $R_3$ represents hydrogen or alkyl having not more than 11 carbon atoms; provided that a total number of carbon atoms in $R_1$, $R_2$ and $R_3$ is within the range of not less than 8 and not more than 22.

5. The method of claim 1 wherein a reflection density of a fresh sample of said third silver halide emulsion layer of said light-sensitive material is not less than 0.7 at a maximum wavelength of the spectral sensitivity region of said third silver halide emulsion layer.

6. The method of claim 1 wherein at least one layer of said light-sensitive material contains a solid dispersed dye having at least one of a carboxyl, sulfonamido and sulfamoyl group.

7. The method of claim 6 wherein said solid dispersed dye is at least one dye selected from the group consisting of dyes represented by Formulas 2 through 10;

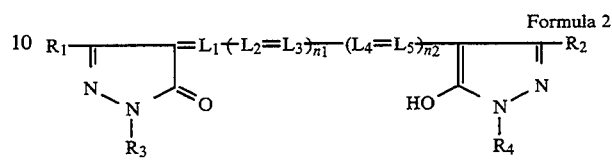

Formula 2 wherein $R_1$ and $R_2$ each represent hydrogen, alkyl, alkenyl, aryl, heterocyclic, —$COOR_5$, —$COR_5$, —$SO_2R_5$, $SOR_5$, —$SO_2NR_5R_6$, —$CONR_5R_6$, —$NR_5R$, —$NR_5SO_2R_5$, —$NR_5COR_6$, —$NR_5CONR_6R_7$, —$NR_5CSNR_6R_7$, —$OR_5$, —$SR_5$, or cyano; $R_3$ and $R_4$ each represent hydrogen, alkyl, alkenyl, cycloalkyl, aryl or a heterocyclic; $R_5$, $R_6$ and $R_7$ each represent a hydrogen atom, alkyl, alkenyl, aryl or heterocyclic; $L_1$ through $L_5$ each represent methine; $n_1$ is an integer of 0 or 1; and $n_2$ is an integer of 0 to 2;

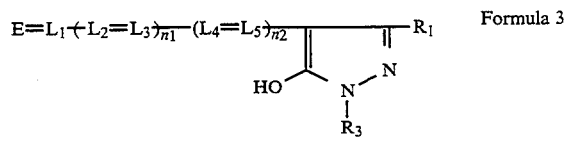

Formula 3 wherein $R_1$, $R_3$, $L_1$–$L_5$, $n_1$ and $n_2$ are defined as in Formula 2, E represents an acidic nucleus necessary for producing an oxonol dye;

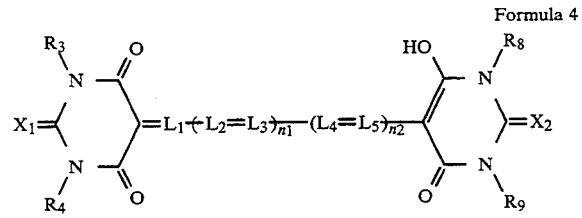

Formula 4 wherein $R_3$, $R_4$, $L_1$–$L_5$, $n_1$ and $n_2$ are defined as in Formula 2; and $R_8$ and $R_9$ are the same as $R_3$ and $R_4$, respectively, $X_1$ and $X_2$ each represent oxygen or sulfur;

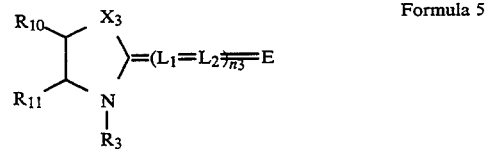

Formula 5 wherein $R_3$, $L_1$ and $L_2$ are each defined as in Formula 2, respectively; E is the same as E defined in Formula 3; $R_{10}$ and $R_{11}$ each represent hydrogen, alkyl, alkenyl, aryl, heterocyclic, nitro or cyano, halogen, —$OR_5$, —$SR_5$, —$NR_5SO_2R_6$, —$NR_5COR_6$, —$COR_5$ or —$COOR_5$, provided, $R_{10}$ and $R_{11}$ may form an endocyclic double bond; $X_3$ represents oxygen, sulfur, selenium, —$C(R_{12})(R_{13})$— or $N(R_3)$; $R_3$, $R_5$ and $R_6$ are each defined as in Formula 2, $R_{12}$ and $R_{13}$ each represent hydrogen or alkyl; and $n_3$ is an integer of 1 to 3;

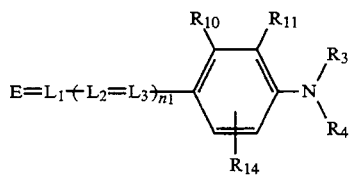

Formula 6 wherein $R_3$, $R_4$, $L_1$, $L_2$, $L_3$ and $n_1$ are each defined as in Formula 2, respectively; E is the same as defined in Formula 3; $R_{10}$ and $R_{11}$ are defined as in Formula 5; and $R_{14}$ is the same as $R_{10}$;

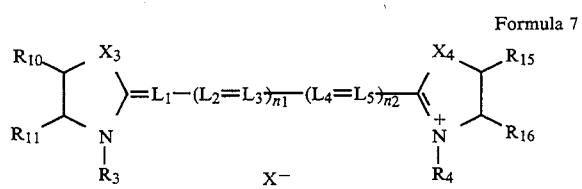

Formula 7 wherein $R_3$, $R_4$, $L_1$ through $L_5$, $n_1$ and $n_2$ are each defined as in Formula 2, respectively; $R_{10}$, $R_{11}$, and $X_3$ are each defined as in formula 7, respectively; $X_4$ is the same as $X_3$; $R_{15}$ and $R_{16}$ are each the same as $R_{10}$, $X^-$ represents a group having an anion; and, the combination of $R_{10}$ and $R_{11}$, and the combination of $R_{15}$ and $R_{16}$ may each form an endocyclic double bond;

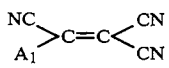

Formula 8 wherein $A_1$ represents a nucleus of pyrrole, imidazole, pyrazole, phenol or naphthol, or a condensed heterocyclic ring;

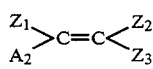

Formula 9 wherein $Z_1$, $Z_2$ and $Z_3$ each represent an electron withdrawing group; $A_2$ represents aryl or a heterocyclic;

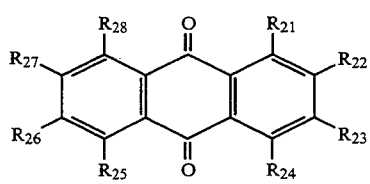

Formula 10 where in $R_{21}$, $R_{22}$, $R_{23}$ and $R_{24}$ each represent hydrogen, hydroxy, $-OR_{29}$ or $-N(R')R''$; in which $R_{29}$ represents alkyl or aryl; $R'$ and $R''$ each represent hydrogen or alkyl or allyl having at least one of a sulfonic acid group or carboxylic acid group; $R_{25}$, $R_{26}$, $R_{27}$ and $R_{28}$ each represent hydrogen, carboxylic acid, sulfonic acid, alkyl or allyl having at least one of a carboxylic acid group or sulfonic acid group.

8. The method of claim 1 wherein said light-sensitive material contains a compound represented by Formula 11

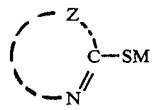

Formula 11 wherein M represents hydrogen, alkali metal, ammonium or a protective group for a mercapto group; Z represents a group consisting of non-metal atoms necessary to form a heterocyclic ring, provided the heterocyclic ring may have a substituent and may also be condensed.

9. The method of claim 1 wherein said first silver halide emulsion layer of said light-sensitive material contains a yellow coupler represented by Formula Y-I;

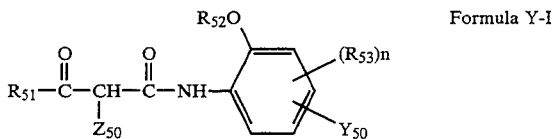

Formula Y-I wherein $R_{51}$ represents alkyl or cycloalkyl; $R_{52}$ represents alkyl, cycloalkyl, acyl or aryl; $R_{53}$ represents a group capable of being substituted on a benzene ring; n is an integer of 0 or 1; $Y_{50}$ represents a monovalent ballast group; and $Z_{50}$ represents hydrogen or a group capable of splitting off when making a coupling reaction.

10. The method of claim 9 wherein a high boiling organic solvent is used with said magenta coupler, said solvent being one represented by Formula HBS-I or HBS-II;

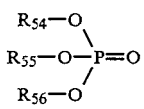

Formula HBS-I wherein $R_{54}$, $R_{55}$ and $R_{56}$ each represent alkyl or aryl, provided that at least two of $R_{54}$, $R_{55}$ and $R_{56}$ represent alkyl having not more than 16 carbon atoms:

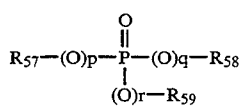

Formula HBS-II wherein $R_{57}$, $R_{58}$ and $R_{59}$ each represent an aliphatic or aromatic; and p, q and r each represent an integer of 0 or 1, provided that p, q and r are not each an integer of 1 at the same time.

11. The method of claim 1 wherein said second silver halide emulsion layer of said light-sensitive material contains a magenta coupler of Formula M-I;

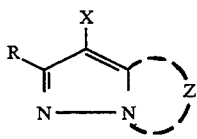

Formula M-I wherein Z represents a group consisting of non-metal atoms necessary to form a nitrogen-containing heterocyclic ring, provided that the ring formed of the above-mentioned Z may have a substituent, X represents hydrogen or a group capable of splitting off upon reaction with an oxidized product of a color developing agent; and R represents hydrogen or a substituent.

12. The method of claim 11 wherein said second silver halide emulsion layer of said light-sensitive material contains a yellow coupler of Formula Y-Ia;

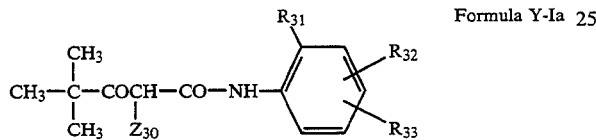

Formula Y-Ia wherein $R_{31}$ represents halogen or alkoxy; $R_{32}$ represents hydrogen, halogen or alkoxy $R_{33}$ represents acylamino, alkoxycarbonyl, alkylsulfamoyl, arylsulfamoyl, arylsulfonamido, alkylureido, arylureido, succinimido, alkoxy or aryloxy, $Z_{30}$ represents hydrogen, a monovalent organic group capable of splitting off upon coupling with an oxidized product of a color developing agent, or halogen atom.

13. The method of claim 12 wherein a difference between a pKa of said magenta coupler of Formula M-I, and said yellow coupler of Formula Y-Ia is not more than 2.

14. The method of claim 11 wherein a high boiling organic solvent is used with said yellow coupler, said high boiling organic solvent being one represented by Formula HBS-I or HBS-II;

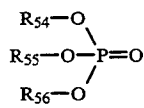

Formula HBS-I wherein $R_{54}$, $R_{55}$ and $R_{56}$ each represent alkyl or aryl, provided that at least two of $R_{54}$, $R_{55}$ and $R_{56}$ represent alkyl having not more than 16 carbon atoms:

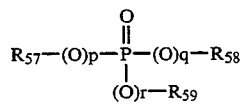

Formula HBS-II wherein $R_{57}$, $R_{58}$ and $R_{59}$ each represent an aliphatic or aromatic; and p, q and r each represent an integer of 0 or 1, provided that p, q and r are not each an integer of 1 at the same time.

15. The method of claim 1 wherein said light-sensitive material comprises at least one non-photosensitive layer containing a compound represented by Formula H-I;

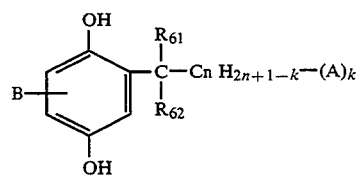

Formula H-I wherein $R_{61}$ and $R_{62}$ each represent alkyl having 1 to 5 carbon atoms; n is an integer of 1 to 20; k is an integer of 1 or A represents cyano; —CO—$XR_{63}$, wherein X represents —O— or —N($R_{64}$)—, $R_{63}$ represents hydrogen, alkyl, alkenyl, cycloalkyl or aryl, and $R_{64}$ represents hydrogen, alkyl, or aryl; —OY, wherein Y represents $R_{63}$ or —CO—$R_{63}$, in which $R_{63}$ is defined as above, —N($R_{64}$)$R_{65}$, wherein $R_{64}$ is defined as above, and $R_{65}$ represents hydrogen, alkyl, aryl, or —CO—$R_{63}$ in which $R_{63}$ is defined as above; or —PO—(O$R_{63}$)—((O)$_l R_{66}$), wherein l is an integer of 0 or 1, $R_{63}$ is as defined above, and $R_{66}$ represents hydrogen, alkyl, cycloalky, alkenyl, or aryl; and B represents alkyl, alkenyl, cycloalkyl, aryl, heterocyclic or

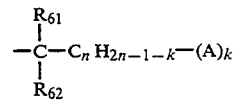

16. The method of claim 15 wherein n in Formula H-I is an integer of 2 to 15.

17. The method of claim 15 wherein said light-sensitive material further contains at least one compound represented by Formula I

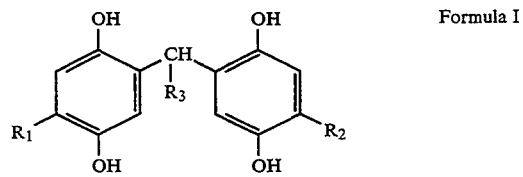

Formula I wherein $R_1$ and $R_2$ each represent hydrogen, alkyl having not more than 8 carbon atoms, alkoxy, alkylthio, or alkylamido; $R_3$ represents hydrogen, or alkyl having not more than 11 carbon atoms; with the proviso that the total number of carbon atoms of $R_1$, $R_2$, and $R_3$ is 8 to 22.

* * * * *